United States Patent
Henry et al.

(10) Patent No.: US 9,768,803 B2
(45) Date of Patent: Sep. 19, 2017

(54) HARDWARE DATA COMPRESSOR USING DYNAMIC HASH ALGORITHM BASED ON INPUT BLOCK TYPE

(71) Applicant: VIA ALLIANCE SEMICONDUCTOR CO., LTD., Shanghai (CN)

(72) Inventors: G. Glenn Henry, Austin, TX (US); Terry Parks, Austin, TX (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/258,867

(22) Filed: Sep. 7, 2016

(65) Prior Publication Data

US 2016/0380649 A1  Dec. 29, 2016

Related U.S. Application Data

(63) Continuation of application No. 14/883,106, filed on Oct. 14, 2015, now Pat. No. 9,509,337.
(Continued)

(51) Int. Cl.
*H03M 7/34* (2006.01)
*H03M 7/42* (2006.01)
*H03M 7/30* (2006.01)

(52) U.S. Cl.
CPC .......... *H03M 7/42* (2013.01); *H03M 7/3086* (2013.01); *H03M 7/6017* (2013.01); *H03M 7/6088* (2013.01)

(58) Field of Classification Search
CPC .... H03M 7/42; H03M 7/3086; H03M 7/3088; H03M 7/3079
(Continued)

(56) References Cited

U.S. PATENT DOCUMENTS

| 5,049,881 A | 9/1991 | Gibson et al. |
| 5,051,745 A | 9/1991 | Katz |

(Continued)

FOREIGN PATENT DOCUMENTS

| WO | WO9317503 | 9/1993 |
| WO | WO2010003574 A1 | 1/2010 |

OTHER PUBLICATIONS

Gailly, Jean Loup et al. "Compression Algorithm (deflate)." May 9, 2015 pp. 1-4. Retrieved from the Internet: http://web.archive.org/web/20150509095403/http://www.gzip.org/algorithm.txt Retrieved on Sep. 30, 2016.

(Continued)

*Primary Examiner* — Peguy Jean Pierre
(74) *Attorney, Agent, or Firm* — Eric W. Cernyar; E. Alan Davis; James W. Huffman

(57) ABSTRACT

A hardware data compressor that compresses an input block of characters by replacing strings of characters in the input block with back pointers to matching strings earlier in the input block. A hash table is used in searching for the matching strings in the input block. A plurality of hash index generators each employs a different hashing algorithm on an initial portion of the strings of characters to be replaced to generate a respective index. The hardware data compressor also includes an indication of a type of the input block of characters. A selector selects the index generated by of one of the plurality hash index generators to index into the hash table based on the type of the input block.

6 Claims, 28 Drawing Sheets

Related U.S. Application Data

(60) Provisional application No. 62/159,352, filed on May 11, 2015.

(58) Field of Classification Search
USPC .................. 341/50, 51, 67, 65, 106, 107
See application file for complete search history.

(56) References Cited

U.S. PATENT DOCUMENTS

| | | | |
|---|---|---|---|
| 5,406,278 | A | 4/1995 | Graybill et al. |
| 5,532,693 | A | 7/1996 | Winters et al. |
| 5,532,694 | A | 7/1996 | Mayers et al. |
| 6,130,630 | A | 10/2000 | Grohs et al. |
| 6,304,197 | B1 | 10/2001 | Freking et al. |
| 6,563,956 | B1 | 5/2003 | Satoh et al. |
| 6,876,774 | B2 | 4/2005 | Satoh et al. |
| 6,879,270 | B1 | 4/2005 | Veazey |
| 7,064,489 | B2 | 6/2006 | Price |
| 7,283,591 | B2 | 10/2007 | Ruehle |
| 7,283,686 | B2 | 10/2007 | Larson et al. |
| 7,737,870 | B1 | 6/2010 | Wang et al. |
| 7,834,781 | B2 | 11/2010 | Biran et al. |
| 8,542,135 | B2 | 9/2013 | Golander et al. |
| 8,704,686 | B1 | 4/2014 | Agarwal et al. |
| 8,766,827 | B1 | 7/2014 | Milne et al. |
| 8,766,872 | B2 | 7/2014 | Dalmazzo |
| 8,933,824 | B1 | 1/2015 | Agarwal et al. |
| 9,258,013 | B1 | 2/2016 | Chau et al. |
| 2006/0106870 | A1 | 5/2006 | Franaszek et al. |
| 2006/0179071 | A1 | 8/2006 | Panigrahy et al. |
| 2007/0109153 | A1 | 5/2007 | Ma et al. |
| 2009/0022307 | A1 | 1/2009 | Torla |
| 2010/0274786 | A1 | 10/2010 | Harris et al. |
| 2011/0295894 | A1 | 12/2011 | Yoo |
| 2012/0257626 | A1 | 10/2012 | McGhee et al. |
| 2013/0135121 | A1 | 5/2013 | Glass et al. |
| 2013/0135123 | A1 | 5/2013 | Golander et al. |
| 2013/0141259 | A1 | 6/2013 | Hazarika et al. |
| 2014/0108362 | A1 | 4/2014 | Kim et al. |
| 2014/0143206 | A1 | 5/2014 | Pittelko |
| 2015/0113220 | A1 | 4/2015 | Amit et al. |

OTHER PUBLICATIONS

Anonymous. "Adaptive Huffman Coding." Jan. 30, 2014, XP055307066. Retrieved from the Internet: https://www.icg.isy.liu.se/courses/tsbk08/lect4.pdf on Sep. 30, 2016 pp. 1-31.

Anonymous. "Adaptive Huffman Coding." Wikipedia, the free encyclopedia, Jan. 7, 2015. pp. 1-4. Retrieved from the Internet: https://en.wikipedia.org/w/index.php?title=Adaptive_Huffman_coding&oldid=641389634 on Sep. 30, 2016.

Sadakane, Kunihiko et al. "Improving the Speed of LZ77 Compression by Hashing and Suffix Sorting." IEICE Trans. Fundamentals, vol. E83-A, No. 12. Dec. 2000. pp. 2689-2698.

Anonymous. "Best Way to Reduce Change of Hash Collisions: Multiple Hashes, or Larger Hash?" Cryptography Stack Exchange. Nov. 14, 2011. pp. 1-3. Retrieved from the Internet: http://crypto.stackexchange.com/questions/1170/best-way-to-reduce-chance-of-hash-collisions-multiple-hashes-or-larger-hash on Sep. 19, 2016.

Anonymous. "Double Hashing" Wikipedia, the free encyclopedia. Apr. 23, 2015. pp. 1-3 XP002762008. Retrieved from the Internet: https://en.wikipedia.org/w/index.php?title=Double_hashing&oldid=658911643 on Sep. 16, 2016.

Matai, Janarbek et al. "Energy Efficient Canonical Huffman Encoding" downloaded on Sep. 26, 2014 from http://research.microsoft.com/pubs/219609/asap14-canonical_huffman.pdf. pp. 1-8.

"Deflate" Wikipedia, the free encyclopedia. Downloaded on Sep. 26, 2014 from http://en.wikipedia.org/wiki/DEFLATE. pp. 1-9.

Davies, Joshua "Dissecting the GZIP Format" downloaded on Feb. 12, 2015 from http://www.gnu.org/software/gzip/manual/gzip.html. pp. 1-19.

Rigler, Suzanne "FPGA-Based Lossless Data Compression Using GNU Zip" Thesis 2007. pp. 1-82.

Gailly, Jean-Loup "GNU Gzip" downloaded on Feb. 12, 2015 from http://www.gnu.org/software/gzip/manual/gzip.html. pp. 1-15.

"Gzip App Note" downloaded on Sep. 26, 2014 from http://www.mcs.anl.gov/~hereld/PXRF/CeloxicaTraining/GZIP%20App%20Note.pdf. pp. 1-11.

"LZ77 and LZ78" Wikipedia, the free encyclopedia. Downloaded on Mar. 11, 2015 from http://en.wikipedia.org/wiki/LZ77_and_LZ78. pp. 1-5.

Deutsch, Peter. "RFC 1951 Deflate Compressed Data Format Specification version 1.3" downloaded on Feb. 12, 2015 from http://www.gzip.org/zlib/rfc-deflate.html. pp. 1-13.

Feldspar, Antaeus. "An Explanation of the Deflate Algorithm." Aug. 23, 1997. Retrieved from the Internet: url: http://www.gzip.org/deflate.html. Retrieved on Sep. 9, 2016. pp. 1-5.

Anonymous. "Chapter 5, Lossless Compression" Jan. 1, 2007. Retrieved from the Internet: url: http://www.uio.no/studier/emner/matnat/math/MAT-INF1100/h07/undervisningsmateriale/kap5.pdf. Retrieved on Sep. 9, 2016. pp. 1-29.

Harnik, Danny et al. "A Fast Implementation of Deflate." 2014 IEEE 2014 Data Compression Conference pp. 223-232.

◄────────── COMPRESSION TIME ──────────►

◄────────── COMPRESSION TIME ──────────►

FIG. 11A

403 SORTED LIST

| BIT LEN 1112 | HUFFMAN CODE 1108 | SYMBOL VALUE 406 | |
|---|---|---|---|
| | | | 0 |
| 3 | 001 | 279 | 1 |
| | | | |
| 10 | | | |
| | | | |
| | 11011 | 27 | 23 |
| | 11100 | 29 | 24 |
| | 11101 | 1 | 25 |
| | | | |
| 5 | | | |
| | | | |
| 5 | | | |
| | | | |
| | | | |
| | 1100001110 | 3 | 137 |
| | | | |
| | | | |
| | | | |
| | 110000010111010 | 283 | 278 |
| 3 | | | 279 |
| | | | |
| | | | |
| | | | |
| | | | |
| | | | |
| | | | |
| 15 | | | |
| | | | |
| | | | 285 |

*FIG. 11B*

| | | 401 FREQUENCY TABLE (AND HUFFMAN CODE TABLE) | | |
|---|---|---|---|---|
| 0 | FREQUENCY 402 | SORTED INDEX 404 | HUFFMAN CODE 1108 | BIT LEN 1112 |
| 1 | 180 | 25 | 11101 | 5 |
| 3 | 20 | 137 | 1100001110 | 10 |
| 27 | 181 | 23 | 11011 | 5 |
| 29 | 181 | 24 | 11100 | 5 |
| 279 | 1000 | 1 | 001 | 3 |
| 283 | 1 | 278 | 110000010111010 | 15 |
| 285 | | | | |

⟶ COMPRESSION TIME ⟶

⟶ COMPRESSION TIME ⟶

⟵ COMPRESSION TIME ⟶

INSERT NEW NODE AHEAD OF OTHER
ZERO (EQUAL) PROBABILITY NODES

| | STRING 3303 | SCORE 3304 |
|---|---|---|
| 0 | STRING 3303 | SCORE 3304 |
| 1 | STRING 3303 | SCORE 3304 |
| 2 | STRING 3303 | SCORE 3304 |
| 3 | STRING 3303 | SCORE 3304 |
| 4 | STRING 3303 | SCORE 3304 |
| 5 | STRING 3303 | SCORE 3304 |
| 6 | STRING 3303 | SCORE 3304 |
| J-1 | STRING 3303 | SCORE 3304 |

3302 LOOKUP TABLE

HARDWARE DATA COMPRESSOR USING DYNAMIC HASH ALGORITHM BASED ON INPUT BLOCK TYPE

CROSS REFERENCE TO RELATED APPLICATION(S)

This application is a continuation of and claims priority to U.S. patent application Ser. No. 14/883,106, filed Oct. 14, 2015, which is hereby incorporated by reference. This application also claims the benefit of U.S. Provisional Application, Ser. No. 62/159,352, filed May 11, 2015, which is hereby incorporated by reference in its entirety.

BACKGROUND

Efficient data compression has become an important requirement in the computing world. This is largely due to the fact that many files transmitted over the Internet are compressed before being sent and decompressed after being received. This may be advantageous because it takes less time to transmit a smaller file and because the smaller file consumes less bandwidth over the network.

BRIEF DESCRIPTION OF THE DRAWINGS

FIG. 11A is a block diagram illustrating a sorted list according to an alternate embodiment.

FIG. 11B is a block diagram illustrating a frequency table according to an alternate embodiment.

DETAILED DESCRIPTION OF THE EMBODIMENTS

Figure 1:
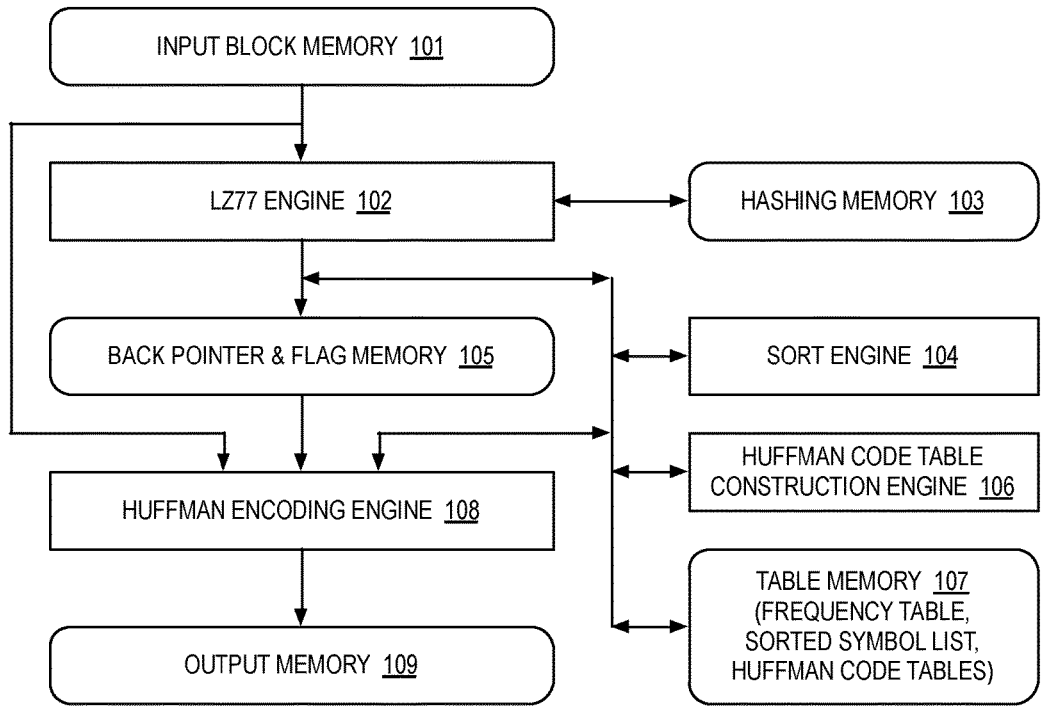
FIG. 1 is a block diagram illustrating a hardware data compressor.

Popular file compression programs, such as gzip and zlib, take an input file and compress it to generate a, hopefully, smaller output file. The output file has a defined format that enables a file decompression program (such as gzip and zlib) to take as input the compressed output file and decompress it to generate a decompressed file that is identical to the original input file. The compressed file comprises a series of blocks that correspond to successive blocks of data of the input file. Each block of the compressed file conforms to a lossless compressed data format defined in the DEFLATE Compressed Data Format Specification version 1.3, RFC 1951. According to the DEFLATE Specification, each block of the input file is compressed using a combination of an LZ-style algorithm (e.g., LZ77) and Huffman coding. See, for example, Ziv J., Lempel A., "A Universal Algorithm for Sequential Data Compression," IEEE Transactions on Information Theory, Vol. 23, No. 3, pp. 337-343; Huffman, D. A., "A Method for the Construction of Minimum Redundancy Codes," Proceedings of the Institute of Radio Engineers, September 1952, Volume 40, Number 9, pp. 1098-1101.

The LZ77 compression algorithm (and its many variations) compresses an input data stream in a lossless fashion by replacing repeated occurrences of data, or strings, in the input data stream with back pointers to earlier occurrences of the strings in the input data stream. A string is one or more consecutive characters. Each back pointer is an ordered pair (length, distance). The length specifies the number of characters of a string at a current scan location in the input data stream that matches the same string beginning at an earlier location in the input stream specified by the distance behind the current scan location. A back pointer has been described as equivalent to the statement: "each of the next length characters is equal to the characters exactly distance characters behind it in the uncompressed stream." The algorithm accomplishes compression by replacing the characters of the repeated string with a back pointer. More specifically, the LZ77 algorithm searches back in the input data stream from the current scan location to find a string match (e.g., the longest matching string, if any) to replace with a single back pointer. If a suitable match is found, the algorithm produces a back pointer to the matching string; otherwise, the algorithm effectively produces the literal input characters, for example, three characters at the current scan location, and updates the current scan location. The DEFLATE Specification uses the term "literals" to refer to the case when the algorithm produces the input characters rather than producing a back pointer to replace the input characters. Thus, the effective output of the LZ77 compression is a stream of literals and back pointers (as well as an optional histogram of frequencies of each literal and back pointer, as discussed in more detail below). In the present specification, literals and back pointers are referred to as "tokens." Hence, the output of the LZ77 compression is a stream of tokens. The amount of compression achieved is largely dependent upon the degree in which strings are repeated in the input data stream and the length of the repeated strings.

The DEFLATE Specification describes Huffman coding, also commonly referred to as prefix coding, as follows. "Prefix coding represents symbols from an a priori known alphabet by bit sequences (codes), one code for each symbol, in a manner such that different symbols may be represented by bit sequences of different lengths, but a parser can always parse an encoded string unambiguously symbol-by-symbol . . . . Given an alphabet with known symbol frequencies, the Huffman algorithm allows the construction of an optimal prefix code (one which represents strings with those symbol frequencies using the fewest bits of any possible prefix codes for that alphabet). Such a code is called a Huffman code." According to the DEFLATE Specification, two distinct alphabets are identified. In one alphabet, the symbols are the values of the literals (entries 0-256) and values, or indexes, associated with back pointer lengths (entries 257-285). In the other alphabet, the symbols are values, or indexes, associated with back pointer distances (entries 0-29). A Huffman code table is created for each of the two alphabets, as described in more detail below.

According to the DEFLATE Specification, each compressed block of the output file includes bits in its header that indicate whether the Huffman code tables used to compress the block are included in the output block or not included in the output block. If not, the Huffman code tables are implied and specified in section 3.2.6 of the DEFLATE Specification. The former (Huffman code tables are included) is referred to by the DEFLATE Specification as compression with dynamic Huffman codes, whereas the latter (Huffman code tables are implied) is referred to as compression with fixed Huffman codes. The dynamic approach has the disadvantage that the compressed file must include a representation of the Huffman code tables, which takes up space in the output block, which works against the goal of making the output file smaller. Thus, the fixed approach may produce a smaller output file for small input files than the dynamic approach would in some cases.

However, the dynamic approach has the advantage that the Huffman codes can be assigned to the alphabet symbols in a manner that is more likely to result in better Huffman coding than would result from using the fixed Huffman code table of the DEFLATE Specification. In this context, better Huffman coding means the dynamic Huffman code table produces a higher compression ratio of the LZ77 output stream than the fixed Huffman code table produces. This is because the fixed Huffman code table is generic and is therefore likely not a very good estimate of the probabilities, or relative frequencies, that the various symbols of the two alphabets will occur in the LZ77 output stream being Huffman compressed because it is not tailored to its particular characteristics. As discussed above, the dynamic Huffman code table may assign shorter codes to the alphabet symbols that occur more frequently in the LZ77 output stream and longer codes to the symbols that occur less frequently in order to accomplish a higher compression ratio of the input block. Conventionally (e.g., as performed by gzip or zlib), the process of compressing an input block to generate a (hopefully) smaller output block that conforms to the DEFLATE Specification using a dynamic Huffman code table comprises a three step process as follows.

First, the process performs LZ77 compression on the input block to generate a stream of tokens (literals and back pointers), referred to as the LZ77 output stream. This step is also referred to as scanning the input block, which involves searching back through the input block for string matches. While scanning the input block, the program also generates two histograms based on the stream of tokens. One histogram includes an entry for each symbol in the literal/length alphabet and the other histogram includes an entry for each symbol in the distance alphabet. Each entry in the histograms specifies a frequency associated with the number of times the symbol appeared in the LZ77 token output stream. It is noted that a back pointer token has two associated symbols: a length symbol in the literal/length alphabet and a distance symbol in the distance alphabet.

Second, the process constructs a literal/length Huffman code table and a distance Huffman code table using the corresponding histograms generated in the first step of the process.

Third, the process Huffman encodes the LZ77 token output stream using the Huffman code tables constructed during the second step of the process to generate the compressed output block. The output block is a sequence of bits that comprise variable-length Huffman codes. In the case of a Huffman code in the output block that specifies a length of a back pointer, it is followed by a Huffman code that specifies the distance of the back pointer.

A drawback of the three-step process described above for compressing a DEFLATE-style input block using dynamic Huffman code tables is that conventionally the steps are performed in a sequential fashion. That is, the Huffman encoding (third step) cannot be performed until the Huffman code tables are constructed (second step), and the Huffman code tables are not constructed (second step) until the histograms are fully generated (during the first step).

However, the first and third steps could be performed in parallel, as may be performed when fixed Huffman code tables are used, for example. The present inventors have made an observation that has enabled them to devise a hardware data compressor that provides the desirable compression ratio improvements afforded by using dynamic Huffman code tables while avoiding the speed impediments associated with using dynamic Huffman code tables. The present inventors examined the histograms after only an initial fraction of the input block had been scanned and compared them with the histograms after the entire input block had been scanned. They observed that in many cases, the comparison revealed there was little difference in the frequencies at the two instances in time with respect to the relative frequencies among different symbols of the alphabet. That is, often the relative frequencies in the histogram after the remainder of the input block has been scanned are largely unchanged from what they were after only the initial portion had been scanned. For example, after only 10% of the input block has been scanned, the frequency of "A" may be 6, the frequency of "B" may be 3, and the frequency of "C" may be 4; whereas, after the entire input block has been scanned, the frequency of "A" may be 62, the frequency of "B" may be 31, and the frequency of "C" may be 44. From a relative perspective, there is no difference in the frequencies after only 10% of the input block was scanned and after the entire input block was scanned.

This is a useful observation, because the Huffman code tables may be created based on the relative frequencies of the symbols of the alphabet, rather than on absolute frequency values. That is, as described above, the higher the relative frequency of an alphabet symbol, the shorter the Huffman code (i.e., fewer bits) that will be assigned to it in order to optimize the compression of the input block by using shorter codes for more frequent symbols.

Based on this observation, embodiments are described of a hardware data compressor that, after only an initial portion of the input block has been scanned, stops updating the histogram and, using this "incomplete" histogram, constructs Huffman code tables—referred to herein as "dynamic-prime" Huffman code tables—and then, in parallel with the scanning of the remainder of the input block, begins using the dynamic-prime Huffman code tables to encode the LZ77 output token stream. This enables the Huffman coding engine of the hardware data compressor to overlap its Huffman coding with the LZ77 compression engine's scanning of the remaining portion of the input block such that at least some, if not all, of the Huffman coding time is hidden behind the LZ77 compression time. Given that the Huffman coding typically takes less time than the input block scanning associated with the LZ77 compression, and depending upon the point in time the Huffman code table is constructed during the input scan, in some cases the Huffman coding time will add a negligible amount of time to the input block compression process.

Figure 9:
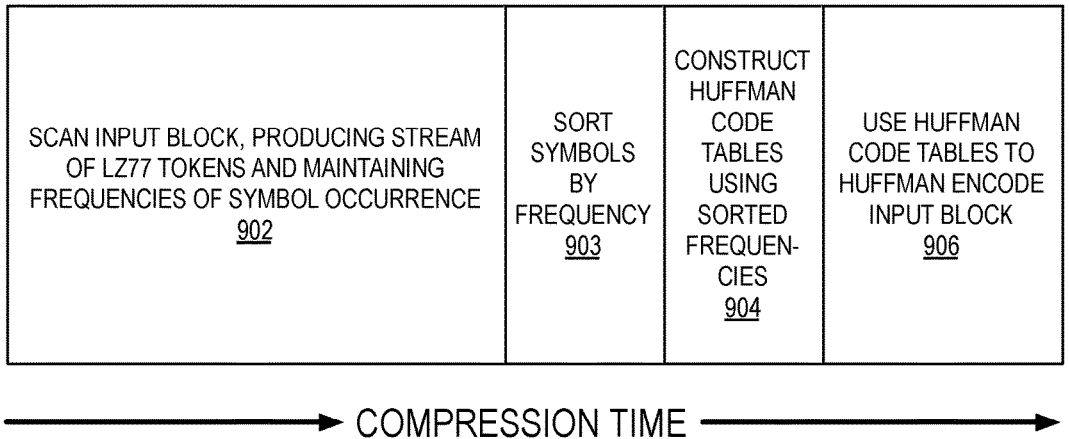
FIG. 9 is a timing diagram graphically illustrating components of the compression time associated with a DEFLATE-style input block compression in a conventional manner.

Additionally, the present inventors have observed that sorting the histogram according to the frequency of occurrence of each symbol (which is needed to construct efficient Huffman code tables) is time consuming and is in the critical path of the compression process, as illustrated in FIG. 9, such that it adds to the total compression time. Advantageously, embodiments are described in which the sorting of the symbol list by frequency is performed on an incremental basis—preferably, by a separate hardware engine as each symbol is generated by the LZ77 engine (see, e.g., FIGS. 2A and 2B)—concurrently with the scan of the input block in order to hide the sorting time behind the input block scan time to reduce the total compression time. The sort engine advantageously benefits from the observation by the inventors that as each symbol is produced by the LZ77 engine, the symbol's frequency value only changes by one and consequently it is highly probable that its position in a sorted list will not need to change, but if so, it is also highly probable that its position will only need to change by a short distance, which can be performed very quickly. In particular, it is highly likely the time required to effect the change in the symbol's position in the sorted list will be less than the time required for the LZ77 engine to search and find a match of the target string. Further advantageously, the incremental and concurrent symbol list sorting mechanism may be employed in combination with the dynamic-prime Huffman table embodiments.

Hardware Data Compressor

Referring now to FIG. 1, a block diagram illustrating a hardware data compressor 100 is shown. The hardware data compressor 100 includes an input block memory 101; a compression engine 102 (e.g., an LZ77 engine); a hashing memory 103; a sort engine 104; a back pointer and flag memory 105; a Huffman code table construction engine 106; a table memory 107 that stores a frequency table, a sorted list of symbols, and Huffman code tables; a Huffman encoding engine 108; and an output memory 109. The compression engine 102, sort engine 104, Huffman code table construction engine 106, and Huffman encoding engine 108 are hardware engines. A hardware engine is hardware, which may include hardware combinatorial and sequential logic, including hardware state machines. A hardware engine is distinct from a programmable processor that fetches instructions stored in a memory and executes the instructions. However, the hardware engine may read data from one or more memories as input and may write data to one or more memories as output.

The input block memory 101 holds an input block of characters that is to be compressed. In one embodiment, the input block memory 101 is 32 KB, in another embodiment the input block memory 101 is 16 KB, although other embodiments are contemplated. Typically, the input block of characters is a portion of characters of an input file that is to be compressed, such as an image file (e.g., JPG, TIFF), an audio file (e.g., AIFF, WAV), a text file, a spreadsheet, a file produced by a word processor or presentation application, or other types of files (e.g., PDF). Preferably, each character of the input block is a byte of data. The input block memory 101 provides the input block to the compression engine 102 and to the Huffman encoding engine 108. In one embodiment, the input block memory 101 is a dual-ported memory to reduce contention in embodiments in which the compression engine 102 is accessing the input block memory 101 to scan the input block (e.g., fetch a string at the current search location and search for a match earlier in the input block) to perform compression (e.g., generate back pointers to replace matching strings) and the Huffman encoding engine 108 is concurrently accessing the input block memory 101 in order to Huffman encode literal symbols of the output token stream (characters of the input block not replaced by back pointers). In one embodiment, the input block is loaded into the input block memory 101 from system memory.

The compression engine 102 compresses the input block by replacing strings of characters of the input block with back pointers to strings earlier in the input block that match the strings to be replaced by the back pointers. The compression engine 102 is preferably an LZ77 engine 102. The LZ77 engine 102 uses an algorithm described in the paper Ziv J., Lempel A., "A Universal Algorithm for Sequential Data Compression," IEEE Transactions on Information Theory, Vol. 23, No. 3, pp. 337-343, or a variation thereof. However, other embodiments are contemplated in which the compression engine 102 produces back pointers using other string replacement lossless compression algorithms.

Preferably, the LZ77 engine 102 produces the back pointers and stores them in the back pointer memory 105. In one embodiment, the LZ77 engine 102 maintains in the back pointer memory 105 an array of flags. In one embodiment, each flag is a single bit corresponding to a character in the input block (e.g., there are 16K bits of flags for an input block of 16K characters). If the flag has a true value, this indicates a back pointer stored in the back pointer memory 105 has replaced the string that begins at the location in the input block that corresponds to the location of the flag in the flag array. For example, if the flag at index 3742 of the flag array is true, then the LZ77 engine 102 has produced a back pointer that replaces the string that begins at location 3742 in the input block. Otherwise (if the flag is false), then the character at the location in the input block corresponding to the index of the flag is considered a "literal" character that is part of the output token stream of the LZ77 engine 102. The literal is a symbol that will be subsequently Huffman encoded by the Huffman encoding engine 108 and stored into the output memory 109.

Preferably, the LZ77 engine 102 employs hash tables and hashing techniques in order to reduce the search time for matching strings, as described in more detail below. The hash tables are stored in the hashing memory 103. Advantageously, in one embodiment, the LZ77 engine 102 employs dual hash tables for increased compression speed, as described in more detail below.

The table memory 107 is accessible by the LZ77 engine 102, the sort engine 104, the Huffman code table construction engine 106, and the Huffman encoding engine 108. The frequency table (an example of which is shown as element 401 of FIG. 4) in the table memory 107 holds a frequency (elements 402 of FIG. 4), or count, that each symbol has occurred in the LZ77 engine 102 output token stream. In one embodiment, the LZ77 engine 102 maintains the frequency values 402 of the frequency table 401. In an alternate embodiment, the sort engine 104 maintains the frequency values 402 of the frequency table 401 in response to tokens 212 produced by the LZ77 engine 102. In another alternate embodiment, the Huffman code table construction engine 106 maintains the frequency values 402 of the frequency table 401 in response to tokens 212 produced by the LZ77 engine 102. The sort engine 104 maintains a sorted list of the symbols (an example of which is shown as sorted list 403 in FIG. 4) according to their frequency (e.g., using a sorted index field 404 of the entries of the frequency table 401 of FIG. 4), as described in more detail below. Additionally, the Huffman code table construction engine 106 uses the sorted list of symbols by frequency to construct a Huffman code table that is used by the Huffman encoding engine 108 to Huffman encode the symbols associated with the tokens of the LZ77 engine 102 output stream for storage in the output memory 109.

As described in more detail below, preferably the Huffman encoding engine 108 employs two Huffman code tables, one for literal and length symbols and one for distance symbols, and therefore two corresponding frequency tables and sorted lists are maintained from which the two Huffman code tables are constructed. In one embodiment, the Huffman code table construction engine 106 constructs the Huffman code tables according to a well-known canonical Huffman encoding process, such as used by the DEFLATE Specification. Preferably, to Huffman encode a literal symbol means to output the Huffman code (e.g., Huffman code 1108 of FIGS. 11A and 11B) associated with the literal symbol value (e.g., symbol value 406 of FIG. 11A or the index into the frequency table 401 of FIG. 11B); to Huffman encode a back pointer length means to output the Huffman code associated with the value of the length symbol whose length range encompasses the back pointer length along with any extra bits used to specify the back pointer length (e.g., as specified in Table 1 below, which is from section 3.2.5 of from the DEFLATE Specification); to Huffman encode a back pointer distance means to output the Huffman code associated with the value of the distance symbol whose distance range encompasses the back pointer distance along with any extra bits used to specify the back pointer distance (e.g., as specified in Table 2 below, which is from section 3.2.5 of the DEFLATE Specification). It should be understood that the term "Code" is included in Table 1 below because the term "Code" is used in the tables of the DEFLATE Specification. However, the values in the "Code" column of Table 1 are not Huffman codes, such as the Huffman codes 1108 of FIGS. 11A and 11B, for example. Rather, the values in the "Code" column correspond to symbol values 406 in the embodiment of FIG. 4, for example, which are also the values of the index into the frequency table 401 of FIG. 4. The same is true with respect to Table 2 for the distance symbols.

TABLE 1

| Code | Extra Bits | Length(s) |
|------|------------|-----------|
| 257  | 0          | 3         |
| 258  | 0          | 4         |
| 259  | 0          | 5         |
| 260  | 0          | 6         |
| 261  | 0          | 7         |
| 262  | 0          | 8         |
| 263  | 0          | 9         |
| 264  | 0          | 10        |
| 265  | 1          | 11, 12    |
| 266  | 1          | 13, 14    |
| 267  | 1          | 15, 16    |
| 268  | 1          | 17, 18    |
| 269  | 2          | 19-22     |
| 270  | 2          | 23-26     |
| 271  | 2          | 27-30     |
| 272  | 2          | 31-34     |
| 273  | 3          | 35-42     |
| 274  | 3          | 43-50     |
| 275  | 3          | 51-58     |
| 276  | 3          | 59-66     |
| 277  | 4          | 67-82     |
| 278  | 4          | 83-98     |
| 279  | 4          | 99-114    |
| 280  | 4          | 115-130   |
| 281  | 5          | 131-162   |
| 282  | 5          | 163-194   |
| 283  | 5          | 195-226   |
| 284  | 5          | 227-257   |
| 285  | 0          | 258       |

TABLE 2

| Code | Extra Bits | Distance(s) |
|------|------------|-------------|
| 0    | 0          | 1           |
| 1    | 0          | 2           |
| 2    | 0          | 3           |
| 3    | 0          | 4           |
| 4    | 1          | 5, 6        |
| 5    | 1          | 7, 8        |
| 6    | 2          | 9-12        |
| 7    | 2          | 13-16       |
| 8    | 3          | 17-24       |
| 9    | 3          | 25-32       |
| 10   | 4          | 33-48       |
| 11   | 4          | 49-64       |
| 12   | 5          | 65-96       |
| 13   | 5          | 97-128      |
| 14   | 6          | 129-192     |
| 15   | 6          | 193-256     |
| 16   | 7          | 257-384     |
| 17   | 7          | 385-512     |
| 18   | 8          | 513-768     |
| 19   | 8          | 769-1024    |
| 20   | 9          | 1025-1536   |
| 21   | 9          | 1537-2048   |
| 22   | 10         | 2049-3072   |
| 23   | 10         | 3073-4096   |
| 24   | 11         | 4097-6144   |
| 25   | 11         | 6145-8192   |
| 26   | 12         | 8193-12288  |
| 27   | 12         | 12289-16384 |
| 28   | 13         | 16385-24576 |
| 29   | 13         | 24577-32768 |

Embodiments are contemplated that do not include the sort engine 104 and instead the Huffman code table construction engine 106 performs the sort of the symbols of the frequency table after the LZ77 engine 102 has finished updating the frequency table. Typically, the LZ77 engine 102 stops updating the frequency table after it has scanned the entire input block. However, embodiments are described below in which the LZ77 engine 102 advantageously stops updating the frequency table after it has scanned an initial fraction of the input block at which time the Huffman code table construction engine 106 constructs a Huffman code table—referred to herein as a "dynamic-prime" Huffman code table.

Maintenance of Sorted Symbol List Concurrently with Input Block Scan

Figure 2A:
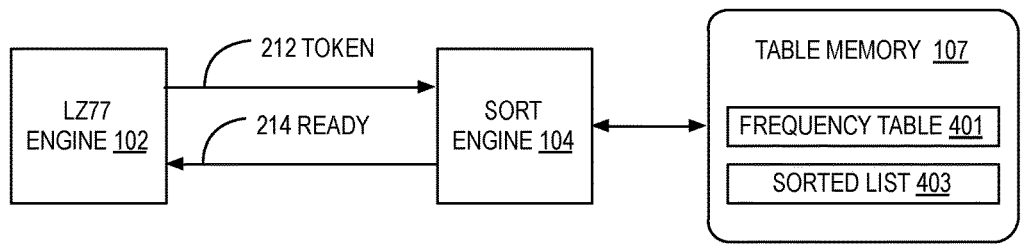
FIG. 2A is a block diagram illustrating a portion of the hardware data compressor of FIG. 1.

Referring now to FIG. 2A, a block diagram illustrating a portion of the hardware data compressor 100 of FIG. 1 is shown. The LZ77 engine 102 of FIG. 1 produces a token 212 to the sort engine 104. The token 212 is a representation of either a back pointer or string of literals (that may be a single literal character). In one embodiment, the token 212 is a pointer, or index, into the input block memory 101 of the location of the string of literals. In such an embodiment, the input block memory 101 is accessible by the sort engine 104. In an alternate embodiment, the token 212 is the string of literals themselves, e.g., the values of the characters of the string. In one embodiment, the token 212 is a pointer, or index, into the pointer memory 105 of the location of the back pointer. In such an embodiment, the pointer memory 105 is accessible by the sort engine 104. In an alternate embodiment, the token 212 is the back pointer itself, e.g., the length and distance values of the back pointer. The sort engine 104 generates a ready signal 214 to the LZ77 engine 102 based on its progress of updating the frequency table 401 and sorted list 403 in the table memory 107, as described in more detail below, particularly with respect to FIG. 3.

As may be inferred from study of FIGS. 3 through 8, pathological cases may occur in which the frequency of a symbol is the same as multiple other symbols above it in the sorted list such that when the symbol frequency is incremented the sort engine 104 is required to perform multiple swaps to get the symbol to its correctly sorted location in the list 403. Furthermore, the incremented frequency of the symbol may be equal to multiple symbols above it having a later lexical value such that when the symbol frequency is incremented the sort engine 104 is required to perform multiple swaps to get the symbol to its correctly sorted location in the list 403. If the sort engine 104 is busy and cannot receive a token 212 from the LZ77 engine 102, then the time required to perform the compression of the input block may be increased.

Generally speaking, the pathological case is more likely to occur when the distribution of the symbol frequencies is relatively uniform. This is likely to occur early in the scan of the input buffer when all the frequencies are initialized to zero. It should be noted that an embodiment such as described below with respect to FIGS. 14A through 14C and FIG. 16 in which the frequencies are initialized to non-equal values may have the advantage of reducing the likelihood of a pathological case.

In one embodiment, the hardware data compressor 100 includes a short first-in-first-out (FIFO) memory between the LZ77 compression engine 102 and the sort engine 104 that buffers the tokens 212 provided from the LZ77 compression engine 102 to the sort engine 104 when necessary to reduce, and in some cases eliminate, the impact of the pathological cases. A full flag output by the FIFO serves as the ready signal 214 to the LZ77 compression engine 102.

Figure 2B:
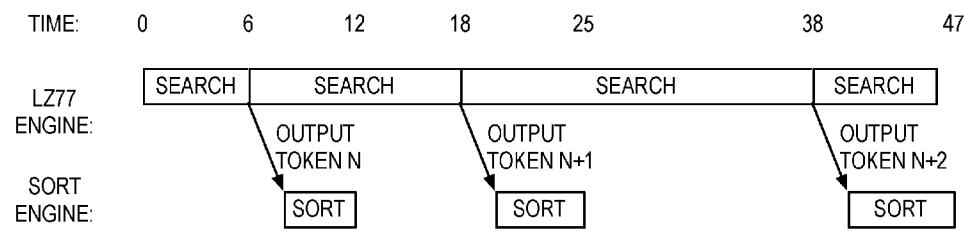
FIG. 2B is a timing diagram illustrating operation of the LZ77 engine and sort engine of FIG. 2A.

Referring now to FIG. 2B, a timing diagram illustrating operation of the LZ77 engine 102 and sort engine 104 of FIG. 2A is shown. The upper portion illustrates operation of the LZ77 engine 102 and the lower portion illustrates operation of the sort engine 104. Time progresses from left to right. The times shown are unit-less and are used to illustrate relative time. However, the times could be representative of clock cycles, nanoseconds, or other relevant time units.

As shown, at time 0, the LZ77 engine 102 begins scanning the input block at the current search location to search for a string match (e.g., as at block 302 of FIG. 3) and at time 6 outputs a token 212, denoted token N, to the sort engine 104. In response, the sort engine 104 increments the frequency of each of the symbols associated with token N and re-sorts the sorted list of symbols (e.g., sorted list 403 of FIG. 4) to maintain sorted order by frequency (and lexical order) among the symbols (e.g., as at block 316 of FIG. 3), which finishes at time 12, which is before the LZ77 engine 102 finishes its next search and outputs token N+1 at time 18. In response, the sort engine 104 increments the frequency of each of the symbols associated with token N+1 and re-sorts the sorted list of symbols to maintain sorted order by frequency, which finishes at time 25, which is before the LZ77 engine 102 finishes its next search and outputs token N+2 at time 38. In response, the sort engine 104 increments the frequency of each of the symbols associated with token N+2 and re-sorts the sorted list of symbols to maintain sorted order, which finishes at time 47, which is after the LZ77 engine 102 finishes its next search and outputs token N+3. In this case, the ready signal 214 will cause the LZ77 engine 102 to stall waiting for the sort engine 104 to complete the sort (unless there is a FIFO in the embodiment and the FIFO is non-full, as described above).

As illustrated in FIG. 2B, advantageously the sort engine 104 incrementally keeps the list of symbols sorted by frequency concurrently with the LZ77 engine 102 scanning the input block such that the time required to maintain the sorted list of symbols is hidden behind the input block scan time, as described in more detail herein.

Figure 3:
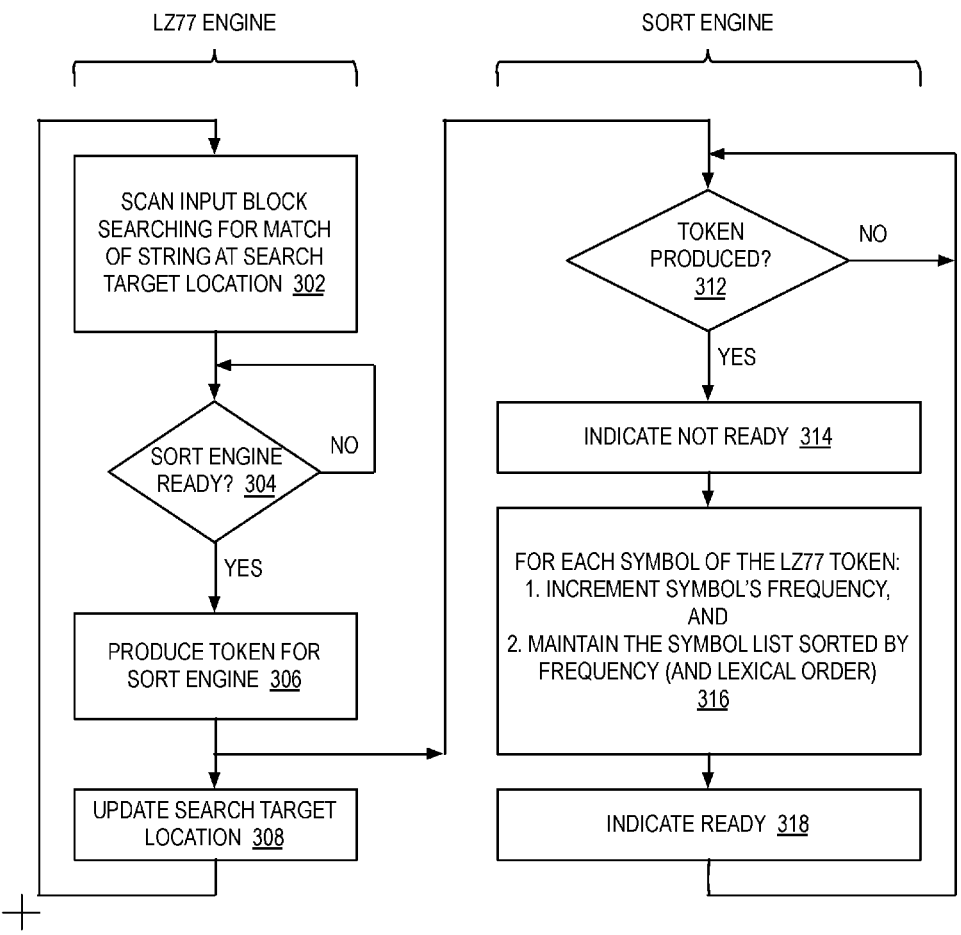
FIG. 3 is a flowchart illustrating operation of the LZ77 engine and sort engine of FIG. 2A.

Referring now to FIG. 3, a flowchart illustrating operation of the LZ77 engine 102 and sort engine 104 of FIG. 2A is shown. In FIG. 3, the LZ77 engine 102 performs the operations at blocks 302 through 308, whereas the sort engine 104 performs the operations at blocks 312 through 318. Flow begins at block 302.

At 302, the LZ77 engine 102 scans the input block searching for a match of a string at the current search target location within the input block. Flow proceeds to decision block 304.

At decision block 304, the LZ77 engine 102 examines the ready signal 214 to determine whether the sort engine 104 is ready to receive a token 212 from the LZ77 engine 102. If so, flow proceeds to block 306; otherwise, flow returns to decision block 304 until the sort engine 104 is ready.

At block 306, the LZ77 engine 102 produces the token 212 to the sort engine 104. Flow proceeds to block 308 with respect to the LZ77 engine 102, and concurrently flow proceeds to decision block 312 with respect to the sort engine 104.

At block 308, the LZ77 engine 102 updates the current search target location. Flow returns to block 302 for the LZ77 engine 102 to search for the next string, until the end of block character is encountered.

At decision block 312, the sort engine 104 determines whether the LZ77 engine 102 has produced a token 212 for it. If so, flow proceeds to block 314; otherwise, flow returns to decision block 312 until the LZ77 engine 102 has produced a token 212.

At block 314, the sort engine 104 outputs a false value on the ready signal 214. Flow proceeds to block 316.

At block 316, for each symbol of the token 212 received from the LZ77 engine 102, the sort engine 104 increments the symbol's frequency (e.g., 402 of FIG. 4) and maintains the sorted list (e.g., 403 of FIG. 4) according to occurrence frequency of the symbols as well as lexical order, as described below in more detail with respect to FIG. 5. Flow proceeds to block 318.

At block 318, the sort engine 104 outputs a true value on the ready signal 214. Flow returns to decision block 312.

As described above, typically the sort engine 104 performs the operation at block 316 in less time than the LZ77 engine 102 performs the operation at block 302. Consequently, the time required by the sort engine 104 to maintain the sorted list of symbols at block 316 in response to a token produced by the LZ77 engine 102 is typically advantageously hidden behind the time required by the LZ77 engine 102 to produce the next token at block 302. This is because, as the present inventors observed, the symbol's frequency value only changes by one and consequently it is highly probable that its position in the sorted symbol list will not need to change; however, if it does, it is also highly probable that its position will only need to change by a short distance within the sorted list, which the sort engine 104 can typically perform faster than the LZ77 engine 102 string search.

Figure 4:
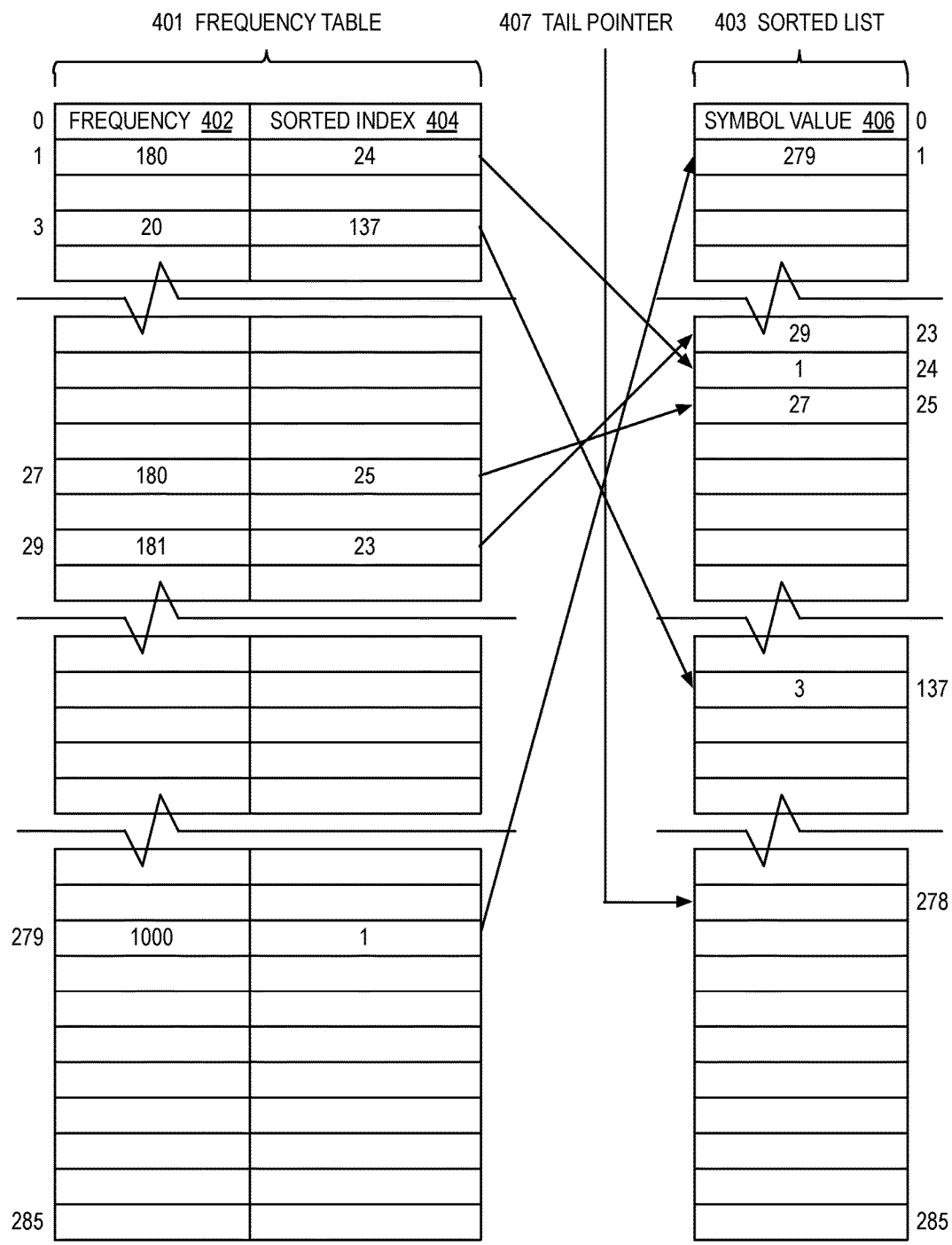
FIG. 4 is a block diagram illustrating a frequency table, sorted list and tail pointer for use by the sort engine of FIG. 1.

Referring now to FIG. 4, a block diagram illustrating a frequency table 401, sorted list 403 and tail pointer 407 for use by the sort engine 104 of FIG. 1 is shown. The frequency table 401 is an array of entries each having two fields: a frequency field 402 and a sorted index field 404. Each entry is associated with a different symbol of the symbol space of symbols to be encoded by the Huffman encoding engine 108 of FIG. 1. The value of the symbol is the index into the frequency table 401. The symbol's frequency 402 is updated each time it appears in the output stream of the LZ77 engine 102. In the example embodiment of FIG. 4, the symbol space includes the values 0 through 285, which index into the frequency table 401. The symbol space values 0 through 285 correspond to the literal and length symbols specified by the DEFLATE Specification. However, other embodiments are contemplated in which other symbol alphabets are employed and that make use of the approach described in which a hardware sort engine incrementally keeps the list of symbols sorted by frequency concurrently with a hardware compression engine scanning the input block (e.g., as shown in FIG. 2B). The sorted index 404 of an entry in the frequency table 401 indexed by a symbol value points to the entry in the sorted list 403 into which the sort engine 104 has sorted the symbol's value 406, as described in more detail below with respect to FIG. 5.

The sorted list 403 is an array that has the same number of entries as the frequency table 401. The entry at the top of the sorted list 403, entry 0, holds the symbol value 406 of the symbol that has occurred most frequently in the LZ77 engine 102 output stream; entry 1 holds the symbol value 406 of the symbol that has occurred next most frequently in the LZ77 engine 102 output stream; and so forth. For symbols that have occurred an equal number of times, they appear in lexical order, i.e., smaller symbol values 406 are sorted higher in the list 403 than larger symbol values 406. Thus, the index into the sorted list 403 indicates the order, by frequency of occurrence and lexical value, of the symbol whose value 406 is stored in the indexed entry of the sorted list 403.

Advantageously, the sorted list 403 inherently points back to the frequency table 401. That is, the symbol value 406 in an entry of the sorted list 403 is the index into the frequency table 401 for the symbol located in the entry of the sorted list 403. Consequently, by starting with the value of the instant symbol (i.e., whose frequency 402 is being incremented), the frequency 402 of the symbol one entry above the instant symbol may be obtained from the frequency table 401 by using the symbol value 406 in the one-above entry of the sorted list 403 to index into the frequency table 401. This enables a comparison of the two frequencies 402 to be made (e.g., at blocks 512 and 516 of FIG. 5) to determine whether the instant symbol needs to be moved up in the sorted list 403 (e.g., at blocks 514 and 522 of FIG. 5).

The tail pointer 407 points to the next available entry in the sorted list 403, which is the location where the next symbol that newly appears in the LZ77 engine 102 output stream will be placed. The entry at the tail pointer 407 and the entries below it are empty.

Although only a single frequency table 401 and single sorted list 403 are shown (e.g., for the literals and lengths), it should be understood that another frequency table and sorted list are maintained for the distances. In the DEFLATE Specification embodiment, the distance frequency table 401 and distance sorted list 403 each have 30 entries (indexed as 0 through 29) rather than the 286 entries shown for the literals and lengths.

In FIG. 4, various example values are shown to illustrate the use of the frequency table 401 and sorted list 403. For example, entry 1 of the frequency table 401 has a frequency 402 of 180 and a sorted index 404 of 24, which points to entry 24 of the sorted list 403, which in turn has the symbol value 1. Similarly, entry 3 of the frequency table 401 has a frequency 402 of 20 and a sorted index 404 of 137, which points to entry 137 of the sorted list 403, which in turn has the symbol value 3; entry 27 of the frequency table 401 has a frequency 402 of 180 and a sorted index 404 of 25, which points to entry 25 of the sorted list 403, which in turn has the symbol value 27; entry 29 of the frequency table 401 has a frequency 402 of 181 and a sorted index 404 of 23, which points to entry 23 of the sorted list 403, which in turn has the symbol value 29; and entry 279 of the frequency table 401 has a frequency 402 of 1000 and a sorted index 404 of 1, which points to entry of the sorted list 403, which in turn has the symbol value 279. These values will be used for illustration purposes in FIGS. 6 through 8 to demonstrate the operation of the sort engine 104 according to FIG. 5.

Figure 5:
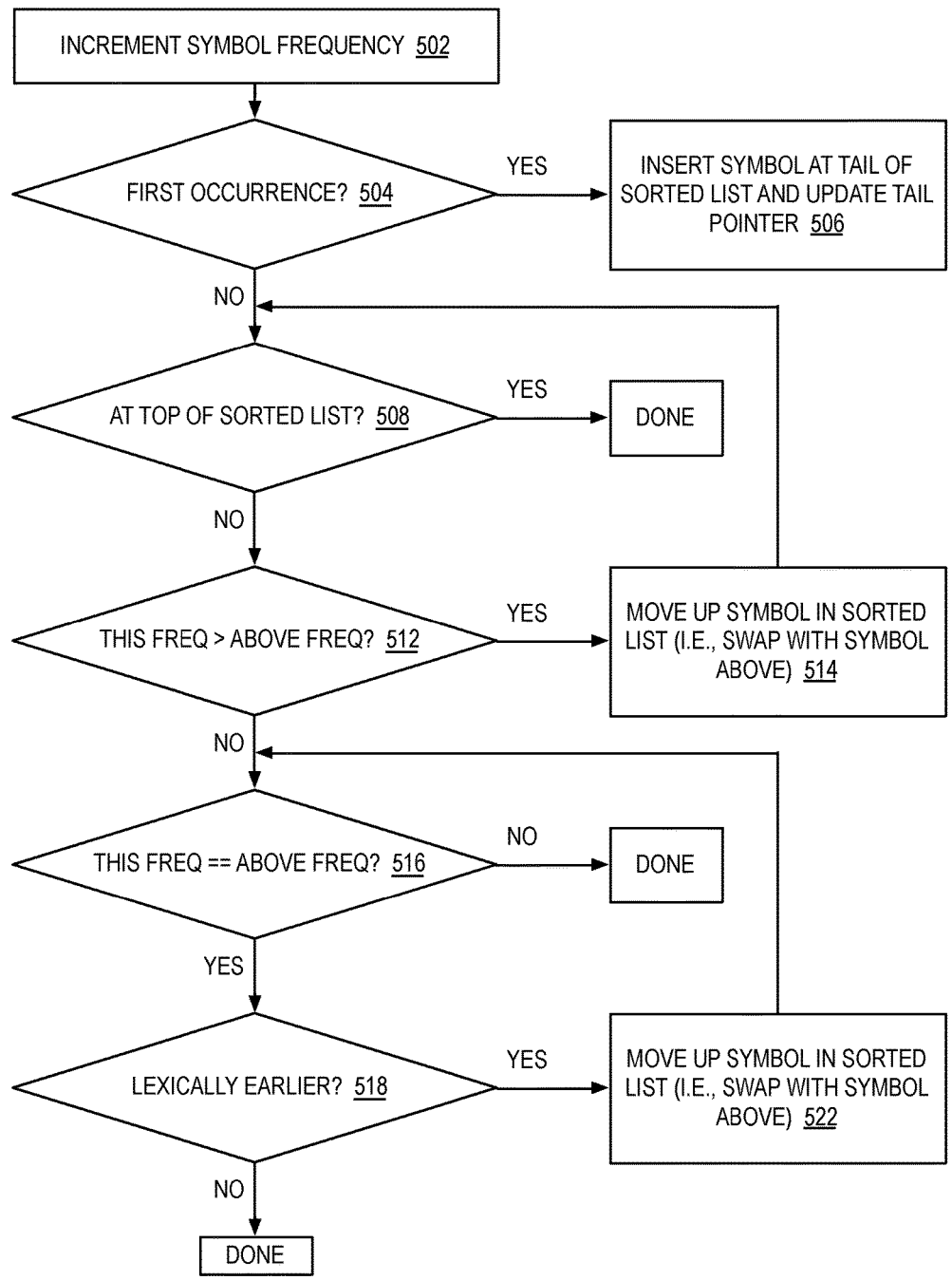
FIG. 5 is a flowchart illustrating operation of the sort engine of FIG. 1 according to an embodiment of block of FIG. 3.

Referring now to FIG. 5, a flowchart illustrating operation of the sort engine 104 of FIG. 1 according to an embodiment of block 316 of FIG. 3 is shown. Although pseudo-code is provided below in the description of FIG. 5 to illustrate the operation of the sort engine 104, it should be understood that the sort engine 104 is a hardware engine that performs the various operations described in hardware rather than software. Flow begins at block 502.

At block 502, the sort engine 104 receives a token 212 from the LZ77 engine 102 and determines the symbols associated with the token 212. FIG. 5 describes the operation of the sort engine 104 for one symbol associated with the token 212, although the sort engine 104 performs the operation for all the symbols. As discussed above, if the token 212 is a back pointer, the token 212 has two associated symbols: the length and distance of the back pointer. Whereas, if the token 212 is a literal string, then the token 212 has the same number of associated symbols as the number of characters of the string and the symbols are the string character values. For example, a 15-character ASCII literal string token 212 "This is the day" has 15 symbols, namely: "T", "h", "i", "s", " ", "i", "s", " ", "t", "h", "e", " ", "d", "a", "y", or numerically: 84, 104, 105, 115, 32, 105, 115, 32, 116, 104, 101, 32, 100, 97, 121. Flow proceeds to decision block 504. The following pseudo-code illustrates the operation performed at block 502:

increment freq_tbl[this_symbol_val].freq

At decision block 504, the sort engine 104 determines whether this is the first occurrence of the symbol, preferably by examining the frequency 402 value of the symbol in the frequency table 401. If this is the first occurrence, flow proceeds to block 506; otherwise, flow proceeds to decision block 508. The following pseudo-code illustrates the operation performed at block 504:

if (freq_tbl[this_symbol_val].freq==1)

At block 506, the sort engine 104 inserts the symbol at the tail of the sorted list 403 (e.g., at the entry pointed to by the tail pointer 407) and updates (e.g., increments) the tail pointer 407. Flow ends at block 506. The following pseudo-code illustrates the operation performed at block 506:

```
freq_tbl[this_symbol_val].sorted_idx = tail_ptr
sorted_list[tail_ptr] = this_symbol_val
increment tail_ptr
```

At decision block 508, the sort engine 104 determines whether the symbol is at the top of the sorted list 403. If so, flow ends; otherwise, flow proceeds to decision block 512. The following pseudo-code illustrates the operation performed at block 508:

if (freq_tbl[this_symbol_val].sorted_idx==0)

At decision block 512, the sort engine 104 determines whether the frequency 402 of the symbol is greater than the frequency 402 of the symbol above it in the sorted list 403. If so, flow proceeds to block 514; otherwise, flow proceeds to decision block 516. The following pseudo-code illustrates the operation performed at block 512:

```
X = freq_tbl[this_symbol_val].freq
this_sorted_idx = freq_tbl[this_symbol_val].sorted_idx
above_symbol_val = sorted_list[this_sorted_idx − 1]
Y = freq_tbl[above_symbol_val].freq
if (X > Y)
```

At block 514, the sort engine 104 moves the symbol up in the sorted list 403. That is, the sort engine 104 swaps the position of the symbol in the sorted list 403 with the position of the symbol in the entry above in the sorted list 403. This involves not only updating the symbol values 406 in the relevant entries of the sorted list 403, but also updating the sorted index 404 values of the relevant entries of the frequency table 401. Flow returns from block 514 to decision block 508 to determine whether the symbol needs to be moved up again in the sorted list 403. The following pseudo-code illustrates the operation performed at block 514 and block 522:

```
decrement freq_tbl[this_symbol_val].sorted_idx
increment freq_tbl[above_symbol_val].sorted_idx
sorted_list[this_sorted_idx] = above_symbol_val
sorted_list[this_sorted_idx - 1] = this_symbol_val
```

At decision block 516, the sort engine 104 determines whether the frequency 402 of the symbol equals the frequency 402 of the symbol above it in the sorted list 403. If so, flow proceeds to decision block 518; otherwise, flow ends. The following pseudo-code illustrates the operation performed at block 516:

```
X = freq_tbl[this_symbol_val].freq
this_sorted_idx = freq_tbl[this_symbol_val].sorted_idx
above_symbol_val = sorted_list[this_sorted_idx - 1]
Y = freq_tbl[above_symbol_val].freq
if (X == Y)
```

At decision block 518, the sort engine 104 determines whether the symbol's value is lexically earlier—that is, has a lesser value—than the symbol above it in the sorted list 403. If so, flow proceeds to block 522; otherwise, flow ends. The following pseudo-code illustrates the operation performed at block 518:

if (this_symbol_val<sorted_list[this_symbol_val-1])

At block 522, the sort engine 104 moves the symbol up in the sorted list 403, similar to the manner described with respect to block 514 above. Flow returns from block 522 to decision block 516 to determine whether the symbol needs to be moved up again in the sorted list 403.

Figure 6:
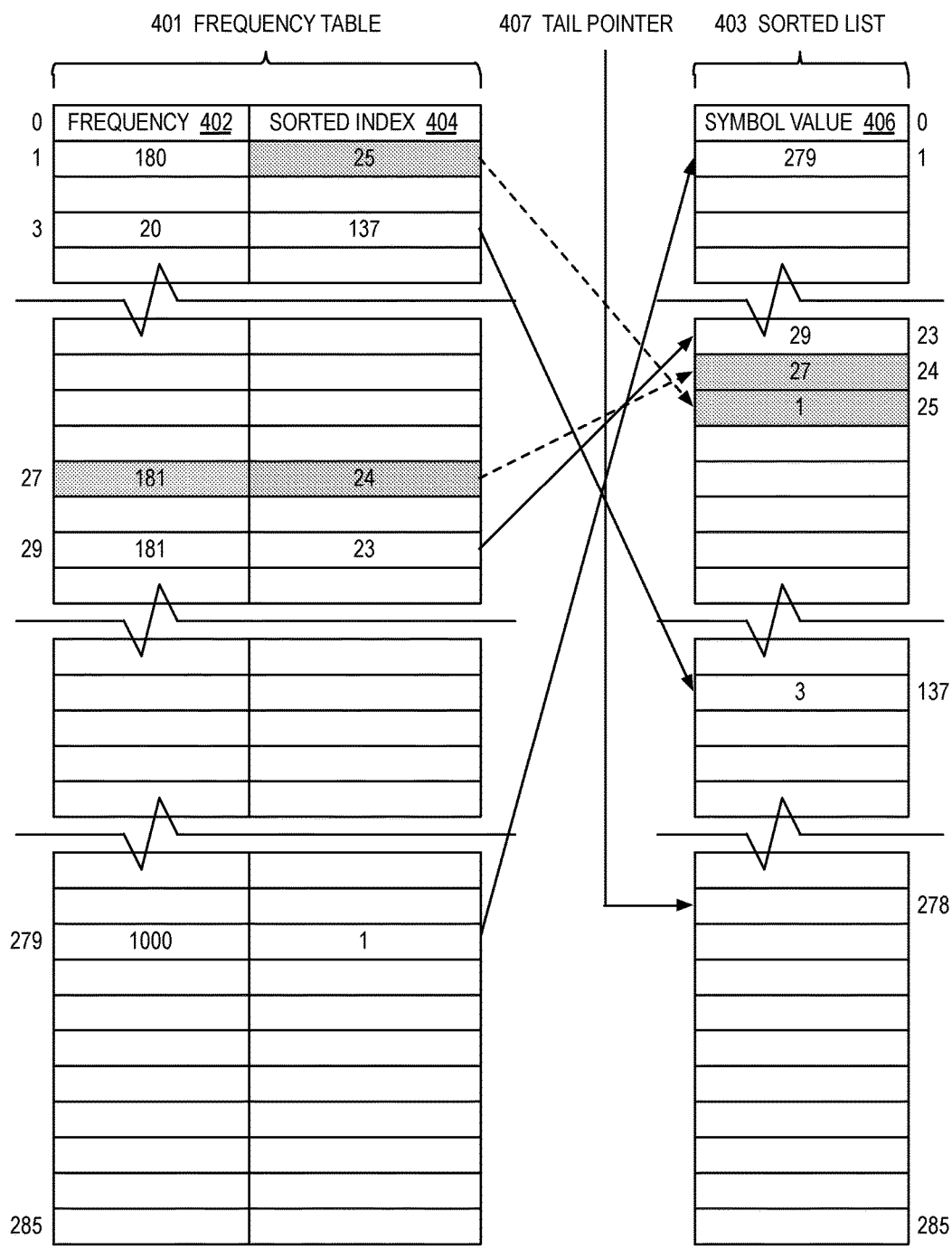
FIG. 6 is a block diagram illustrating the frequency table, sorted list and tail pointer of FIG. 4 updated by the sort engine.

Referring now to FIG. 6, a block diagram illustrating the frequency table 401, sorted list 403 and tail pointer 407 of FIG. 4 updated by the sort engine 104 is shown. FIG. 6 illustrates the state of the frequency table 401 and sorted list 403 of FIG. 4 after the sort engine 104 has processed a received symbol 27. Specifically, the sort engine 104 incremented the frequency 402 at index 27 of the frequency table 401 from 180 to 181, according to block 502 of FIG. 5. Furthermore, the sort engine 104 determined at decision block 512 of FIG. 5 that the frequency 402 of symbol 27, which is 181, is now greater than the frequency 402 of the symbol that was above it in the sorted list 403 in FIG. 4, which is symbol 1, which has a frequency of 180. Consequently, according to block 514 of FIG. 5, the sort engine 104 swapped the locations of symbol 27 and symbol 1 in the sorted list 403. This involved changing the symbol value 406 of entry 24 from 1 to 27 and changing the symbol value 406 of entry 25 from 27 to 1. This also involved swapping their respective sorted index 404 values; preferably, the sort engine 104 incremented the sorted index 404 of symbol 1 from 24 to 25 and decremented the sorted index 404 of symbol 27 from 25 to 24. These changes are highlighted in FIG. 6 by grey rectangles of values that are changed and dashed arrow lines corresponding the sorted index 404 pointer values that are changed.

Figure 7:
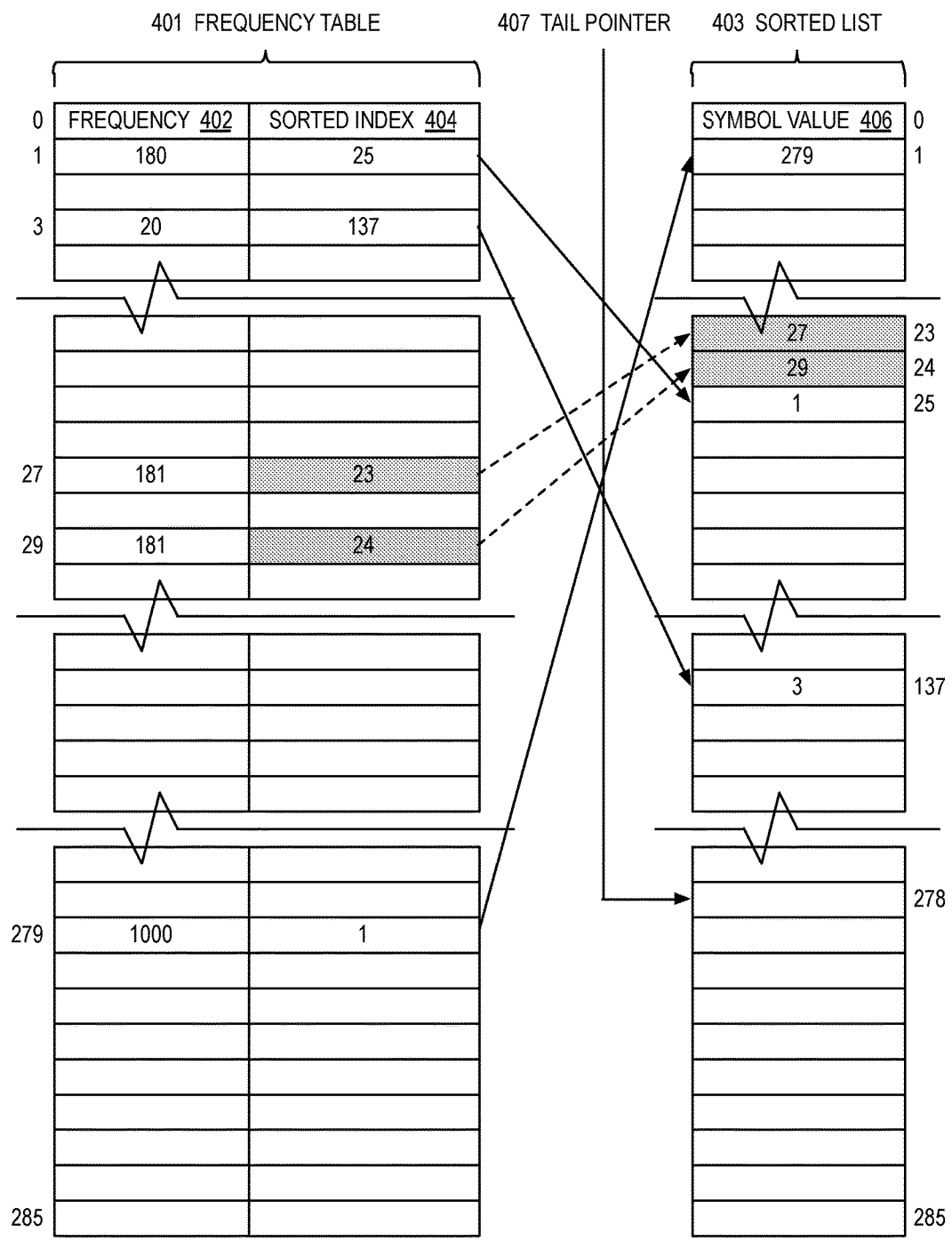
FIG. 7 is a block diagram illustrating the frequency table, sorted list and tail pointer of FIG. 6 updated by the sort engine.

Referring now to FIG. 7, a block diagram illustrating the frequency table 401, sorted list 403 and tail pointer 407 of FIG. 6 updated by the sort engine 104 is shown. FIG. 7 illustrates the state of the frequency table 401 and sorted list 403 of FIG. 6 after the sort engine 104 has further processed the received symbol 27. Specifically, the sort engine 104 determined at decision block 516 of FIG. 5 that the frequency 402 of symbol 27, which is 181, is equal to the frequency 402 of the symbol that was above it in the sorted list 403 in FIG. 6, which is symbol 29, which also has a frequency of 181, and the sort engine 104 also determined at decision block 518 that the value of the symbol 27 is lexically earlier than the symbol 29 above it in the sorted list 403. Consequently, according to block 522 of FIG. 5, the sort engine 104 swapped the locations of symbol 27 and symbol 29 in the sorted list 403. This involved changing the symbol value 406 of entry 23 from 29 to 27 and changing the symbol value 406 of entry 24 from 27 to 29. This also involved swapping their respective sorted index 404 values; preferably, the sort engine 104 incremented the sorted index 404 of symbol 29 from 23 to 24 and decremented the sorted index 404 of symbol 27 from 24 to 23. These changes are highlighted in FIG. 7 by grey rectangles of values that are changed and dashed arrow lines corresponding the sorted index 404 pointer values that are changed.

Figure 8:
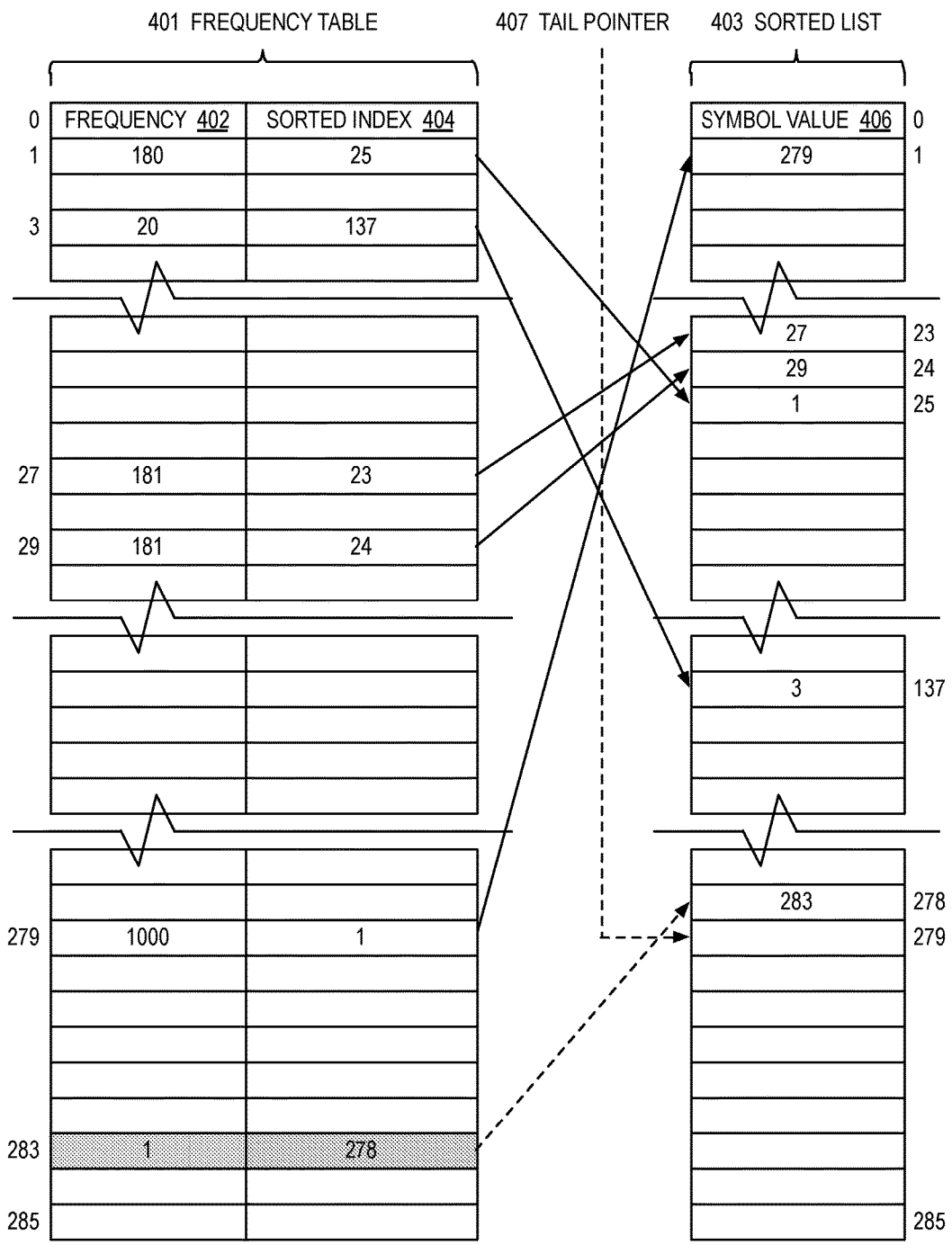
FIG. 8 is a block diagram illustrating the frequency table, sorted list and tail pointer of FIG. 7 updated by the sort engine.

Referring now to FIG. 8, a block diagram illustrating the frequency table 401, sorted list 403 and tail pointer 407 of FIG. 7 updated by the sort engine 104 is shown. FIG. 8 illustrates the state of the frequency table 401 and sorted list 403 of FIG. 7 after the sort engine 104 has processed a received symbol 283. Specifically, the sort engine 104 incremented the frequency 402 at index 283 of the frequency table 401 from 0 to 1, according to block 502 of FIG. 5. Furthermore, the sort engine 104 determined at decision block 504 of FIG. 5 that this is the first occurrence of symbol 283. Consequently, according to block 506 of FIG. 5, the sort engine 104 inserted symbol 283 at the tail of the sorted list 403, which in the example of FIG. 8 is at index 278 of the sorted list 403. This involved inserting the symbol value 283 into the symbol value 406 field of the entry pointed to by the tail pointer 407 of FIG. 7, which is entry 278 in the example. This also involved storing the tail pointer value 407 of FIG. 7, which is 278, into the sorted index 404 of entry 283 of the frequency table 401. The sort engine 104 also incremented the tail pointer 407 from 278 to 279. These changes are highlighted in FIG. 8 by grey rectangles of values that are changed and dashed arrow lines corresponding the sorted index 404 pointer and tail pointer 407 values that are changed.

By operating in the manner described in FIGS. 3 through 8, the sort engine 104 effectively provides the list of symbols 403, sorted by frequency and lexical order, at or very near the end of the scan of the input block by the LZ77 engine 102. That is, the symbol sort time (shown graphically by block 1003 in the timing diagram of FIG. 10)—except for possibly the time required to update the location in the sorted list of the symbols associated with the last token—is overlapped with the input block scanning by the LZ77 engine 102 (shown graphically by block 1002 of FIG. 10), thus reducing the total compression time over a conventional compression time shown in FIG. 9. Furthermore, even the time required to update the location in the sorted list 403 of the symbols associated with the last token 212 of the LZ77 output token stream, in most cases, will be very small because by now the distribution of frequencies in the frequency table 401 will likely be relatively non-uniform such that in most cases the increment of the frequency 402 of the last symbol will not require an update to the sorted list 403, and if it does, it will likely require only a single move up. Indeed, the last symbol is typically an end-of-block symbol, which will be inserted at the tail of the sorted list because it will not have been seen before. Thus, the sort engine 104 might perform a special check for an end-of-block symbol, which will always be a literal and not have a back pointer to it; hence, the construction of the Huffman code table need not be delayed on account of an end-of-block symbol.

Referring now to FIG. 9, a timing diagram graphically illustrating components of the compression time associated with a DEFLATE-style input block compression in a conventional manner is shown. At the beginning of the compression time, at block 902, the input block is scanned and a stream of LZ77 tokens is produced and a histogram of frequencies of occurrence of the symbols is kept. Once block 902 is completed, the symbols are sorted in order by their frequencies at block 903. Once block 903 is completed, Huffman code tables are constructed using the sorted symbols by frequency at block 904. Once block 904 is completed, the Huffman code tables are used to Huffman encode the input block at block 906, i.e., to Huffman encode the LZ77 token output stream. The operations associated with blocks 902, 904, 906 and 908 are performed sequentially and in order; consequently, the total compression time is the sum of the times associated with all of blocks 902, 904, 906 and 908, as shown.

Figure 10:
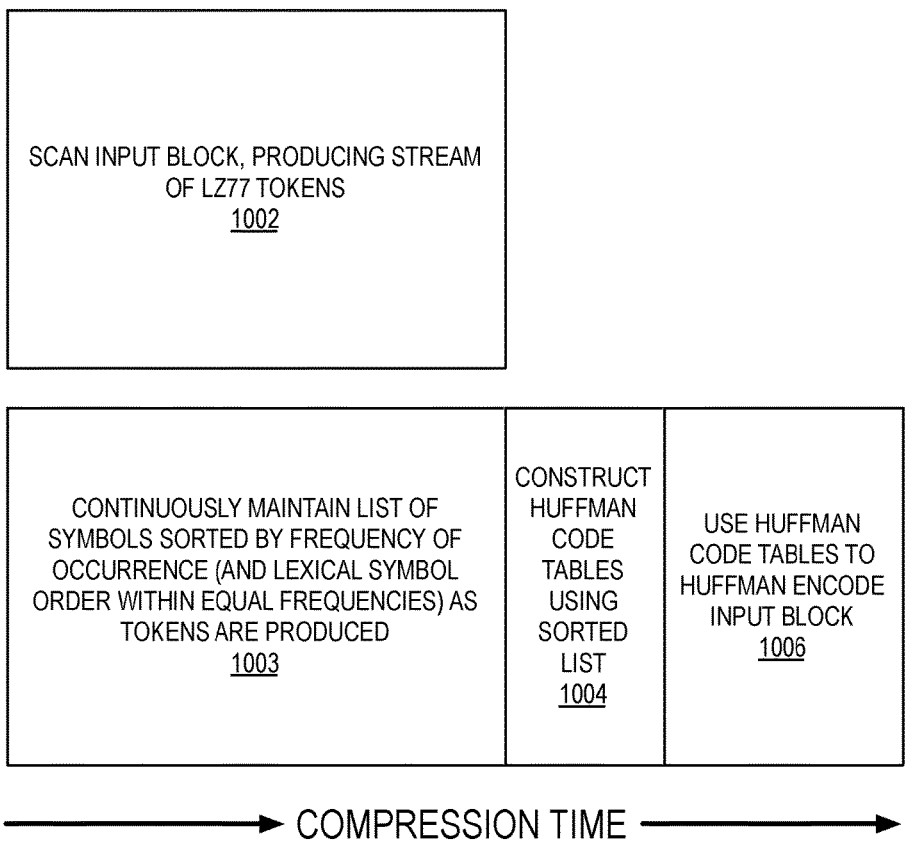
FIG. 10 is a timing diagram graphically illustrating components of the compression time associated with a DEFLATE-style input block compression according to concurrent symbol list sorting embodiments.

Referring now to FIG. 10, a timing diagram graphically illustrating components of the compression time associated with a DEFLATE-style input block compression according to concurrent symbol list sorting embodiments described herein is shown. At the beginning of the compression time, at block 1002 the LZ77 engine 102 scans the input block of characters in the input block memory 101 and produces a stream of tokens 212 as described herein, e.g., repeatedly for each produced token 212 as described with respect to blocks 302 through 308 of FIG. 3. Very near the beginning of the compression time, namely when the first token 212 is produced by the LZ77 engine 102, at block 1003 the sort engine 104 continuously maintains a list of symbols sorted by frequency of occurrence and lexical symbol order within equal frequencies, e.g., as described with respect to blocks 312 through 318 of FIG. 3. The time of the operation at block 1003 can be advantageously hidden behind the time of the operation at block 1002 primarily because the time required by the sort engine 104 to maintain the sorted list of symbols at block 316 of FIG. 3 in response to a token produced by the LZ77 engine 102 is, for most tokens, advantageously hidden behind the time required by the LZ77 engine 102 to produce the next token at block 302 of FIG. 3, as described above.

When the LZ77 engine 102 has finished scanning the input block of characters and the sort engine 104 has finished updating the sorted list 403 for the symbols associated with the last token 212 (if necessary), at block 1004 the Huffman code table construction engine 106 constructs the Huffman code tables using the sorted list 403. Then, at block 1006 the Huffman encoding engine 108 encodes the input block of characters—or more precisely, the replacement back pointers produced by the LZ77 engine 102 and the non-replaced literals of the input block—using the Huffman code tables constructed at block 1004 and writes the compressed output to the output memory 109. (The Huffman code tables are also Huffman encoded and written to the output memory, which enables the decompressor to recreate the Huffman code tables that were used for compression.) As may be observed by comparing FIG. 9 and FIG. 10, by the sort engine 104 maintaining the sorted symbol list concurrently with the LZ77 engine 102 scanning the input block, advantageously the total compression time is reduced compared to a conventional method.

Referring now to FIG. 11A, a block diagram illustrating a sorted list 403 according to an alternate embodiment is shown. In the embodiment of FIG. 11A, each entry of the sorted list 403 also includes a Huffman code 1108 and bit length 1112 associated with the symbol value 406. In this way, the Huffman code table construction engine 106 can assign Huffman codes 1108, and associated bit lengths 1112, for the symbols of the sorted list 403. Preferably the Huffman code table construction engine 106 assigns the Huffman codes 1108 according to a canonical Huffman encoding. The bit length 1112 indicates the number of bits in the Huffman code 1108. The sorted list 403 embodiment of FIG. 11A may be used in conjunction with the frequency table 401 of FIG. 4 as a Huffman code table. That is, given a symbol value as input (e.g., values 0 through 285 of a DEFLATE-style literal/length table, or values 0 through 29 of a DEFLATE-style distance table), the symbol value is used as an index into the frequency table 401 to determine the sorted index 404 value of the symbol, which is then used to index into the sorted list 403 of FIG. 11A to obtain the Huffman code 1108 associated with the symbol. An alternate embodiment that avoids the level of indirection to accomplish a Huffman code table is described below with respect to FIG. 11B.

Referring now to FIG. 11B, a block diagram illustrating a frequency table 401 according to an alternate embodiment is shown. In the embodiment of FIG. 11B, each entry of the frequency table 401 also includes a Huffman code field 1108 and bit length 1112 associated with the symbol whose value is the index into the frequency table 401. In this way, the Huffman code table construction engine 106 can assign Huffman codes 1108, and associated bit lengths 1112, for the symbols, whose values index into the frequency table 401, thus constructing a direct lookup Huffman code table as part of the frequency table 401 (e.g., at block 1004 of FIG. 10).

Figure 12:
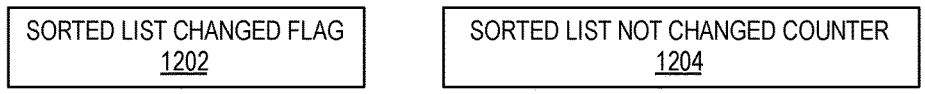
FIG. 12 is a block diagram illustrating hardware associated with the hardware data compressor of FIG. 1 according to an alternate embodiment.

Referring now to FIG. 12, a block diagram illustrating hardware associated with the hardware data compressor 100 of FIG. 1 according to an alternate embodiment is shown. The hardware data compressor 100 of FIG. 12 includes a sorted list changed flag 1202 and a sorted list not changed counter 1204. Each time the sort engine 104 changes the sorted list 403 (e.g., at blocks 514 and 522), the sort engine 104 sets the sorted list changed flag 1202 and resets the sorted list not changed counter 1204. Each time the Huffman code table construction engine 106 successfully completes construction of the Huffman code tables using the sorted list 403 (e.g., at block 1004), it clears the sorted list changed flag 1202. If the Huffman code table construction engine 106 is in the process of constructing the Huffman code tables and the sort engine 104 changes the sorted list 403, the Huffman code table construction engine 106 stops constructing the Huffman code tables and begins constructing them again. The sort engine 104 increments the sorted list not changed counter 1204 each time the LZ77 engine 102 produces a token 212 that does not require a change to the sorted list 403. Use of the sorted list changed flag 1202 and sorted list not changed counter 1204 is described according to one embodiment with respect to FIG. 13.

Figure 13:
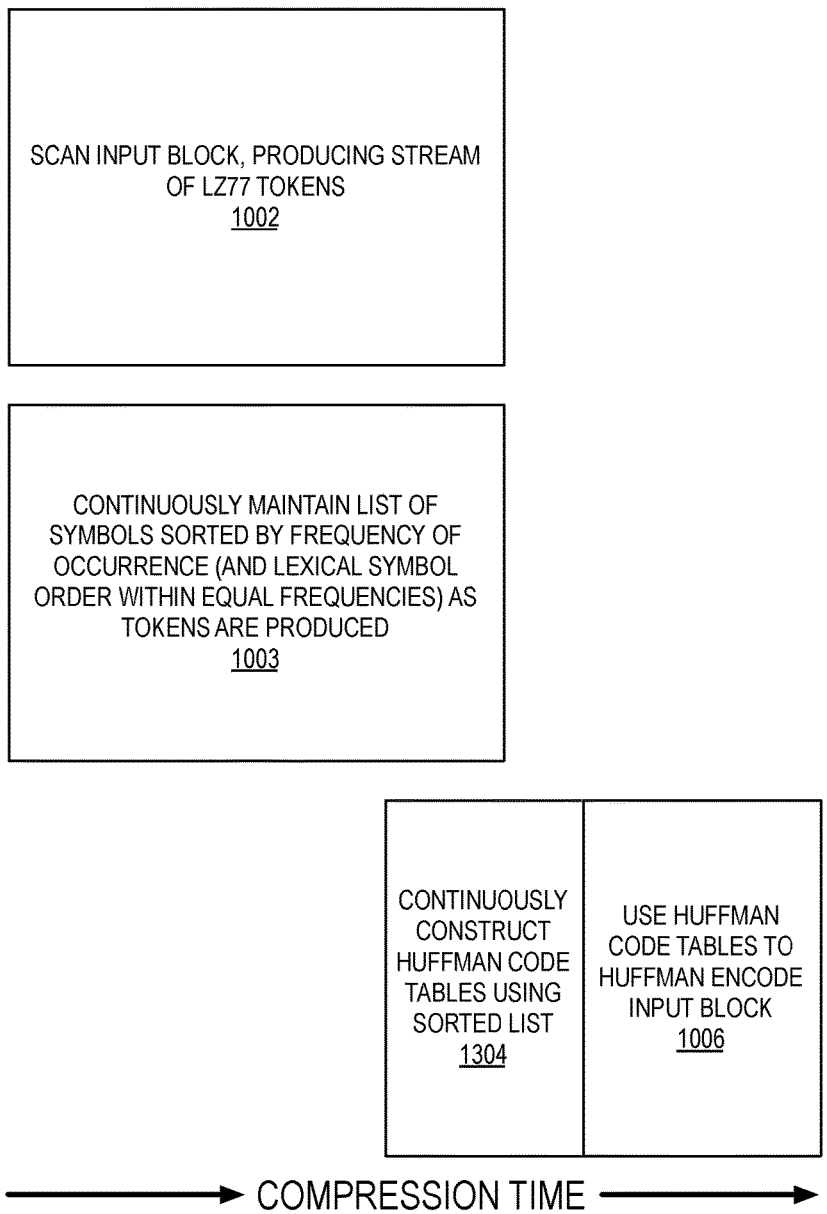
FIG. 13 is a timing diagram graphically illustrating components of the compression time according to an alternate embodiment.

Referring now to FIG. 13, a timing diagram graphically illustrating components of the compression time according to an alternate embodiment is shown. The embodiment of FIG. 13 is similar to the embodiment of FIG. 10; however, in the embodiment of FIG. 13, block 1004 is replaced by block 1304. At block 1304, the Huffman code table construction engine operates concurrently with the LZ77 compression engine 102 scan of the input block at block 1002 and concurrently with the sort engine 104 maintaining the sorted list 403 at block 1003 to assign Huffman codes 1108 to the symbol values 406 of the sorted list 403 so that the time required for the construction of the Huffman code tables using the sorted list 403 at block 1304 is largely overlapped with and hidden by the input block scan time at block 1002 and the maintenance of the sorted list time at block 1003, which reduces the total compression time even more. Preferably, the embodiment of FIG. 13 employs the sorted list changed flag 1202 and, optionally, the sorted list not changed counter 1204 of FIG. 12. That is, each time the sort engine 104 changes the sorted list 403 (e.g., at blocks 514 or 522), the sort engine 104 sets the sorted list changed flag 1202 and notifies the Huffman code table construction engine 106, which responsively begins constructing the Huffman code values 1108 using the symbol values 406 in the sorted list 403. If the Huffman code table construction engine 106 successfully completes constructing the Huffman code tables before the sort engine 104 changes the sorted list 403 again, the Huffman code table construction engine 106 clears the sorted list changed flag 1202. When the scan of the input block at block 1002 has completed, the Huffman encoding engine 108 begins Huffman encoding the input block at block 1006 once the sorted list changed flag 1202 is clear. In this manner, a portion—or in some cases all—of the time required to construct the Huffman code tables at block 1304 is overlapped with and hidden by the input block scan time at block 1002 and the maintenance of the sorted list time at block 1003.

In one embodiment, the Huffman code table construction engine 106 constructs the Huffman code values 1108 each time the sort engine 104 changes the sorted list 403. However, in an alternate embodiment, when the sort engine 104 changes the sorted list 403, the Huffman code table construction engine 106 begins constructing the Huffman code values 1108 only if the sorted list not changed counter 1204 indicates a predetermined number of tokens 212, which may be programmable, have been seen since the last time the sort engine 104 changed the sorted list 403. In this way, power consumption by the hardware data compressor 100 may be reduced and access congestion to the table memory 107 may be reduced since the Huffman code table construction engine 106 will perform the operation at block 1304 less frequently during the scan of the input block at 1002. Although an embodiment that employs the sorted list not changed counter 1204 to suppress the construction of the Huffman code tables has been described, other embodiments are contemplated that use different criteria. For example, the when the sort engine 104 changes the sorted list 403, the Huffman code table construction engine 106 begins constructing the Huffman code values 1108 only if a predetermined number of symbols have been seen since the last time the sort engine 104 changed the sorted list 403, rather than a predetermined number of tokens 212. For another example, the when the sort engine 104 changes the sorted list 403, the Huffman code table construction engine 106 begins constructing the Huffman code values 1108 only if a predetermined number of clock cycles have elapsed since the last time the sort engine 104 changed the sorted list 403, rather than a predetermined number of tokens 212.

It is noted that early in the scan of the input block, typically the sorted list 403 will be changed frequently, since the distribution of frequencies is likely to be relatively uniform. However, later in the scan of the input block, typically the sorted list 403 will be changed infrequently, since the distribution of frequencies is likely to be relatively non-uniform, as described above. Thus, in some cases the last construction of the Huffman code values 1108 by the Huffman code table construction engine 106 will begin well before the scan of the input block is completed, and in some cases the last construction of the Huffman code values 1108 will complete before the scan of the input block is completed, e.g., when the last N tokens 212 do not cause a change in the sorted list 403 and the time spent by the LZ77 engine 102 to scan the input block to produce the last N tokens 212 is at least as great as the time required by the Huffman code table construction engine 106 to construct the Huffman code tables from the sorted list 403.

It should be understood that although hardware data compressor embodiments have been described in which the sort engine maintains a list of symbols sorted by frequency of occurrence in a token stream concurrently produced by a compression engine that employs a lossless compression algorithm (e.g., LZ77), other embodiments are contemplated in which the sort engine maintains a list of symbols sorted by frequency of occurrence in a token stream concurrently produced by a compression engine that employs a lossy compression algorithm (JPEG, MPEG, MP3) whose output is subsequently encoded by an encoding engine that benefits from a sorted symbol list (e.g., Huffman encoding) in order to construct its code table.

It should be noted that sorting of the list of symbols according to the conventional method (i.e., not in the incremental manner concurrent with the input block scanning as described herein) is typically memory intensive. This may not be a problem for a software data compression program (e.g., gzip) that generally has access to a large amount of memory, e.g., system memory. However, it is undesirable for a hardware data compressor in which it is desirable to utilize a relatively small amount of memory, both for cost reasons and for performance reasons, since the larger the memory on the hardware data compressor the larger the access latency to the memory. Thus, the incremental concurrent maintenance of the sorted list with the input block scanning is particularly advantageous for a hardware data compressor embodiment.

"Dynamic-Prime" Huffman Coding

Figure 14A:
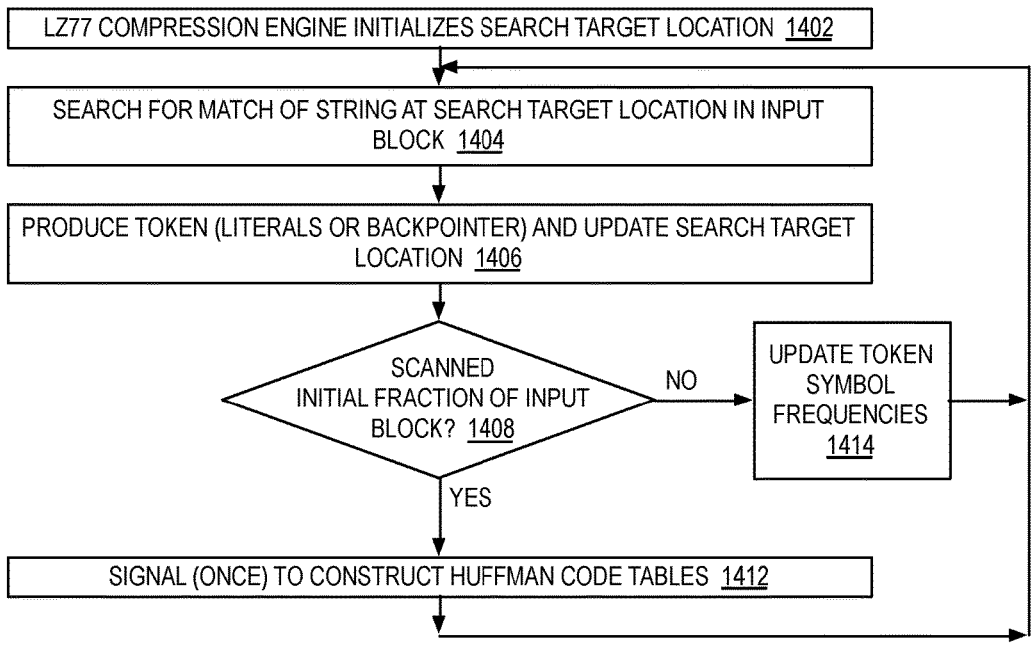
FIG. 14A is a flowchart illustrating operation of the LZ77 engine of FIG. 1 to perform data compression in conjunction with dynamic-prime Huffman encoding.
Figure 16:
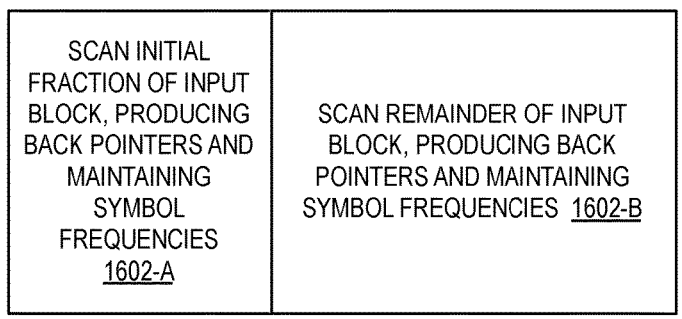
FIG. 16 is a timing diagram graphically illustrating components of the compression time associated with a DEFLATE-style input block compression according to dynamic-prime Huffman code table embodiments.
Figure 16:
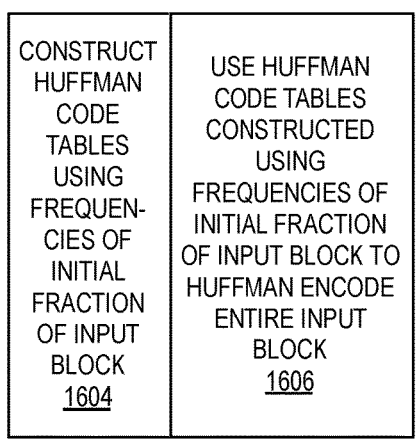

Referring now to FIG. 14A, a flowchart illustrating operation of the LZ77 engine 102 of FIG. 1 to perform data compression in conjunction with dynamic-prime Huffman encoding is shown. Preferably, the operation of the LZ77 engine 102 in FIG. 14A is performed in conjunction with the operation of the Huffman code table construction engine 106 according to FIG. 14B and in conjunction with the operation of the Huffman encoding engine 108 according to FIG. 14C such that significant portions of the three operations are performed concurrently to accomplish hardware data compression of an input block of characters, as illustrated in FIG. 16, for example. Flow begins at block 1402.

At block 1402, the LZ77 engine 102 initializes a current search target location within the input block. Preferably, the hardware data compressor 100 includes a register (not shown) for storing the value of the search target location. The current search target location is an index into the input block of characters. Preferably, the search target location is initialized to point to the second character of the input block. Flow proceeds to block 1404.

At block 1404, the LZ77 engine 102 searches for a match of a string that begins at the search target location in the input block. That is, the LZ77 engine 102 takes a string of characters beginning at the search target location in the input block—the target string—and searches earlier in the input block for a match of the target string. Generally speaking, the LZ77 engine 102 searches for a match of the longest string it can find earlier in the input block. However, the LZ77 engine 102 may limit the length of the string searched for in order to reduce the search time and/or to limit the maximum length of a back pointer. Additionally, the LZ77 engine 102 may limit how far back it searches from the current search target location in order to reduce the search time and/or to limit the maximum distance of a back pointer. The LZ77 engine 102 may employ various techniques for searching earlier in the input block for a match of a string at the current search target location, some of which are described herein, such as with respect to the dual hash table embodiments described below with respect to FIGS. 24 and 25. Flow proceeds to block 1406.

At block 1406, the LZ77 engine 102 produces a token 212. As described above, the token 212 is either a back pointer or literals from the input block. In one embodiment, producing a literal from the input block means simply leaving the literal in place in the input block memory 101 so it may be subsequently read from the input block memory 101 by the Huffman encoding engine 108 and Huffman encoded using the dynamic-prime Huffman code table. In one embodiment, as described above, the back pointers are written to the back pointer memory 105 and a flag in the memory 105 is set corresponding to the input block location of the character at the beginning of the replaced/matched target string to indicate the presence of a replacing back pointer. The LZ77 engine 102 also updates the search target location. Preferably, if the LZ77 engine 102 produces a back pointer, the LZ77 engine 102 increments the search target location by the length of the matching string; whereas, if the LZ77 engine 102 produces literals, the LZ77 engine 102 increments the search target location by the number of literals produced. In embodiments that include a sort engine 104, the sorted list 403 is also updated, as at block 316 of FIG. 3. Flow proceeds to decision block 1408.

At decision block 1408, the LZ77 engine 102 determines whether it has scanned an initial fraction of the input block of characters so that it can signal the construction of dynamic-prime Huffman code tables. The initial fraction of the input block may be determined in different ways. In one embodiment, the LZ77 engine 102 determines that it has scanned the initial fraction after it has scanned a predetermined number of input characters (e.g., 3,000 characters). In one embodiment, the LZ77 engine 102 determines that it has scanned the initial fraction after it has scanned a predetermined fraction of the input block size (e.g., the first one-tenth of the characters of the input block). In one embodiment, the LZ77 engine 102 determines that it has scanned the initial fraction when the total number of symbols of the symbol space that have been observed at least a first predetermined number of times (e.g., one, two, three) in the input block thus far is greater than a second predetermined value. For example, assume the first predetermined number is three, then each time the hardware data compressor 100 increments a frequency 402 to a value of three, it increments a counter that was initialized to zero, and when the counter reaches the second predetermined value (e.g., 85), the initial fraction has been scanned. The second predetermined value may be a predetermined percentage of the number of symbols in the symbol space (e.g., 33%). In one embodiment, the initial fraction of the input block is determined, preferably by the sort engine 104, based on occurrences of changes to the sorted list 403, such as described with respect to FIGS. 18 and 19. In one embodiment, the initial fraction may be user-specified, e.g., as an operand to a compression instruction to the hardware data compressor 100. It should be noted that, generally speaking, larger values of the initial fraction should be chosen for improved compression efficiency at the possible cost of compression speed and smaller values of the initial fraction should be chosen for improved compression speed at the possible cost of compression efficiency. If the LZ77 engine 102 has scanned the initial fraction of the input block, flow proceeds to block 1412; otherwise, flow proceeds to block 1414.

At block 1412, the LZ77 engine 102 signals the Huffman code table construction engine 106 to construct the Huffman code tables. That is, the initial fraction of the input block has been scanned such that the Huffman code tables may now be constructed (e.g., at block 1424 of FIG. 14B) so the Huffman encoding may begin (e.g., at block 1434 of FIG. 14C). Flow returns to block 1404 to search for a match at the updated value of the search target location. Although FIG. 14A appears to indicate the signaling to construct the Huffman code tables each time through the loop of blocks 1404, 1406, and 1408 once the initial fraction has been scanned, it should be understood that the signaling is only performed once.

At block 1414, the frequency 402 is updated for each of the symbols associated with the token 212 produced at block 1406. In one embodiment, the sort engine 104 increments the frequency 402 of each of the symbols. In another embodiment, the sort engine 104 is not present, and the LZ77 engine 102 increments the frequency 402 of each of the symbols. In yet another embodiment, the sort engine 104 is not present, and the LZ77 engine 102 produces the token 212 for provision to the Huffman code table construction engine 106, similar to the manner in which the LZ77 engine 102 produces the token 212 for provision to the sort engine 104 as described with respect to FIG. 2A, and the Huffman code table construction engine 106 increments the frequency 402 of each of the symbols. Flow returns to block 1404 to search for a match at the updated value of the search target location. It should be understood that flow ends and does not return to block 1404 from block 1412, 1414 or 1416 once the end of the block is reached (e.g., once an end of block character is encountered), and the operation according to FIG. 14A will be repeated for the next input block.

As described above, once the initial portion of the input block has been scanned, the frequencies 402 in the frequency table 401 are no longer updated. Advantageously, the hardware data compressor 102 stops updating the frequency table 401 while it scans the input block once the initial fraction of the input block has been scanned. This is advantageous because, by reducing the number of accesses to the table memory 107 to update the frequencies 402, it reduces the amount of power consumed and reduces contention for the table memory 107, which may improve performance because it may enable other engines to access the table memory 107 more quickly, particularly in an embodiment in which the ports to the table memory 107 are shared. Still further, it may enable a smaller design because it may facilitate use of a memory with fewer ports.

Figure 14B:
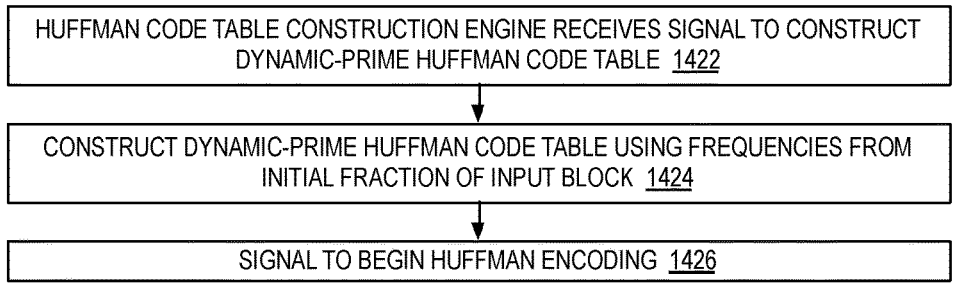
FIG. 14B is a flowchart illustrating operation of the Huffman code table construction engine of FIG. 1 to perform data compression in conjunction with dynamic-prime Huffman encoding.

Referring now to FIG. 14B, a flowchart illustrating operation of the Huffman code table construction engine 106 of FIG. 1 to perform data compression in conjunction with dynamic-prime Huffman encoding is shown. Flow begins at block 1422.

At block 1422, the Huffman code table construction engine 106 receives a signal to construct the Huffman code tables. In one embodiment, the LZ77 engine 102 signals the Huffman code table construction engine 106 to construct the Huffman code tables. In one embodiment, the sort engine 104 signals the Huffman code table construction engine 106 to construct the Huffman code tables. Flow proceeds to block 1424.

Figure 17A:
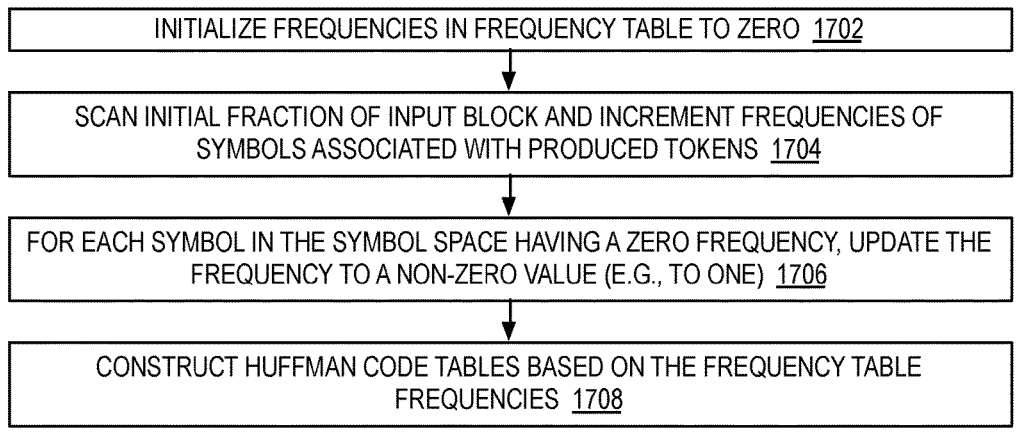
FIG. 17A is a flowchart illustrating operation of the hardware data compressor to construct dynamic-prime Huffman code tables according to one embodiment.
Figure 17B:
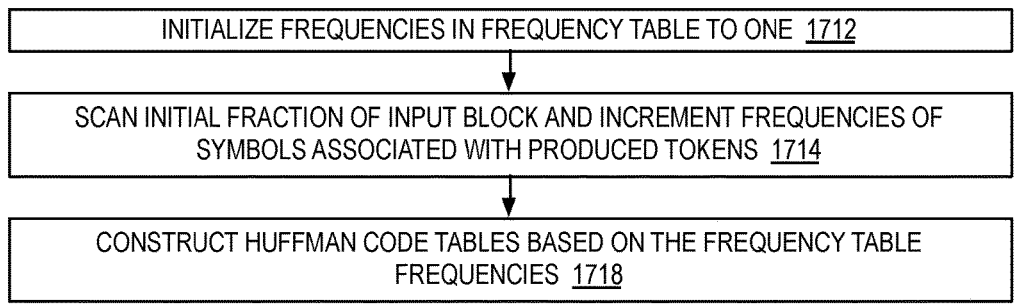
FIG. 17B is a flowchart illustrating operation of the hardware data compressor to construct dynamic-prime Huffman code tables according to one embodiment.
Figure 17C:
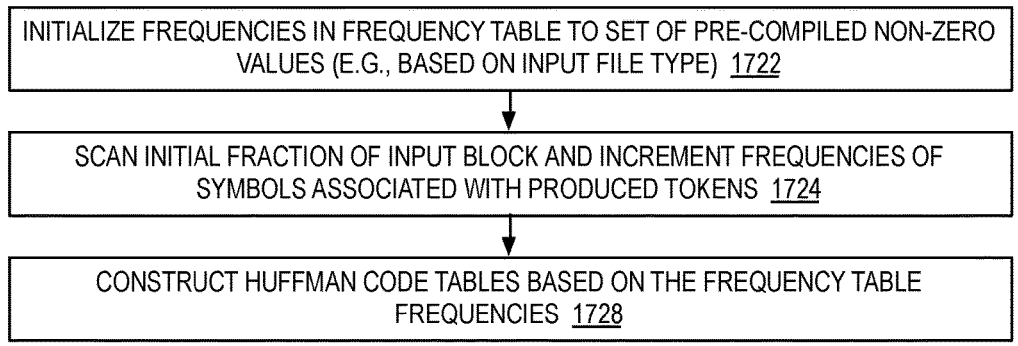
FIG. 17C is a flowchart illustrating operation of the hardware data compressor to construct dynamic-prime Huffman code tables according to one embodiment.

At block 1424, the Huffman code table construction engine 106 constructs the dynamic-prime Huffman code tables using the frequency table 401 with its frequency 402 values after the scan of only the initial fraction of the input block, i.e., at the time the Huffman code table construction engine 106 is signaled at block 1422. FIGS. 17A through 17C describe embodiments by which the dynamic-prime Huffman code tables are constructed. Flow proceeds to block 1426.

At block 1426, the Huffman code table construction engine 106 signals to the Huffman encoding engine 108 to begin Huffman encoding the input block. Flow ends at block 1426.

Figure 14C:
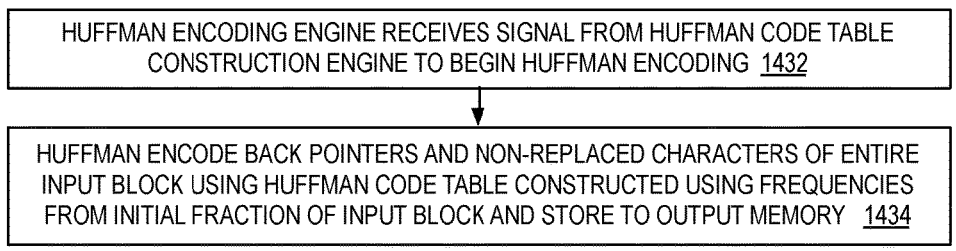
FIG. 14C is a flowchart illustrating operation of the Huffman encoding engine of FIG. 1 to perform data compression in conjunction with dynamic-prime Huffman encoding.

Referring now to FIG. 14C, a flowchart illustrating operation of the Huffman encoding engine 108 of FIG. 1 to perform data compression in conjunction with dynamic-prime Huffman encoding is shown. Flow begins at block 1432.

At block 1432, the Huffman encoding engine 108 receives the signal generated at block 1426 of FIG. 14B to begin Huffman encoding the input block. Flow proceeds to block 1434.

At block 1434, the Huffman encoding engine 108 encodes the entire input block using the Huffman code tables constructed at block 1424. That is, the Huffman encoding engine 108 Huffman encodes, using the Huffman code tables constructed at block 1424 based on the scan of only the initial fraction of the input block, the back pointers and non-replaced literals of the entire input block and stores the Huffman encoded output to the output memory 109 (as well as a Huffman-encoded version of the Huffman code tables). Flow ends at block 1434.

Figure 15:
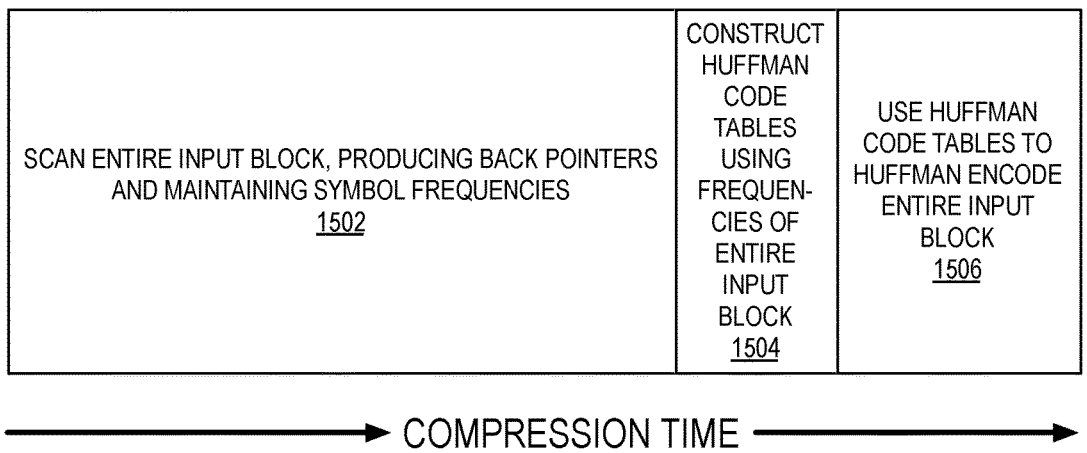
FIG. 15 is a timing diagram graphically illustrating components of the compression time associated with a DEFLATE-style input block compression in a conventional manner.

Referring now to FIG. 15, a timing diagram graphically illustrating components of the compression time associated with a DEFLATE-style input block compression in a conventional manner is shown. At the beginning of the compression time, at block 1502, the entire input block is scanned and a stream of LZ77 tokens is produced and a histogram of frequencies of occurrence of the symbols is kept. Once block 1502 is completed, at block 1504 the Huffman code tables are constructed using the symbol frequencies kept for the entire input block. Once block 1504 is completed, the Huffman code tables are used to Huffman encode the input block at block 1506, i.e., to Huffman encode the LZ77 token output stream. The operations associated with blocks 1502, 1504 and 1506 are performed sequentially and in order; consequently, the total compression time is the sum of the times associated with all of blocks 1502, 1504 and 1506, as shown.

Referring now to FIG. 16, a timing diagram graphically illustrating components of the compression time associated with a DEFLATE-style input block compression according to dynamic-prime Huffman code table embodiments described herein is shown. At the beginning of the compression time, at block 1602-A the LZ77 engine 102 scans an initial fraction of the input block of characters in the input block memory 101 and produces a stream of tokens 212 as described herein, e.g., repeatedly for each produced token 212 as described with respect to FIG. 14A (and blocks 302 through 308 of FIG. 3). After the initial fraction of the input block has been scanned, the signal is given to construct the Huffman code tables (e.g., according to block 1412 of FIG. 14A) and at block 1604 the Huffman code table construction engine 106 constructs the Huffman code tables using the frequencies 402 of the frequency table 401 maintained during the scan of the initial fraction of the input block at blocks 1602-A (e.g., according to block 1424 of FIG. 14B). Additionally, at block 1602-B the LZ77 engine 102 continues to scan the remainder of the input block of characters in the input block memory 101 and produce a stream of tokens 212.

Once the Huffman code table construction engine 106 has constructed the dynamic-prime Huffman code tables using the initial fraction frequencies at block 1604, at block 1606 the Huffman encoding engine 108 uses the dynamic-prime Huffman code tables to Huffman encode the entire input block (or more precisely, the replacement back pointers produced by the LZ77 engine 102 and the non-replaced literals of the input block) and writes the compressed output to the output memory 109. The time of the operation at blocks 1604 and 1606 can be advantageously hidden behind the time of the operation at block 1602-B primarily because dynamic-prime Huffman code tables are constructed using occurrence frequencies from a scan of only an initial fraction of the input block rather than from a scan of the entire input block as performed according to the conventional method. As may be observed by comparing FIG. 15 and FIG. 16, by using dynamic-prime Huffman code tables—that is, Huffman code tables constructed using occurrence frequencies from a scan of only an initial fraction of the input block—advantageously the total compression time is reduced compared to a conventional method.

Referring now to FIG. 17A, a flowchart illustrating operation of the hardware data compressor 100 to construct dynamic-prime Huffman code tables according to one embodiment is shown. Flow begins at block 1702.

At block 1702, the frequencies 402 of the frequency table 401 are initialized to zero, e.g., by the LZ77 engine 102, the sort engine 104 or the Huffman code table construction engine 106. Flow proceeds to block 1704.

At block 1704, the LZ77 engine 102 scans the initial fraction of the input block and the frequencies 402 of the symbols associated with the produced tokens are incremented (e.g., by the LZ77 engine 102, the sort engine 104, or the Huffman code table construction engine 106). Flow proceeds to block 1706.

At block 1706, at the initial portion of the construction of the Huffman code tables (e.g., at block 1604), for each symbol in the symbol space (e.g., symbol values 0 through 285 of the literal and length table 401 and symbol values 0 through 29 of the distance table 401) that has a zero value of its frequency 402, the Huffman code table construction engine 106 (or the sort engine 104 in an alternate embodiment) replaces the zero value frequency with a non-zero value. Preferably, the non-zero value is a small value, e.g., the value one. This is so that when the Huffman code tables are constructed, a Huffman code will exist for each symbol value in the symbol space. This is necessary because, as discussed above, a symbol that did not appear in the scan of the initial fraction of the input block (e.g., at block 1602-A) may appear in the scan of the remainder of the input block (e.g., at block 1602-B), and the Huffman encoding engine 108 will need a Huffman code value for the symbol (e.g., at block 1606) in the dynamic-prime Huffman code tables when it Huffman encodes the input block. Flow proceeds to block 1708.

At block 1708, the Huffman code table construction engine 106 constructs the Huffman code tables using the frequency table 401 frequencies 402 created according to blocks 1702 through 1706. Importantly, the constructed dynamic-prime Huffman code tables will include a Huffman code value for each symbol in the symbol space since each symbol has a non-zero frequency 402 value. As described above, preferably the Huffman code table construction engine 106 constructs canonical Huffman code tables. Flow ends at block 1708.

Referring now to FIG. 17B, a flowchart illustrating operation of the hardware data compressor 100 to construct dynamic-prime Huffman code tables according to one embodiment is shown. Flow begins at block 1712.

At block 1712, the frequencies 402 of the frequency table 401 are initialized to one, or to some other non-zero value. The result of initializing each frequency 402 to a non-zero value is that the Huffman code table construction engine 106 will assign a Huffman code to each symbol of the symbol space of the dynamic-prime Huffman code tables (e.g., constructed at block 1718). Flow proceeds to block 1714.

At block 1714, the LZ77 engine 102 scans the initial fraction of the input block and the frequencies 402 of the symbols associated with the produced tokens are incremented similar to the manner describe at block 1704 above. Flow proceeds to block 1718.

At block 1718, the Huffman code table construction engine 106 constructs the Huffman code tables using the frequency table 401 frequencies 402 created according to blocks 1712 through 1714. Importantly, the constructed dynamic-prime Huffman code tables will include a Huffman code value for each symbol in the symbol space since each symbol has a non-zero frequency 402 value as insured by the initialization at block 1712. Flow ends at block 1718.

Referring now to FIG. 17C, a flowchart illustrating operation of the hardware data compressor 100 to construct dynamic-prime Huffman code tables according to one embodiment is shown. Flow begins at block 1722.

At block 1722, the frequencies 402 of the frequency table 401 are initialized to a set of non-zero values specified in a pre-compiled set of non-zero values corresponding to the symbols of the symbol space. That is, rather than assigning the frequency 402 of each symbol to the same non-zero value as performed at block 1712 of FIG. 17B, at block 1722 each symbol's frequency is initialized to a tailored value for the particular symbol based on prior knowledge (i.e., prior to the commencement of compression of the input block) of the likelihood of the relative frequencies of the symbols of the symbol space. For example, it is generally known that the shorter back pointer lengths tend to occur very frequently. Therefore, the pre-compiled set of non-zero frequencies might include relatively large non-frequency values for the shorter back pointer lengths of the symbol space. For another example, assume the input block is ASCII character text. It is generally known there is a high likelihood the frequency of an ASCII "E" will be higher than the frequency of an ASCII "Z" in the input block. Therefore, the pre-compiled set of non-zero frequencies will include a larger non-zero frequency value for an ASCII "E" than for an ASCII "Z." In this manner, the initial non-zero values pre-bias the frequencies 402 based on an educated guess, rather than initializing every symbol with the same non-zero value. An advantage of this approach, as described above, is that in embodiments in which the sort engine 104 is employed such as according to FIGS. 2A through 8, the non-uniformity of the initial values of the frequencies 402 in the frequency table 401 may reduce the amount of sorting required, namely the amount of sorted list 403 symbol location swapping as at blocks 514 and 522 of FIG. 5. In one embodiment, multiple pre-compiled sets of non-zero values are available to the hardware data compressor 100, which selects one of the pre-compiled sets based on a criteria, e.g., on the type of the file from which the input block was taken (e.g., an image file, an audio file, a text file, a spreadsheet, a file produced by a word processor or presentation application, or other types of files). Flow proceeds to block 1724.

At block 1724, the LZ77 engine 102 scans the initial fraction of the input block and the frequencies 402 of the symbols associated with the produced tokens are incremented similar to the manner describe at block 1704 above. Flow proceeds to block 1728.

At block 1728, the Huffman code table construction engine 106 constructs the Huffman code tables using the frequency table 401 frequencies 402 created according to blocks 1722 through 1724. Importantly, the constructed dynamic-prime Huffman code tables will include a Huffman code value for each symbol in the symbol space since each symbol has a non-zero frequency 402 value as insured by the initialization at block 1722. Flow ends at block 1728.

Figure 18:
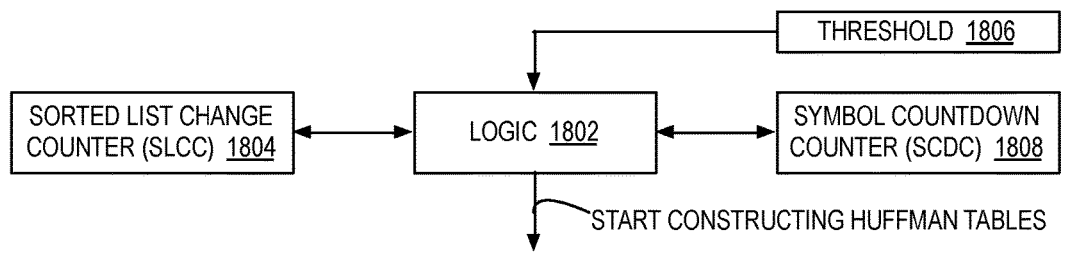
FIG. 18 is a block diagram illustrating hardware associated with the hardware data compressor of FIG. 1 according to one embodiment.

Referring now to FIG. 18, a block diagram illustrating hardware associated with the hardware data compressor 100 of FIG. 1 according to one embodiment is shown. The hardware data compressor 100 of FIG. 12 includes a sorted list change counter (SLCC) 1804, a threshold value 1806, a symbol countdown counter (SCDC) 1808 and logic 1802 to which each is connected. The threshold 1806 may be a programmable register. The SLCC 1804 indicates a count of the number of times the sorted list 403 was changed (e.g., at block 514 or block 522) since the last reset of the SLCC 1804. The SCDC 1808 is loaded with a predetermined value and counts down each time the frequency 402 of a symbol is incremented (e.g., at block 1414). When the SCDC 1808 counts down to zero, if the SLCC 1804 is less than the threshold 1806 value, the logic 1802 signals to construct the Huffman code tables and otherwise the SCDC 1808 is loaded again with the predetermined value, as described in more detail with respect to FIG. 19. Preferably, the hardware of FIG. 18 is included in the sort engine 104, and rather than the LZ77 engine 102 (e.g., at block 1412 of FIG. 14A), the sort engine 104 signals the Huffman code table construction engine 106 to construct the Huffman code tables (e.g., at block 1916 of FIG. 19). In one embodiment, the counter 1808 counts down each time a token 212 is produced, rather than each time a symbol frequency 402 is incremented. In one embodiment, the counter 1808 counts down each clock cycle, rather than each time a symbol frequency 402 is incremented.

Figure 19:
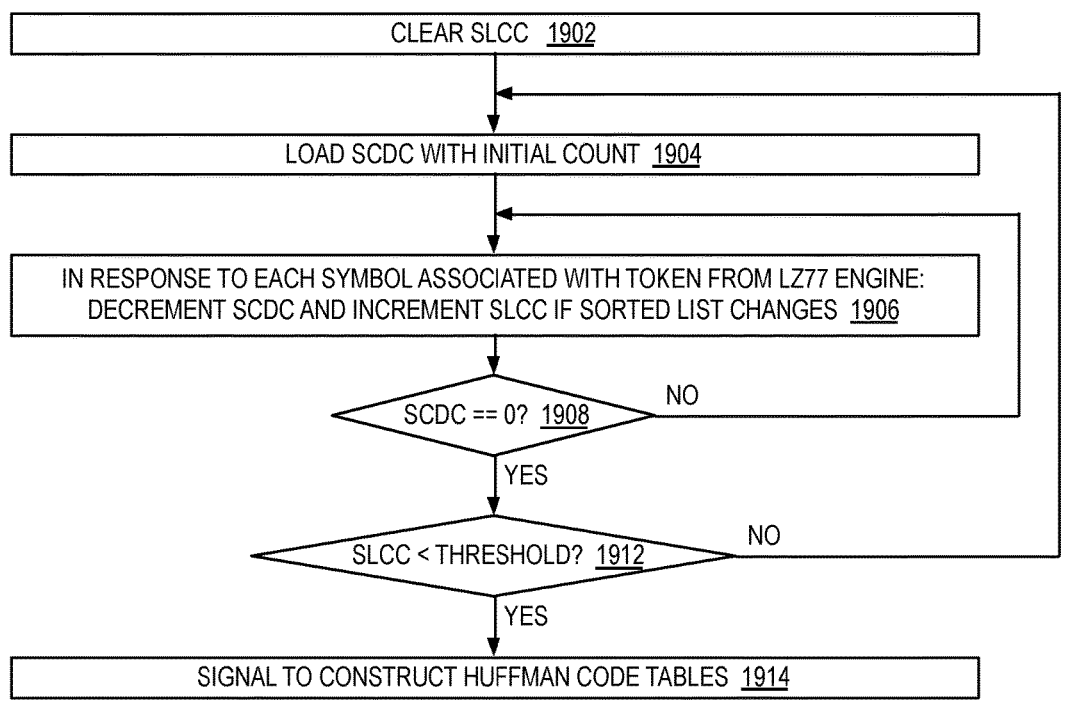
FIG. 19 is a flowchart illustrating operation of the sort engine to signal construction of the Huffman code tables.

Referring now to FIG. 19, a flowchart illustrating operation of the sort engine 104 to signal construction of the Huffman code tables is shown. Flow begins at block 1902.

At block 1902, the sort engine 104 initializes the SLCC 1804 of FIG. 18 to zero. Flow proceeds to block 1904.

At block 1904, the sort engine 104 loads the SCDC 1808 with an initial count, or predetermined value, (e.g., 100). Flow proceeds to block 1906.

At block 1906, the sort engine 104 receives a token 212 from the LZ77 engine 102 and, in response to each symbol associated with the token 212, decrements the SCDC 1808. Also, if a change in the sorted list 403 was required based on a symbol associated with the token 212, the sort engine 104 increments the SLCC 1804. Flow proceeds to decision block 1908.

At decision block 1908, the logic 1802 determines whether the SCDC 1808 value has reached zero. If so, flow proceeds to decision block 1912; otherwise, flow returns to block 1906 to wait for the next token 212.

At decision block 1912, the logic 1802 determines whether the SLCC 1804 is less than the threshold 1806 value. If so, flow proceeds to block 1914; otherwise, flow returns to block 1904.

At block 1914, the logic 1802 signals the Huffman code table construction engine 106 to construct the Huffman code tables. In one embodiment, the sort engine 104 does not signal to construct the Huffman code tables unless at least a minimum number of characters of the input block have been scanned (e.g., 500 or 5%). Flow ends at block 1914.

Figure 20:
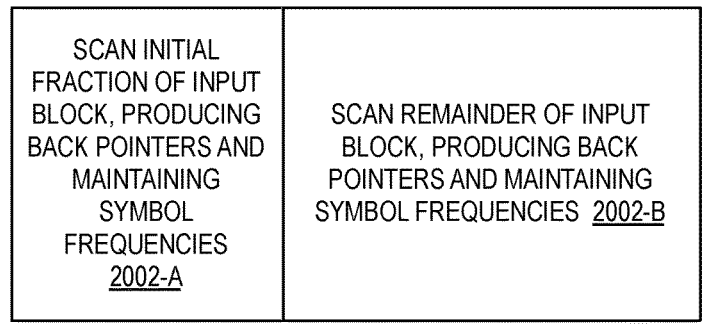
FIG. 20 is a timing diagram graphically illustrating components of the compression time associated with a DEFLATE-style input block compression according to an alternate embodiment.
Figure 20:
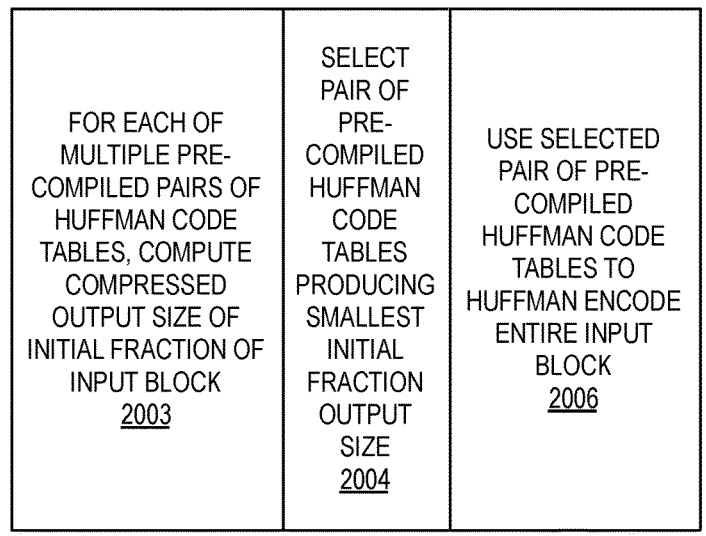

Referring now to FIG. 20, a timing diagram graphically illustrating components of the compression time associated with a DEFLATE-style input block compression according to an alternate embodiment is shown. As may be observed from the description of FIGS. 14A through 19 above, by beginning to Huffman encode the input block after only an initial fraction of the input block has been scanned, the total compression time may advantageously be reduced. In the alternate embodiment of FIG. 20, rather than using a dynamic-prime Huffman code table constructed using frequencies maintained from the input block initial fraction scan, the hardware data compressor 100 selects one of multiple pre-compiled Huffman code tables to begin Huffman encoding the input block after only an initial scan of the input block has been performed in order to enjoy the benefits of overlapping the Huffman encoding time with the time to scan the remainder of the input block. In this embodiment, during the scan of the initial fraction of the input block, for each of the pre-compiled Huffman code tables the hardware data compressor 100 keeps track of the size of the compressed output generated using the pre-compiled Huffman code table. The hardware data compressor 100 then selects the pre-compiled Huffman code table that compressed the initial fraction to the smallest output and uses the selected pre-compiled Huffman code table to Huffman encode the entire input block.

At the beginning of the compression time, at block 2002-A the LZ77 engine 102 scans an initial fraction of the input block of characters in the input block memory 101 and produces a stream of tokens 212 as described herein. As the initial fraction of the input block is scanned, at block 2003 the hardware data compressor 100 uses each of multiple pre-compiled pairs of Huffman code tables (e.g., literal/length table and distance table) to compute (but not generate) the size of the output that would be generated using the pre-compiled pair of Huffman code tables to Huffman encode the initial fraction of the input block. Additionally, at block 2002-B the LZ77 engine 102 continues to scan the remainder of the input block of characters in the input block memory 101 and produce a stream of tokens 212.

After the initial fraction of the input block has been scanned, at block 2004 the hardware data compressor 100 selects one of the pairs of the pre-compiled Huffman code tables. Then, at block 2006 the Huffman encoding engine 108 uses the selected pre-compiled pair of Huffman code tables to Huffman encode the entire input block and writes the compressed output to the output memory 109. The time of the operation at blocks 2004 and 2006 can be advantageously hidden behind the time of the operation at block 2002-B, as shown, to advantageously reduce the total compression time.

The embodiment of FIG. 20 has the potential advantage over the embodiments of FIGS. 14A through 19 of alleviating the Huffman code table construction engine 106. However, the dynamic-prime Huffman code table embodiments of FIGS. 14A through 19, although likely enjoying the same fast compression speed as the embodiment of FIG. 20 and have an additional advantage. The embodiments of FIGS. 14A through 19 are likely to produce a smaller output than the embodiment of FIG. 20 for input blocks for which there is no good pre-compiled Huffman code tables for the hardware data compressor 100 to choose from. For example, assume the characters of the input block are from a relatively esoteric language for which no pre-compiled Huffman code table exists, e.g., Hungarian Unicode. In this case, the dynamic-prime Huffman code tables constructed according to the embodiments of FIGS. 14A through 19 are likely to produce a smaller output than a pre-compiled pair of Huffman code tables.

Figure 21:
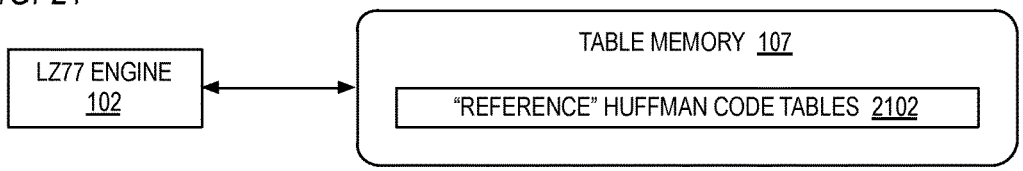
FIG. 21 is a block diagram illustrating a portion of the hardware data compressor of FIG. 1.

Pre-Huffman Encoding to Selectively Huffman Encode a Matched String or a Back Pointer Thereto Referring now to FIG. 21, a block diagram illustrating a portion of the hardware data compressor 100 of FIG. 1 is shown. The LZ77 engine 102 of FIG. 1 is in communication with the table memory 107 of FIG. 1. The table memory 107 holds "reference" Huffman code tables 2102. The reference Huffman code tables 2102 are used by the LZ77 engine 102 to "pre-Huffman encode" a token to determine its size in order to decide whether to produce the literals of a matched string or to produce a back pointer to the matched string as described in more detail with respect to FIGS. 22 and 23. The reference Huffman code tables 2102 may or may not be the same Huffman code tables used by the Huffman encoding engine 108 to subsequently Huffman encode the output stream of the LZ77 engine 102.

The LZ77 engine 102 includes logic that determines two sizes using the reference Huffman code tables 2102. The first size, referred to as size X, is the total number of bits of the Huffman codes that would be output if the literal symbols of the matched string were Huffman encoded using the reference Huffman code tables 2102. That is, the LZ77 engine 102 determines, using the reference Huffman code tables 2102, the number of bits of the Huffman code for each literal symbol and adds them to generate a sum, which is size X. Preferably, the logic of the LZ77 engine 102 looks up each of the literal symbols, preferably in parallel, in the reference literal Huffman code table 2102 to determine the number of bits (e.g., bit length 1112 of FIG. 11B) of the Huffman code for each and adds them together to generate size X. In one embodiment, the logic is configured to determine size X for a string of no greater than a predetermined number of characters, e.g., five, such that if the string is longer than the predetermined number of characters, it is assumed at decision block 2206 below that size X is larger than size Y. The second size, referred to as size Y, is the total number of bits of the Huffman codes that would be output if the back pointer to the matched string (assuming there is one) were Huffman encoded using the reference Huffman code tables 2102. That is, the LZ77 engine 102 determines, using the reference Huffman code tables 2102, the number of bits (e.g., bit length 1112 of FIG. 11B) of the Huffman code for each of the length and the distance of the pointer, including the extra bits, and adds them to generate a sum, which is size Y. Preferably, the logic of the LZ77 engine 102 looks up each of the length and distance symbols in the reference length and distance Huffman code tables 2102, preferably in parallel, to determine the number of bits of the Huffman code for each and adds them together to generate size Y.

Figure 22:
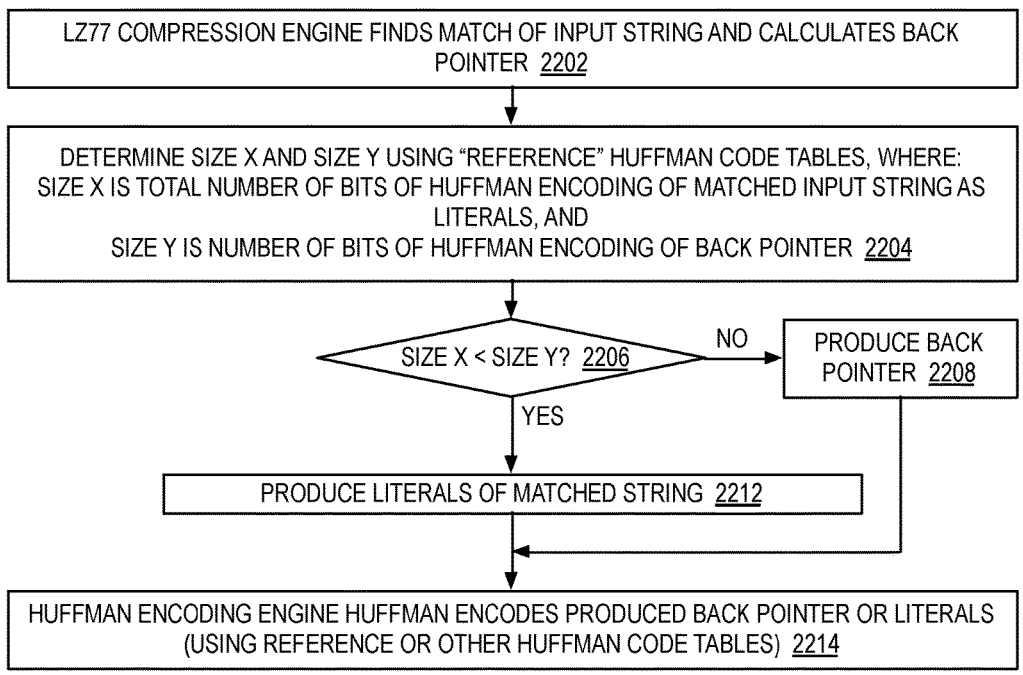
FIG. 22 is a flowchart illustrating operation of the hardware data compressor to compress data.

Referring now to FIG. 22, a flowchart illustrating operation of the hardware data compressor 100 to compress data is shown. Flow begins at block 2202.

At block 2202, the LZ77 engine 102 searches and finds a match of a string at the current search target location and calculates a back pointer from the current search target location to the matching string similar to the manner described above (e.g., with respect to block 302 or block 1404). Flow proceeds to block 2204.

At block 2204, the LZ77 engine 102 determines size X and size Y, as described above with respect to FIG. 21. That is, the LZ77 engine 102 pre-Huffman encodes both the literals and the back pointer to determine their respective Huffman-encoded sizes in terms of number of bits. Flow proceeds to decision block 2206.

At decision block 2206, the LZ77 engine 102 determines whether size X is less than size Y. If so, flow proceeds to block 2212; otherwise, flow proceeds to block 2208.

At block 2208, the LZ77 engine 102 produces the back pointer calculated at block 2202. That is, the LZ77 engine 102 outputs the back pointer (e.g., as at block 306 or block 1406) for subsequent Huffman encoding by the Huffman encoding engine 108. Flow proceeds to block 2214.

At block 2212, the LZ77 engine 102 produces the literals of the matched string. That is, the LZ77 engine 102 outputs an indication of the literals (e.g., as at block 306 or block 1406) for subsequent Huffman encoding by the Huffman encoding engine 108. Flow proceeds to block 2214.

At block 2214, the Huffman encoding engine 108 Huffman encodes the output produced at block 2208 or block 2212, i.e., the back pointer or the literals of the matched string. In one embodiment, the Huffman encoding engine 108 Huffman encodes the back pointer or literals using different Huffman code tables than the reference Huffman code tables 2102. For example, the Huffman code tables used by the Huffman encoding engine 108 to Huffman encode the input block (e.g., as at blocks 1006, 1434, 1606 or 2006) may be Huffman code tables constructed (e.g., see FIG. 16) or selected (e.g., See FIG. 20) after an initial fraction of the input block has been scanned such that during the scan of the initial fraction of the input block reference Huffman code tables 2102 must be used to compute size X and size Y. That is, the reference Huffman code tables 2102 must be known at the time the optimization performed according to blocks 2202 through 2212 of FIG. 22 are performed. Even if different Huffman code tables are used to calculate size X and size Y than are ultimately used to Huffman encode the input block, the operation according to FIG. 22 may still improve the compression ratio, i.e., reduce the size of the output over a conventional method that does not use the operation according to FIG. 22. Flow ends at block 2214.

Preferably, the pre-Huffman encoding operation according to FIG. 22 is performed for each token 212 produced by the LZ77 engine 102 for the scan of the entire input block of characters. However, as discussed below, in some embodiments the pre-Huffman encoding may be performed for the tokens 212 produced for only a portion of the scan of the input block, e.g., in the case of the use of dynamic-prime Huffman code tables, such as the remainder of the input block after the initial fraction is scanned.

Figure 23A:
FIG. 23A is a flowchart illustrating operation of block of FIG. 22 according to one embodiment.

Referring now to FIG. 23A, a flowchart illustrating operation of block 2204 of FIG. 22 according to one embodiment is shown. Flow begins and ends at block 2302.

At block 2302, the LZ77 engine 102 determines the size X and size Y using pre-compiled Huffman code tables. The pre-compiled Huffman code tables are compiled before the hardware data compressor 100 begins to compress the input block of characters. For example, the pre-compiled Huffman code tables may be the fixed Huffman code tables specified by the DEFLATE Specification, the literal/length table of which is essentially reproduced below as Table 3 (changed are denoted in brackets). The DEFLATE Specification specifies that fixed Huffman code table distance codes 0-31 are represented by (fixed-length) 5-bit codes, with possible additional bits as shown in Table 2 above. Alternatively, the pre-compiled Huffman code tables may be Huffman code tables constructed based on symbol frequencies of a representative input block or a sample of representative input blocks. In one embodiment, the pre-compiled Huffman code tables include a Huffman code for every symbol in the symbol space. In an alternate embodiment, the Huffman code tables do not include a Huffman code for some symbols of the symbol space, for which symbols the LZ77 engine 102 does not calculate size X and size Y, does not perform the comparison at decision block 2206, and produces the back pointer at block 2208.

TABLE 3

| Lit [or length] Value | [Number of] Bits | [Huffman] Codes |
|---|---|---|
| 0-143 | 8 | 00110000 through 10111111 |
| 144-255 | 9 | 110010000 through 111111111 |
| 256-279 | 7 | 0000000 through 0010111 |
| 280-287 | 8 | 11000000 through 11000111 |

Figure 23B:
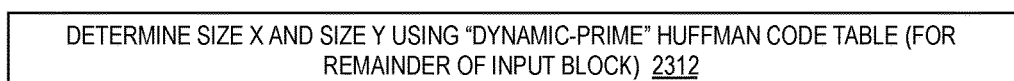
FIG. 23B is a flowchart illustrating operation of block of FIG. 22 according to an alternate embodiment.

Referring now to FIG. 23B, a flowchart illustrating operation of block 2204 of FIG. 22 according to an alternate embodiment is shown. Flow begins and ends at block 2312.

At block 2312, the LZ77 engine 102 determines the size X and size Y using dynamic-prime Huffman code tables, such as those constructed as described above with respect to FIGS. 14A through 20. In one embodiment, the operations of FIG. 22 are not performed for tokens 212 until the dynamic-prime Huffman code tables are constructed (e.g., at block 1604 of FIG. 16), and prior to that time the LZ77 compression engine 102 simply produces the back pointer as at block 2208, rather than calculating size X and size Y and being selective about producing the back pointer based on the relationship of size X and size Y. In an alternate embodiment, prior to the construction of the dynamic-prime Huffman code tables, reference Huffman code tables 2102 are used to perform step 2204 and after the construction of the dynamic-prime Huffman code tables, the dynamic-prime Huffman code tables are used to perform step 2204.

An advantage of the pre-Huffman encoding embodiments described herein may be explained as follows. According to some conventional methods, the LZ77 compression algorithm does not even consider searching for 3-byte string matches to replace with back pointers; whereas, in some cases the embodiments described herein will produce (e.g., at block 2208) some of the back pointers to 3-byte matched strings, thus accomplishing higher compression but at no speed loss to the extent the logic of the LZ77 engine 102 is configured to perform the pre-Huffman encoding of block 2204 and decision of block 2206 in parallel with the next scan of the input block for a matching string.

Multiple String Match Search Hash Tables Each Based on Different Hash Size

When performing LZ77-style compression, much time can be consumed searching backward in the input block to find a match of the search target string. One obvious way to search is to start at the beginning of the input block and move through the entire input block character-by-character (up to the current search point) and noting the location of the longest matching string. However, this is very slow.

A faster approach is to use hash tables. As described in more detail below, as the input block is scanned, hash tables are built up and used to reduce the locations in the input block searched. That is, the hash tables enable the searches to be focused on locations in the input block more likely to yield a match, i.e., more likely to be holding at least a small number of characters (e.g., three) of the search target. This is accomplished by taking advantage of the fact that the characters of the input block before the current search target location has already been seen before during the scan of the input block.

For example, the three characters at the current search target location are hashed according to a hashing algorithm to generate an index that indexes into an entry of the hash table that is the head of a hash chain of pointers to locations in the input block that previously hashed to the same index. This creates a relatively high likelihood (depending upon the hash algorithm, size of the hash table, and characteristics of the input block characters) that the three characters at the search target location are also at the location pointed to by the pointer. This is described in section 4 of the DEFLATE Specification.

It has been observed that, generally speaking, for at least some input files (e.g., the text of the book *Alice in Wonderland*, by Lewis Carroll), using 4-character hashing produces larger output files than 3-character hashing but produces them faster, other things being equal. The larger output files is explained by the fact that in more instances the opportunity to replace the literals of the input block with a back pointer are lost because some 3-character matches are forfeited.

The speed increase is potentially explained by a combination of factors. At least one of the factors is that shorter hash chain searches are expected, as follows. Assume 37 occurrences of the 3-character string "she" have appeared thus far in the scan of the input block. All 37 occurrences will be inserted into the same hash chain in the 3-character hash table. Assume some of the 37 occurrences of "she" are followed by different a character, for example, assume "shea" occurs 21 times, "shel" occurs 12 times, and "shed" occurs 4 times. Assume a 4-character hash algorithm that inserts these three different 4-character strings into three different hash chains of the 4-character hash table. This implies that the hash chain to be searched in the 4-character hash table for a match of a string beginning with "she" is likely to be shorter than the hash chain to be searched in the 3-character hash table, other things being equal, such as ignoring collisions with non-"she" strings that hash to the same hash chain as "she" in the 3-character hash table and ignoring collisions with non-"she"-followed-by-another-character strings that hash to the same three hash chains as "she" followed by "a," "1," and "d," respectively, in the 4-character hash table.

In an attempt to approach the speed of 4-character hashing and the output size of 3-character hashing, embodiments are described in which the hardware data compressor 100 maintains two hash tables—one hash table based on 3-character hashes and another hash table based on 4-character hashes. The 4-character hash table is used first to search for at least a 4-character a match, and the 3-character hash table is used to search for at least a 3-character match only if no 4-character match is found using the 4-character hash table. Since for some input blocks the hash chains in the 4-character hash table will be shorter, the searches of the shorter hash chains may be faster, in general. However, a 3-character hash table compression ratio may be approached because the 3-character hash table is used when necessary. It is noted that if a match is found using the 4-character hash table, it is unnecessary to search using the 3-character hash table because, generally speaking, any match found using the 4-character hash table will be at least as long as a match found using the 3-character hash table.

Again, the goal of 3-and-4-character hash tables is to be both faster than 3-character-only hashing and smaller than 4-character-only hashing. To illustrate, assume for a given input block, 90% of the time a 4-character or larger match is found, and only 10% of the time a 3-character match is found. In this case, the compressed output is typically smaller than using 4-character-only hashing because the compressor gets the compression ratio benefit of the 10% of the 3-character matches that a 4-character-only hashing embodiment would not get, but generates the output faster than a 3-character-only hashing embodiment because each search is statistically faster because the 4-character hash chains are statistically shorter.

Figure 24:
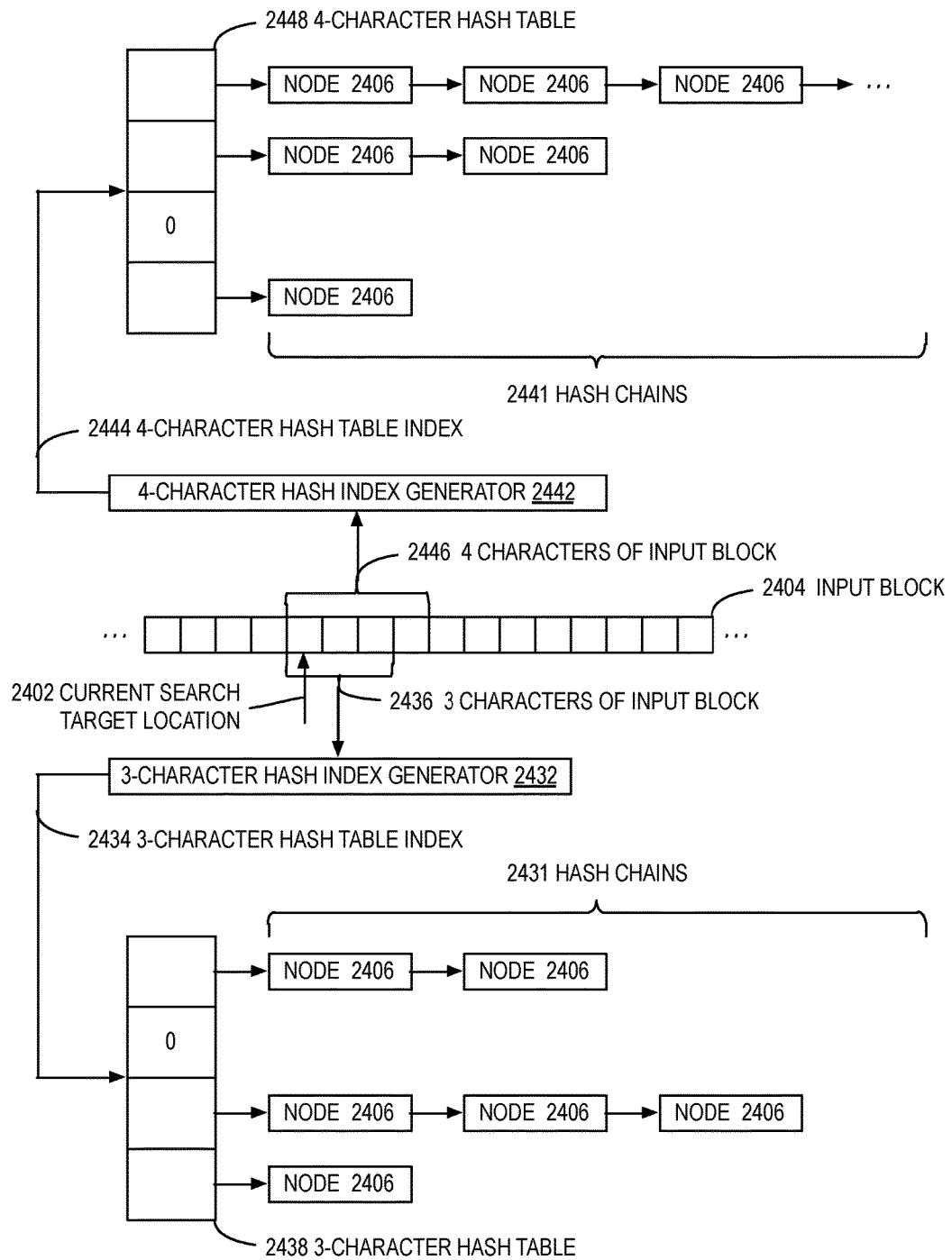
FIG. 24 is a block diagram illustrating a portion of the LZ77 engine of FIG. 1.

Referring now to FIG. 24, a block diagram illustrating a portion of the LZ77 engine 102 of FIG. 1 is shown. The LZ77 engine 102 includes a 4-character hash table 2448. The 4-character hash table 2448 is an array of entries indexed by a 4-character hash table index 2444 generated by a 4-character hash table index generator 2442 by hashing the four characters of the input block of characters 2404 at the current search target location 2402 using a four character hashing algorithm. An embodiment of the 4-character hashing algorithm is described below in Table 5. However, other embodiments are contemplated, and the hashing algorithm of Table 5 is provided as an illustrative example. In one embodiment, the hashing algorithm is input block type dependent, as described below with respect to FIGS. 39 through 41. It should be understood that the 4-character hash table index 2444 is an index into the 4-character hash table 2448 rather than a 4-character value. (The size of the index 2444 depends upon the size of the hash table 2448). Each entry of the 4-character hash table 2448 is the head of a hash chain 2441 of nodes 2406. Preferably, each hash chain 2441 is a linked list of nodes 2406, although other embodiments are contemplated, e.g., array, tree. Each node includes a pointer to the next node in the chain 2441. Each node also includes and a pointer to a location within the input block 2404 of a string of four characters behind the current search target location 2402 previously hashed to the index 2444 value of the entry in the 4-character hash table 2448 whose hash chain 2441 includes the node 2406. Population of the nodes 2406 is described in more detail below with respect to FIG. 25. As illustrated in FIG. 24, the length of each hash chain 2441 will vary as the input block 2404 scanned, and some hash chains 2441 may be empty. In one embodiment, the number of entries of the 4-character hash table 2448 is 16,384, although other embodiments are contemplated.

The LZ77 engine 102 also includes a 3-character hash table 2438. The 3-character hash table 2438 is an array of entries indexed by a 3-character hash table index 2434 generated by a 3-character hash table index generator 2432 by hashing the three characters of the input block of characters 2404 at the current search target location 2402 using a three character hashing algorithm. An embodiment of the 3-character hashing algorithm is described below in Table 4. However, other embodiments are contemplated, and the hashing algorithm of Table 4 is provided as an illustrative example. In one embodiment, the hashing algorithm is input block type dependent, as described below with respect to FIGS. 39 through 41. It should be understood that the 3-character hash table index 2434 is an index into the 3-character hash table 2438 rather than a 3-character value. (The size of the index 2434 depends upon the size of the hash table 2438). Each entry of the 3-character hash table 2438 is the head of a hash chain 2431 of nodes 2406. Preferably, each hash chain 2431 is a linked list of nodes 2406, although other embodiments are contemplated, e.g., array, tree. Each node includes a pointer to the next node in the chain 2431. Each node also includes and a pointer to a location within the input block 2404 of a string of three characters behind the current search target location 2402 previously hashed to the index 2434 value of the entry in the 3-character hash table 2438 whose hash chain 2431 includes the node 2406. Population of the nodes 2406 is described in more detail below with respect to FIG. 25. As illustrated in FIG. 24, the length of each hash chain 2431 will vary as the input block 2404 scanned, and some hash chains 2431 may be empty. In one embodiment, the number of entries of the 3-character hash table 2438 is 16,384, although other embodiments are contemplated.

In one embodiment, the 4-character hash table 2448 and the 3-character hash table 2438 are stored in the hashing memory 103 of FIG. 1. In another embodiment, the hardware data compressor 100 includes separate memories for the 4-character hash table 2448 and the 3-character hash table 2438. In one embodiment, the nodes 2406 of the hash chains 2441/2431 are stored in a separate memory from the entries of the hash tables 2438/2448.

Tables 4 and 5 below are examples of the 3-byte and 4-byte hashing algorithms, respectively.

TABLE 4 full3 = {byte0, byte1, byte2} ; //Concatenate input bytes together
mult3 = full3 * 8'hae; //Multiply by hexadecimal 0xAE
hash_value3 = 14'( mult3 ^ (mult3>>12)); //Logical right shift by 12, then XOR with original, finally use only first 14 bits of result.

Figure 25:
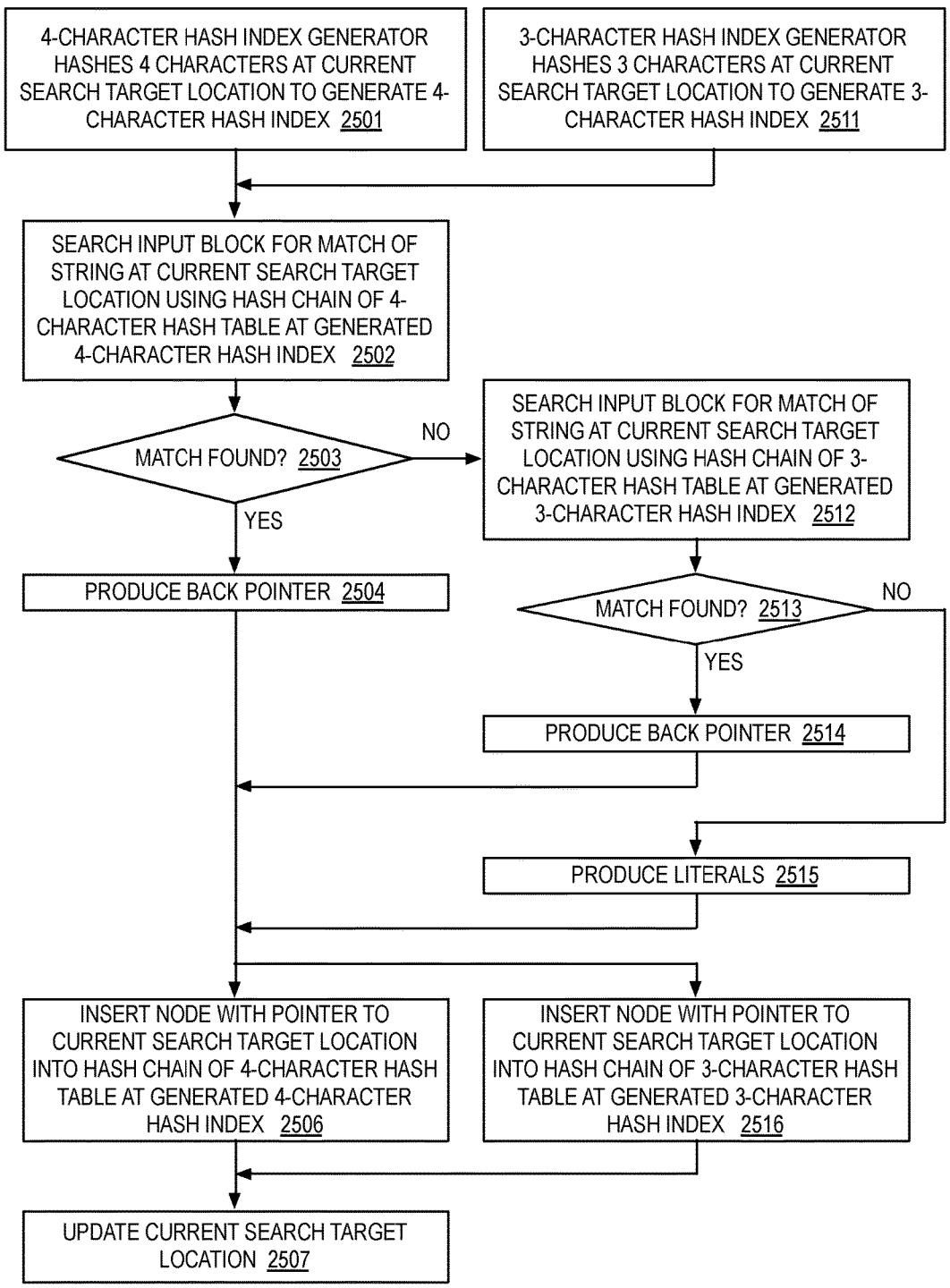
FIG. 25 is a flowchart illustrating operation of the LZ77 engine of FIG. 24.

TABLE 5 full4 = {byte0, byte1, byte2, byte3} ;
mult4 = full4 * 8'hae;
hash_value4 = 14'( mult4 ^ (mult4>>14) ^ (mult4>>28));

Referring now to FIG. 25, a flowchart illustrating operation of the LZ77 engine 102 of FIG. 24 is shown. Flow begins at block 2501 and 2511, preferably concurrently.

At block 2501, the 4-character hash index generator 2442 hashes the four characters at the current search target location 2402 in the input block 2404 to generate a 4-character hash table index 2444. Flow proceeds from block 2501 to block 2502.

At block 2511, the 3-character hash index generator 2432 hashes the three characters at the current search target location 2402 in the input block 2404 to generate a 3-character hash table index 2434. Flow proceeds from block 2511 to block 2502.

At block 2502, the LZ77 engine 102 searches the input block 2404 for a match of the string at the current search target location 2402 using the hash chain 2441 of the 4-character hash table 2448 at the index 2444 generated at block 2501. That is, the LZ77 engine 102 first searches for a match at the input block 2404 location pointed to by the node 2406 at the head of the indexed chain 2441, searches for a longer match at the input block 2404 location pointed to by the next node 2406 in the indexed chain 2441, searches for a longer match at the input block 2404 location pointed to by the next node 2406 in the indexed chain 2441, and so forth, until it reaches a search cutoff criterion (e.g., number of nodes 2406 used, percentage of hash chain 2441 used, or length of matched string exceeds a predetermined value) or the end of the chain 2441. Flow proceeds to decision block 2503.

At decision block 2503, if a match was found at block 2502, flow proceeds to block 2504; otherwise, flow proceeds to block 2512.

At block 2504, the LZ77 engine 102 produces a back pointer for the string match found. Flow proceeds to blocks 2506 and 2516, preferably concurrently.

At block 2506, the LZ77 engine 102 inserts a node 2406 into the hash chain 2441 at the index 2444 generated at block 2501 of the 4-character hash table 2448. The node 2406 points to the current search target location 2402. Preferably, the node 2406 is inserted at the head of the hash chain 2441 such that newer nodes 2406 are searched earlier than older nodes 2406, which tends to reduce back pointer distance values. However, an alternate embodiment is described below with respect to FIGS. 26 through 35 in which a different order of the nodes 2406 is maintained. Flow proceeds to block 2507.

At block 2507, the LZ77 engine 102 updates the current search target location 2402. Preferably, the location 2402 is advanced by three characters if the 3-character hash table 2438 is used and by four characters if the 4-character hash table 2448 is used. Flow ends at block 2507.

At block 2512, the LZ77 engine 102 searches the input block 2404 for a match of the string at the current search target location 2402 using the hash chain 2431 of the 3-character hash table 2438 at the index 2434 generated at block 2501. That is, the LZ77 engine 102 first searches for a match at the input block 2404 location pointed to by the node 2406 at the head of the indexed chain 2431, searches for a longer match at the input block 2404 location pointed to by the next node 2406 in the indexed chain 2431, searches for a longer match at the input block 2404 location pointed to by the next node 2406 in the indexed chain 2431, and so forth, until it reaches a search cutoff criterion (e.g., number of nodes 2406 used, percentage of hash chain 2431 used, or length of matched string exceeds a predetermined value) or the end of the chain 2431. In one embodiment, there is a search cutoff criterion for the 3-character hash table 2438 search, but not for the 4-character hash table 2448 search. Flow proceeds to decision block 2513.

At decision block 2513, if a match was found at block 2512, flow proceeds to block 2514; otherwise, flow proceeds to block 2515.

At block 2514, the LZ77 engine 102 produces a back pointer for the string match found. Flow proceeds to blocks 2506 and 2516, preferably concurrently.

At block 2515, the LZ77 engine 102 produces the literal symbols at the current search target location 2402. In one embodiment, the LZ77 engine 102 produces three literal symbols, whereas in another embodiment, the LZ77 engine 102 produces four literal symbols. In one embodiment, the number of literal symbols produced is programmable. Flow proceeds to blocks 2506 and 2516, preferably concurrently.

At block 2516, the LZ77 engine 102 inserts a node 2406 into the hash chain 2431 at the index 2434 generated at block 2511 of the 3-character hash table 2438. The node 2406 points to the current search target location 2402. Preferably, the node 2406 is inserted at the head of the hash chain 2431 such that newer nodes 2406 are searched earlier than older nodes 2406, which tends to reduce back pointer distance values. However, an alternate embodiment is described below with respect to FIGS. 26 through 35 in which a different order of the nodes 2406 is maintained. Flow proceeds to block 2507.

It should be understood that although embodiments are described with 3-character and 4-character hash tables, the embodiments are not limited to these. Rather, more generally, embodiments are contemplated in which M-character and N-character hash tables are used, in which M is greater than two and N is greater than M. Thus, for example, embodiments using 3-character and 5-character hash tables are contemplated; embodiments using 4-character and 6-character hash tables are contemplated; and so forth.

Furthermore, it should be understood that although embodiments are described with two hash tables, the embodiments are not limited to two hash tables. Rather, more generally, embodiments are contemplated with J hash tables, where J is greater than one. Thus, for example, embodiments using 3-character, 4-character and 6-character hash tables are contemplated; embodiments using 3-character, 5-character and 6-character hash tables are contemplated; and so forth. It is noted that having multiple hash tables generally requires more memory than a single hash table, which may be a desirable tradeoff to obtain faster compression.

Hash Chain Sorting Based on Node String Match Probabilities

As described above, when searching for a matching string to produce a back pointer, the LZ77 engine 102 may truncate its traversal of the indexed hash chain if it reaches a search cutoff criterion, i.e., it may not traverse the entire hash chain to search using all the nodes of the hash chain. For example, the LZ77 engine 102 may stop searching once it has found a matched string whose length exceeds a predetermined value, or once it has used a predetermined number of nodes to search for a matching string, or once it has used a predetermined percentage of nodes of the hash chain. This may increase compression speed, potentially at the cost of poorer compression ratio, since some potentially longer string matches may be forfeited.

Generally speaking, producing back pointers with larger lengths and shorter distances increases compression ratio. Larger lengths increases compression ratio because more characters of the input block are being replaced. Shorter distances increases compression ratio because since fewer extra bits are required in the Huffman codes for shorter distance values. The DEFLATE Specification favors back pointers with small distance values in order to improve compression by Huffman encoding, since fewer extra bits are required for shorter distances. The DEFLATE Specification implements this by inserting new nodes into the beginning of the hash chains. That is, this implementation orders nodes of a hash chain by age only. Although this may generally produce shorter distance back pointers, it may also produce shorter length back pointers, which is undesirable.

A motivation for a search cutoff criterion is that certain hash chains may become very long. For example, assume the input block is English text. It is highly likely that the hash chain to which the 3-character string "The" hashes will be relatively long because that string is likely to occur frequently in the input block. However, generally speaking, all locations of the input block beginning with "The" do not have the same probability of yielding a match with subsequent search targets. That is, there are likely many different locations in the input block that begin with "The" and that are followed by many different combinations of characters that could yield string matches, and each of those different combinations has a different likelihood of yielding a match. For example, nodes that points to "Thez" or "Theq" or "Thej" are generally less likely to yield a match than nodes that point to "Ther" or "Then". However, with the conventional implementation that orders the hash chain nodes strictly according to age, nodes that point to "Thez" and "Theq" and "Thej" may be relatively new, and therefore appear early in the hash chain—more specifically, occupy a position in the hash chain before the search cutoff point— and cause some nodes that point to "Ther" or "Then" to occupy a position in the hash chain after the search cutoff point. Consequently, the LZ77 engine 102 may never reach and use some nodes that point to "Ther" or "Then" if they are ordered in the hash chain beyond the search cutoff criterion.

Figure 26:
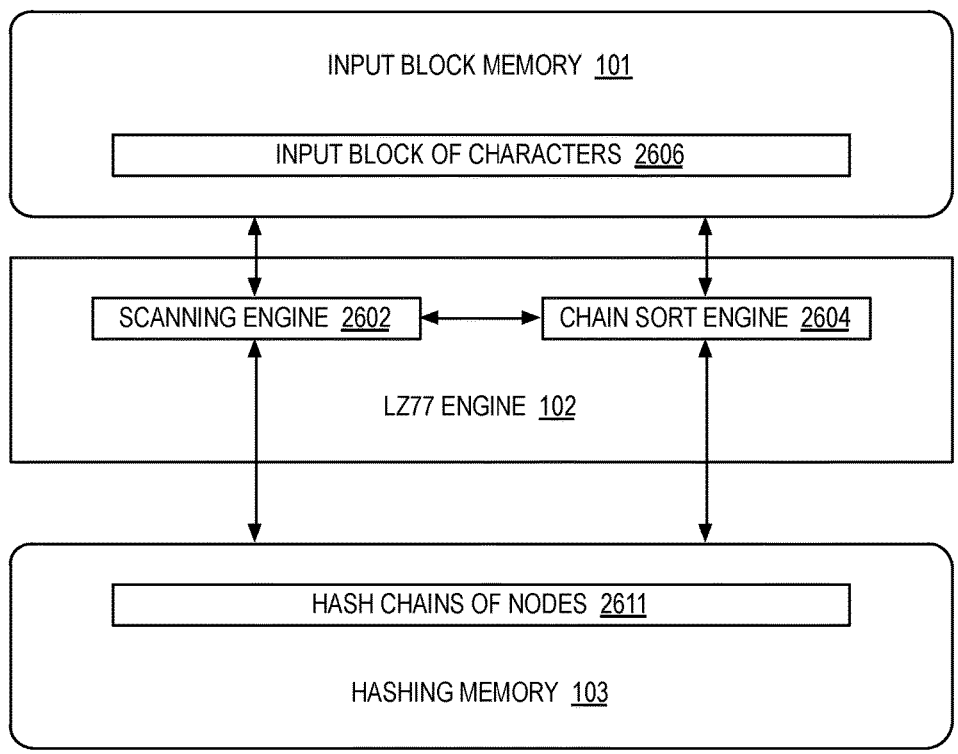
FIG. 26 is a block diagram illustrating portions of the hardware data compressor.

Referring now to FIG. 26, a block diagram illustrating portions of the hardware data compressor 100 according to an embodiment is shown. The hardware data compressor 100 includes the input block memory 101, LZ77 engine 102, and hashing memory 103 of FIG. 1. An input block of characters 2606 is stored in the input block memory 101. Hash chains 2611 (and hash tables, not shown, pointing to the hash chains 2611) are stored in the hashing memory 103. The hash chains 2611 are similar to those described above. However, the hash chains 2611 of FIG. 26 include nodes 2706 (described below with respect to FIG. 27) that are enhanced with a probability 2703. The LZ77 engine 102 advantageously order nodes 2706 within a hash chain 2611 according to their probability 2703 and according to age within equal probability 2703, rather than strictly according to age, as described in more detail below, to potentially improve the likelihood of finding a longer matched string.

The LZ77 engine 102 includes a scanning engine 2602 and a chain sort engine 2604 coupled to each other, and each of which is coupled to the input block memory 101 and to the hashing memory 103. In one embodiment, the chain sort engine 2604 snoops the scanning engine's 2602 connection to the hashing memory 103 to detect which hash chain 2611 (e.g., hash chain index) was accessed by the scanning engine 2602. In response, the chain sort engine 2604 sorts the hash chain 2611 that was updated by the scanning engine 2602, as described in more detail below.

Figure 27:
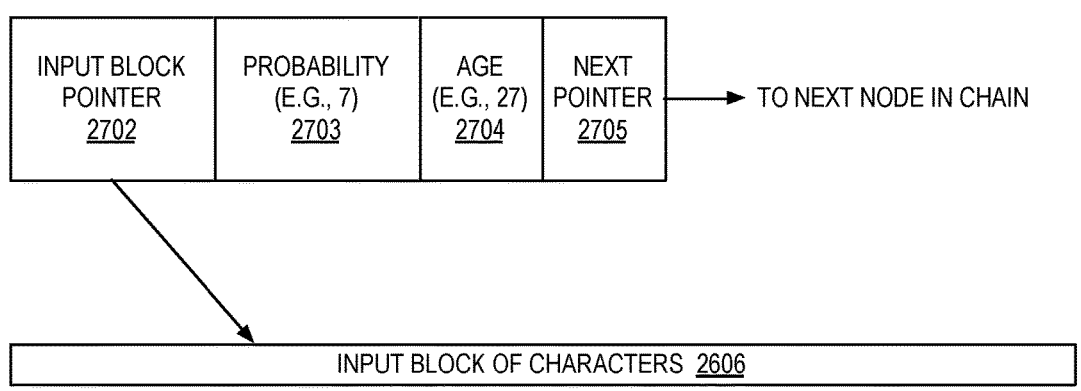
FIG. 27 is a block diagram illustrating a node of the hash chains of FIG. 26.

Referring now to FIG. 27, a block diagram illustrating a node 2706 of the hash chains 2611 of FIG. 26 is shown. The node 2706 includes an input block pointer 2702, a probability 2703, an age 2704, and a next pointer 2705. The next pointer 2705 points to the next node 2706 in the chain 2611. The input block pointer 2702 points to a location in the input block of characters 2606 of FIG. 26 of a character that, along with adjacent characters (e.g., a 3-character string), was hashed to generate an index into the hash table, as described at block 2802 of FIG. 28, for example. The age 2704 indicates how recently the node 2706 was created with respect to other nodes 2706 of the hash table. In one embodiment, a next age value is maintained in a counter, initialized to zero when the LZ77 engine 102 begins its scan of the input block, that is incremented each time a new node 2706 is created. In this sense, the age 2704 is akin to a serial number. The probability 2703 is a relative indication of the likelihood that a back pointer to a matching string that begins with the character pointed to by the input block pointer 2702 will be produced by the LZ77 engine 102. The chain sort engine 2604 uses the probability 2703 to order the nodes 2706 in a hash chain 2611 to potentially advantageously increase the likelihood of finding a more optimally matching string. Below are described a dynamic probability embodiment and a static probability embodiment. Furthermore, it should be understood that static probability embodiments may be employed to provide an initial value of the probability 2703 of a node 2706, which may then be updated according to a dynamic probability embodiment.

Figure 28:
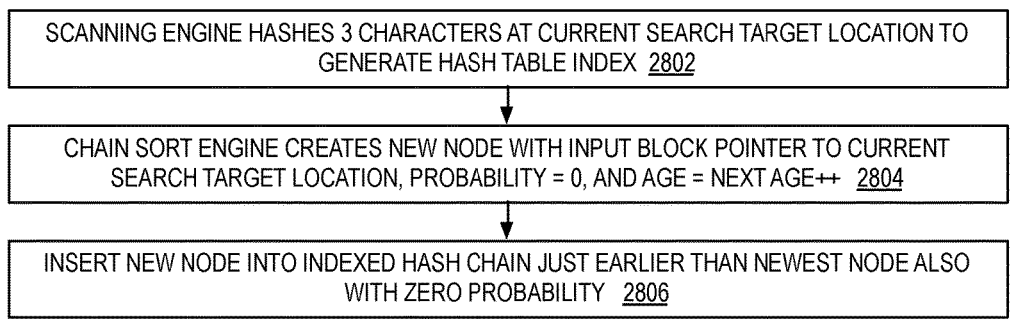
FIG. 28 is a flowchart illustrating operation of the hardware data compressor of FIG. 26 to insert a new node into a hash chain according to a dynamic node probability embodiment.

Referring now to FIG. 28, a flowchart illustrating operation of the hardware data compressor 100 of FIG. 26 to insert a new node into a hash chain according to a dynamic node probability embodiment is shown. Flow begins at block 2802.

At block 2802, the scanning engine 2602 hashes 3 characters at the current search target location to generate a hash table index. Other embodiments are contemplated in which a different number of characters are hashed, such as described above with respect to FIGS. 24 and 25. Flow proceeds to block 2804.

At block 2804, the chain sort engine 2604 creates a new node 2706 and populates the input block pointer 2702 with the current search target location, populates the probability 2703 with a value of zero, and populates the age 2704 with the current value of the next age register, and then increments the next age register. Preferably, the scanning engine 2602 provides to the chain sort engine 2604 the information needed to create the new node 2706, such as the current search target location. In an alternate embodiment, the scanning engine 2602 creates the new node 2706 and notifies the chain sort engine 2604. Flow proceeds to block 2806.

At block 2806, the chain sort engine 2604 inserts the new node 2706 into the hash chain 2611 at the hash table index generated at block 2802. Preferably, the chain sort engine 2604 finds the earliest (i.e., closest to the head) node 2706 having a zero probability 2703, referred to here as node X; populates the next pointer 2705 of the new node 2706 to point to node X; and updates the next pointer 2705 of the node 2706 that was pointing to node X (which could be the head pointer in the case that node X was at the head of the chain 2611) to point to the new node 2706. In an alternate embodiment, the scanning engine 2602 inserts the new node at the head of the hash chain 2611 and notifies the chain sort engine 2604 that it needs to sort the hash chain 2611, i.e., to place the new node 2706 in its proper location in the hash chain 2611. Flow ends at block 2806.

Figure 29:
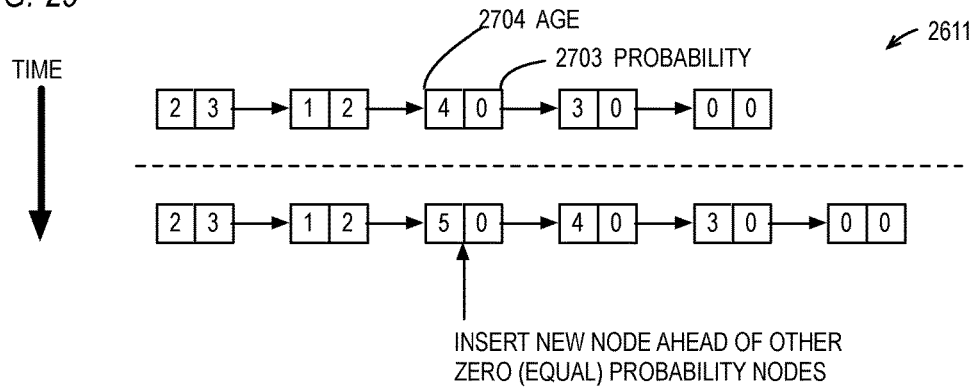
FIG. 29 is a timing diagram illustrating, by example, operation of the hardware data compressor of FIG. 26 according to FIG. 28.

Referring now to FIG. 29, a timing diagram illustrating, by example, operation of the hardware data compressor 100 of FIG. 26 according to FIG. 28 is shown. In FIG. 29, time flows downward, and nodes 2706 are shown with their age 2704 and probability 2703 values. The input block pointers 2702 are not shown, although an arrow from each node 2706 shows the node to which its next pointer 2705 points. In the first row, at a first time, a hash chain 2611 includes five nodes. At the head of the chain 2611, is a node 2706 with age 2704 value of 2 and probability 2703 value of 3, followed by a node 2706 with age 2704 value of 1 and probability 2703 value of 2, followed by a node 2706 with age 2704 value of 4 and probability 2703 value of 0, followed by a node 2706 with age 2704 value of 3 and probability 2703 value of 0, followed by a last node 2706 with age 2704 value of 0 and probability 2703 value of 0.

At a second time after the first time, a new node 2706 is created (e.g., as at block 2804) with age 2704 value of 5 and probability 2703 value of 0. The new node 2706 is inserted (e.g., as at block 2806 of FIG. 28) between the node 2706 of age 2704 value of 1 and the node 2706 of age 2704 value of 4, because the node 2706 of age 2704 value of 4 was the earliest node 2706 in the chain 2611 having a zero probability 2703 value.

Figure 30:
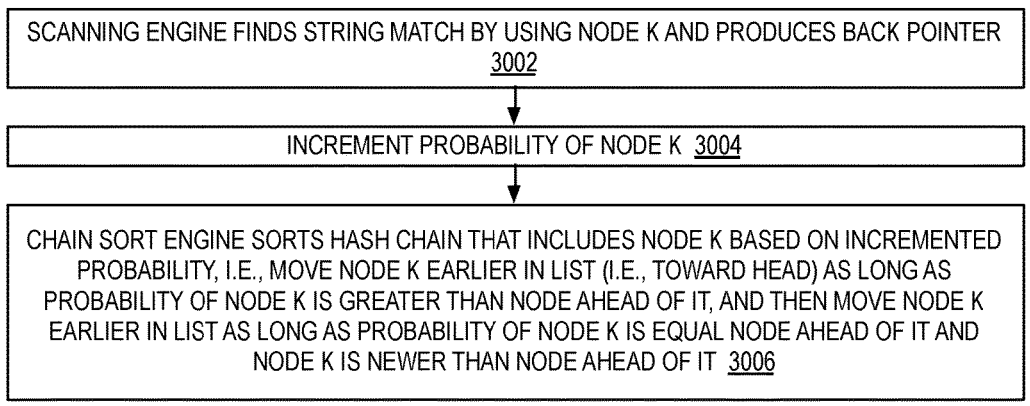
FIG. 30 is a flowchart illustrating operation of the hardware data compressor of FIG. 26 sort a hash chain according to a dynamic node probability embodiment.

Referring now to FIG. 30, a flowchart illustrating operation of the hardware data compressor 100 of FIG. 26 sort a hash chain according to a dynamic node probability embodiment is shown. Flow begins at block 3002.

At block 3002, the scanning engine 2602 finds a matching string of characters in the input block 2606 that begins at a location pointed to by the input block pointer 2702 of a node 2706, referred to here as node K, in the hash chain 2611 indexed by the index generated at block 2802. That is, the matching string matches a string of characters in the input block 2606 that begins with the character pointed to by the current search target location. In response, the scanning engine 2602 produces a back pointer to the matching string, i.e., a length and distance ordered pair. Preferably, the matching string is considered by the LZ77 engine 102 to be the best match under given restrictions, e.g., the distance of the back pointer is no greater than a predetermined threshold, or the length is the longest found given the cutoff criteria, if any. Flow proceeds to block 3004.

At block 3004, the scanning engine 2602 increments the probability 2703 of node K. In an alternate embodiment, the chain sort engine 2604 increments the probability 2703 in response to the scanning engine 2602 providing the needed information to the chain sort engine 2604, e.g., the location of node K. Flow proceeds to block 3006.

At block 3006, the chain sort engine 2604 sorts the hash chain 2611 that includes node K based on the incremented probability 2703. More specifically, the chain sort engine 2604 moves node K earlier in the hash chain 2611 (i.e., towards the head of the hash chain 2611) as long as the probability 2703 of node K is greater than the node 2706 ahead of it in the hash chain 2611. Then, the chain sort engine 2604 moves node K earlier in the hash chain 2611 as long as the probability 2703 of node K is equal the node 2706 ahead of it in the hash chain 2611 and the age 2704 of node K is newer than the node 2706 ahead of it. Note that in the embodiment that increments the next age 2704 value, if a first node 2706 has an age 2704 value larger than the age 2704 value of a second node 2706, the first node 2706 is younger/newer than the second node 2706. Flow ends at block 3006.

Figure 31:
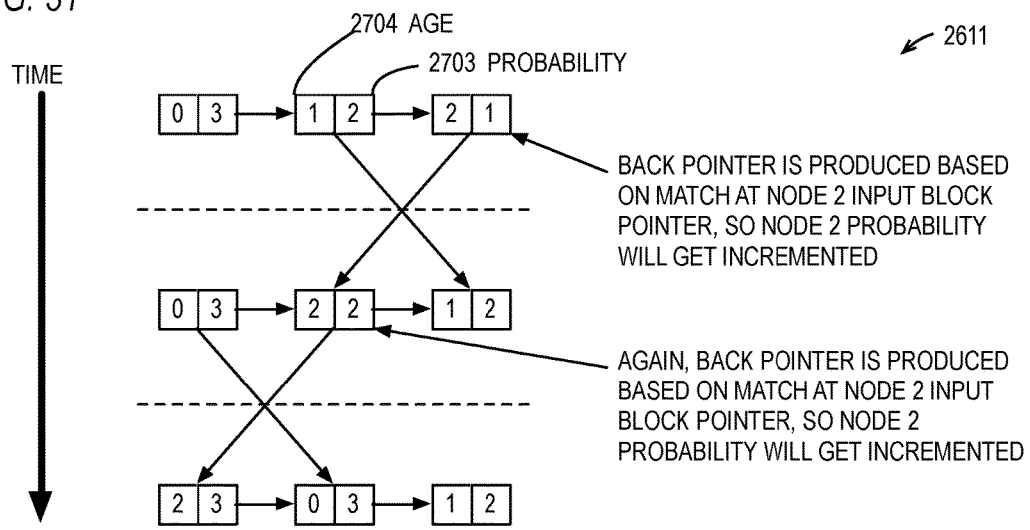
FIG. 31 is a timing diagram illustrating, by example, operation of the hardware data compressor of FIG. 26 according to FIG. 30.

Referring now to FIG. 31, a timing diagram illustrating, by example, operation of the hardware data compressor 100 of FIG. 26 according to FIG. 30 is shown. In FIG. 31, time flows downward, and nodes 2706 are shown with their age 2704 and probability 2703 values. The input block pointers 2702 are not shown, although an arrow from each node 2706 shows the node to which its next pointer 2705 points. In the first row, at a first time, a hash chain 2611 includes three nodes. At the head of the chain 2611, is a node 2706 with age 2704 value of 0 and probability 2703 value of 3, followed by a node 2706 with age 2704 value of 1 and probability 2703 value of 2, followed by a last node 2706 with age 2704 value of 2 and probability 2703 value of 1.

Subsequently, the scanning engine 2602 produces a back pointer based on a string match using the input block pointer 2702 of node 2 (i.e., the node 2706 with an age 2704 value of 2), e.g., at block 3002 of FIG. 30. So, at a second time after the first time, the scanning engine 2602 increments the probability 2703 value of node 2 from 1 to 2, as shown in the second row. In response, the chain sort engine 2604 swaps positions in the hash chain 2611 of node 2 and the node 2706 ahead of it, node 1 (i.e., the node 2706 with an age 2704 value of 1), e.g., at block 3006 of FIG. 30, because node 2 now has the same probability 2703 value (2) as node 1 and node 2 is newer than node 1, as also shown in the second row.

Subsequently, a second time the scanning engine 2602 produces a back pointer based on a string match using the input block pointer 2702 of node 2. So, at a third time after the second time, the scanning engine 2602 increments the probability 2703 value of node 2 from 2 to 3, as shown in the third row. In response, the chain sort engine 2604 swaps positions in the hash chain 2611 of node 2 and the node 2706 ahead of it, node 0 (i.e., the node 2706 with an age 2704 value of 0), because node 2 now has the same probability 2703 value (3) as node 0 and node 2 is newer than node 0, as also shown in the third row.

Figures 32, 33:
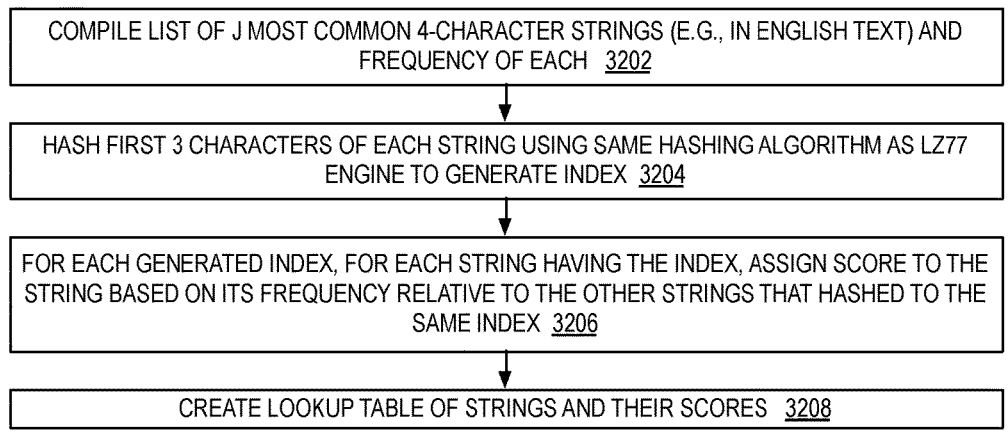
FIG. 32 is a flowchart illustrating a method for creating a lookup table for use in a static hash chain node probability embodiment.
FIG. 33 is a lookup table for use in a static hash chain node probability embodiment.

Referring now to FIGS. 32 and 33, a flowchart is shown in FIG. 32 illustrating a method for creating a lookup table 3302 shown in FIG. 33 for use in a static hash chain node probability embodiment. Preferably, the method described with respect to FIG. 32 is performed in an automated fashion, e.g., software. Preferably, a user (e.g., manufacturer or end user of the hardware data compressor 100) performs the method in advance of the compression of an input block of characters by the hardware data compressor 100. For example, the method may be performed by the manufacturer and provided along with the hardware data compressor 100 to the end user. Alternatively, the manufacturer creates the lookup table 3302 and subsequently the end user downloads the lookup table 3302 from the manufacturer. Alternatively, the end user himself creates a custom lookup table 3302 that is tailored to files that the end user frequently compresses using the hardware data compressor 100, in which case preferably the manufacturer provides the end user with software that embodies the method. In one embodiment, the lookup table 3302 is stored in the table memory 107, although other embodiments are contemplated in which the lookup table 3302 is stored in one of the other memories, e.g., 101, 103 or 105. In one embodiment, the lookup table 3302 is stored in a content-addressable memory (CAM) in which the 4-character strings 3303 of FIG. 33 are the content compared to the input address, and the CAM outputs the score 3304 corresponding to the matching string 3303, and if no match is found the CAM generates a true value on a miss indicator. Flow begins at block 3202.

At block 3202, a user (e.g., manufacturer or end user, such as a server farm administrator) gathers a set of input blocks of characters that are hopefully representative of input blocks that will subsequently be compressed by the hardware data compressor 100. For example, in the case of English text, the user may gather a set of input blocks from hundreds of English language works. For another example, the user may gather a set of input blocks from many HTML files, audio files or image files. The user then compiles a list of the J most frequently occurring 4-character strings in the set of input blocks and the frequency of occurrence of each of the 4-character strings. J is a relatively large whole number, e.g., in the range 500 to 5,000, depending upon the desired amount of memory allocatable to the size of the lookup table 3302 and the desired speedup from string match search efficiency improvement attributable to sorting of the hash chains 2611 based on node 2706 probability 2703. Flow proceeds to block 3204.

At block 3204, for each of the J 4-character strings of the table compiled at block 3202, the user hashes the first 3 characters of the string using the same hashing algorithm employed by the LZ77 engine 102 (e.g., employed by the 3-character hash index generator 2432 of FIG. 24) to generate an index for the string. The index will therefore have the same value that may subsequently be generated by the LZ77 engine 102 as the index into the hash table in the hashing memory 103 (e.g., 3-character hash table index 2434 into the 3-character hash table 2438 of FIG. 24). Flow proceeds to block 3206.

At block 3206, for each index value generated at block 3204, for each group of strings of the J strings whose first 3 characters hashed to the index, the user examines the frequencies of the strings in the group and assigns a score to each string of the group based on its frequency relative to the other strings of the group. For example, assume four strings hash to the same index, and assume the four strings have frequencies from block 3202 of 8, 11, 98 and 16, respectively. Then the user would assign the lowest score to the first string, the next lowest score to the second string, the highest score to the third string, and the next-to-highest score to the fourth string, e.g., 1, 2, 4, 3. These scores can then be used to populate the lookup table 3302, e.g., at block 3208. If these 4-character strings later appear in an input block of characters being compressed by the hardware data compressor 100, a node 2706 will be created for them which will be inserted into a hash chain 2611, which the chain sort engine 2604 will sort with the aid of these scores in the lookup table 3302, as described in more detail below. Flow proceeds to block 3208.

At block 3208, the user creates a lookup table 3302 of the 4-character strings compiled at block 3202 and their associated scores assigned at block 3206, an example of which is shown in FIG. 33. Although the lookup table 3302 is shown in FIG. 33 as an array, the lookup table 3302 could also be arranged in various forms, such as a tree or hash table. The lookup table 3302 may be used to assign the probability 2703 to nodes 2706 of a hash chain 2611 as described below with respect to FIGS. 34 and 35. Flow ends at block 3208.

Figure 34:
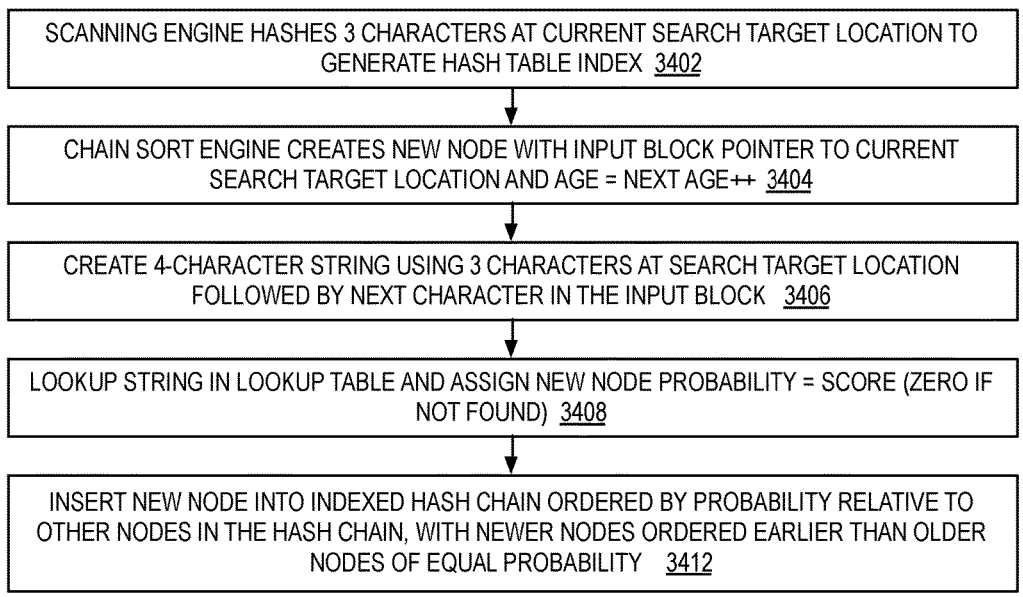
FIG. 34 is a flowchart illustrating operation of the hardware data compressor of FIG. 26 to sort a hash chain according to a static node probability embodiment.

Referring now to FIG. 34, a flowchart illustrating operation of the hardware data compressor 100 of FIG. 26 to sort a hash chain according to a static node probability embodiment is shown. Flow begins at block 3402.

At block 3402, the scanning engine 2602 hashes 3 characters at the current search target location to generate a hash table index. Flow proceeds to block 3404.

At block 3404, the chain sort engine 2604 creates a new node 2706 and populates the input block pointer 2702 with the current search target location and populates the age 2704 with the current value of the next age register, and then increments the next age register. Preferably, the scanning engine 2602 provides to the chain sort engine 2604 the information needed to create the new node 2706, such as the current search target location. In an alternate embodiment, the scanning engine 2602 creates the new node 2706 and notifies the chain sort engine 2604. Flow proceeds to block 3406.

At block 3406, the chain sort engine 2604 takes a 4-character string consisting of the 3 characters at the current search target location (i.e., the 3 characters that were hashed at block 3402) and the next adjacent character of the input block 2606. Flow proceeds to block 3408.

At block 3408, the chain sort engine 2604 looks for a match of the 4-character string created at block 3406 with one of the strings 3303 in the lookup table 3302. If a match is found, the chain sort engine 2604 assigns the probability 2703 of the new node 2706 with the score 3304 associated with the matching string 3303; otherwise, the chain sort engine 2604 assigns the probability 2703 of the new node 2706 with a zero value. Flow proceeds to block 3412.

At block 3412, the chain sort engine 2604 inserts the new node 2706 into the hash chain 2611 at the index generated at block 3402. The chain sort engine 2604 inserts the new node 2706 based on its probability relative to the other nodes 2706 in the hash chain 2611. Specifically, the chain sort engine 2604 inserts the new node 2706 earlier in the hash chain 2611 than nodes 2706 with a lower probability 2703 and later than nodes 2706 with a higher probability 2703. For nodes 2706 of equal probability 2703, the chain sort engine 2604 orders newer nodes 2706 ahead of relatively older nodes 2706. Thus, the new node 2706, presently being the newest node 2706, is inserted ahead of all other nodes 2706 of its probability 2703. Flow ends at block 3412.

Figure 35:
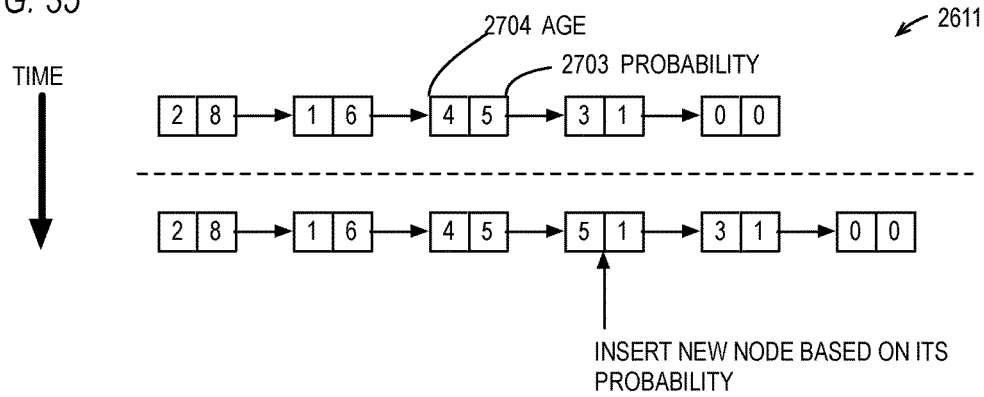
FIG. 35 is a timing diagram illustrating, by example, operation of the hardware data compressor of FIG. 26 according to FIG. 34.

Referring now to FIG. 35, a timing diagram illustrating, by example, operation of the hardware data compressor 100 of FIG. 26 according to FIG. 34 is shown. In FIG. 35, time flows downward, and nodes 2706 are shown with their age 2704 and probability 2703 values. The input block pointers 2702 are not shown, although an arrow from each node 2706 shows the node to which its next pointer 2705 points. In the first row, at a first time, a hash chain 2611 includes five nodes. At the head of the chain 2611, is a node 2706 with age 2704 value of 2 and probability 2703 value of 8, followed by a node 2706 with age 2704 value of 1 and probability 2703 value of 6, followed by a node 2706 with age 2704 value of 4 and probability 2703 value of 5, followed by a node 2706 with age 2704 value of 3 and probability 2703 value of 1, followed by a last node 2706 with age 2704 value of 0 and probability 2703 value of 0.

At a second time after the first time, a new node 2706 is created (e.g., as at blocks 3404 through 3408) with age 2704 value of 5 and probability 2703 value of 1. The new node 2706 is inserted (e.g., as at block 3412 of FIG. 34) between the node 2706 of age 2704 value of 4 and the node 2706 of age 2704 value of 3, because the node 2706 of age 2704 value of 4 has a larger probability 2703 value than the new node 2706 and has an equal probability 2703 value with and is newer than the node 2706 of age 2704 3.

Although an embodiment is described in which three characters are hashed and the string 3303 length of the lookup table 3302 is four characters, other embodiments are contemplated in which the number of characters hashed is greater than three and the string length is greater than four, but in which the number of characters of the string length is greater than the number of characters of the hash in order to determine one or more succeeding characters after the hashed characters.

As may be observed from the description of FIGS. 26 through 35, each node 2706 of a hash chain 2611 may be ordered according to its probability 2703 that a back pointer to a matching string that begins with the character in the input block 2606 will be produced by the scanning engine 2602 in hopes of increasing the likelihood that a longer matching string will be found before the scanning engine 2602 reaches its cutoff criterion than would be found using hash chains 2611 ordered by age only, thereby hopefully improving the compression ratio. The embodiments related to FIGS. 28 through 31 employ a dynamic scheme in which the probability 2703 of a node 2706 may increase during the input block 2606 scan as the node 2706 is used more frequently to find a matching string to produce a back pointer, whereas the embodiments related to FIGS. 32 through 35 employ a static scheme in which the probability 2703 of a node 2706 is assigned based on a prior analysis of the frequency of strings in a representative sample of input blocks.

Hardware Data Compressor that Directly Huffman Encodes Tokens from LZ77 Engine

As the use of servers, such as web servers, that compress files to transfer them over the Internet proliferates, the need for hardware data compressors for use in such servers is also likely to proliferate. This may drive a demand for lower cost and lower power consuming hardware data compressors.

Figure 36:
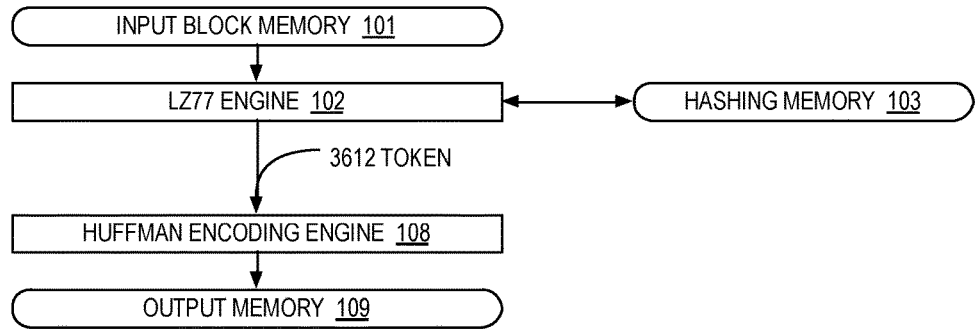
FIG. 36 is a block diagram illustrating a hardware data compressor according to an alternate embodiment.

Referring now to FIG. 36, a block diagram illustrating a hardware data compressor 3600 according to an alternate embodiment is shown. The hardware data compressor 3600 includes an input block memory 101, LZ77 engine 102, hashing memory 103, Huffman encoding engine 108 and output memory 109, similar to those of the hardware data compressor 100 of FIG. 1. As described in more detail below, the hardware data compressor 3600 provides tokens 3612 directly to the Huffman encoding engine 108, and the Huffman encoding engine 108 immediately Huffman encodes each token 3612 as it is received and writes the resulting Huffman codes to the output memory 109. Consequently, the hardware data compressor 3600 need not include the back pointer memory 105. Additionally, since pre-compiled Huffman code tables are employed, neither the sort engine 104 nor Huffman code table construction engine 106 of FIG. 1 need be included in the hardware data compressor 3600. The absence, or at least non-use while operating in the alternate mode described herein, of the back pointer memory 105 (and sort engine 104 and Huffman code table construction engine 106) in the hardware data compressor 3600 advantageously may reduce cost, size and power consumption over other embodiments, such as those of FIG. 1.

In one embodiment, the Huffman encoding engine 108 comprises a CAM in which the symbol values of the Huffman code table are the content compared to the input symbol being Huffman encoded, and the CAM outputs the Huffman code corresponding to the matched input symbol. Preferably, the CAM is configured to concurrently receive three symbol inputs and to concurrently output three respective Huffman codes to accommodate the case in which three literal symbols are associated with the token 3612 or the case in which a length and distance of a back pointer token 3612 are input to the CAM. The CAM is loaded with the pre-compiled literal/length and distance Huffman code tables before the LZ77 engine 102 begins scanning the input block. Preferably, each of the three inputs to the CAM has an associated signal provided by the LZ77 engine 102 that indicates whether they symbol is a literal/length or is a distance that enables the CAM to determine whether to access the literal/length or distance Huffman code table. Preferably, the extra bits of the length and distance of a back pointer are passed through from the LZ77 engine 102 and properly ordered alongside the values output by the CAM and written to the output memory 109.

Figure 37:
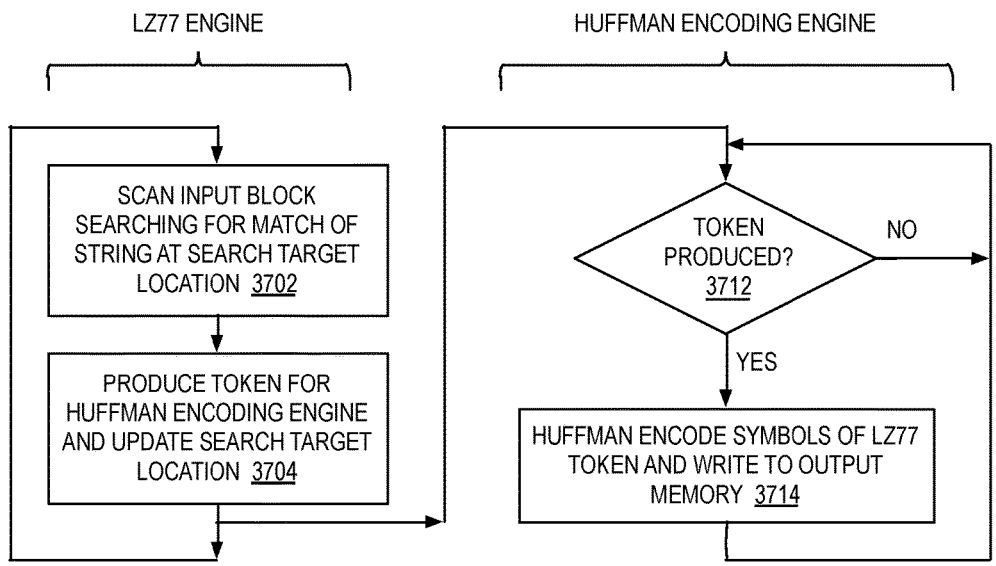
FIG. 37 is a flowchart illustrating operation of the hardware data compressor of FIG. 36.

Referring now to FIG. 37, a flowchart illustrating operation of the hardware data compressor 3600 of FIG. 36 is shown. In FIG. 37, the LZ77 engine 102 performs the operations at blocks 3702 and 3704, whereas the Huffman encoding engine 108 performs the operations at blocks 3712 and 3714. Flow begins at block 3702.

At block 3702, the LZ77 engine 102 scans the input block searching for a match of a string at the current search target location within the input block. Flow proceeds to block 3704.

At block 3704, the LZ77 engine 102 produces the token 3612 to the Huffman encoding engine 108 and updates the current search target location. Flow returns to block 3702 with respect to the LZ77 engine 102 to search for the next string (until the end of block character is encountered), and concurrently flow proceeds to decision block 3712 with respect to the Huffman encoding engine 108.

At decision block 3712, the Huffman encoding engine 108 determines whether the LZ77 engine 102 has produced a token 3612 for it. If so, flow proceeds to block 3714; otherwise, flow returns to decision block 3712 until the LZ77 engine 102 has produced a token 3612.

At block 3714, for each symbol of the token 3612 received from the LZ77 engine 102, the Huffman encoding engine 108 Huffman encodes the symbol and writes the Huffman code to the output memory 109. Flow returns to decision block 3712.

Advantageously, the Huffman encoding engine 108 is configured to perform the operations at blocks 3712 and 3714 in no less than the time in which the LZ77 engine 102 performs the operations at blocks 3702 and 3704. That is, the time between each successive token 3612 produced by the LZ77 engine 102 is greater than or equal to the time required by the Huffman encoding engine 108 to receive a token 3612 and Huffman encode it and write the resulting Huffman codes to the output memory 109. Consequently, there is no need to write the token 3612 to a memory for intermediate storage and no need to read the token 3612 from a memory.

Figure 38:
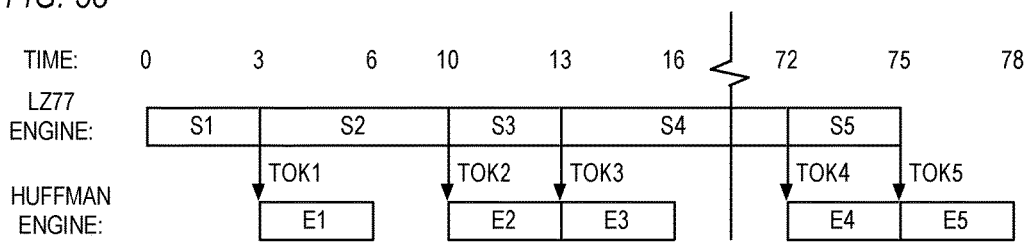
FIG. 38 is a timing diagram illustrating operation of the hardware data compressor of FIG. 36 according to the method of FIG. 37.

Referring now to FIG. 38, a timing diagram illustrating operation of the hardware data compressor 3600 of FIG. 36 according to the method of FIG. 37 is shown. The upper portion illustrates operation of the LZ77 engine 102 and the lower portion illustrates operation of the Huffman encoding engine 108. Time progresses from left to right. The times shown are representative of clock cycles, although other relevant time units are contemplated, e.g., nanoseconds.

As shown, at cycle 0, the LZ77 engine 102 begins scanning the input block at the current search location to perform a first search (denoted S1) for a string match (e.g., as at block 3702 of FIG. 37) and at cycle 3 outputs a token 3612 (denoted TOK1) to the Huffman encoding engine 108. In response, the Huffman encoding engine 108 Huffman encodes each of the symbols associated with TOK1 and writes the resulting Huffman codes to the output memory 109 (e.g., as at block 3714 of FIG. 37), which finishes at cycle 6, which is before the LZ77 engine 102 finishes its next search (S2) and outputs a second token (TOK2) at cycle 10. In response, the Huffman encoding engine 108 Huffman encodes each of the symbols associated with TOK2 and writes the resulting Huffman codes to the output memory 109, which finishes at cycle 13, which is before the LZ77 engine 102 finishes its next search (S3) and outputs another token (TOK3) at cycle 13. In response, the Huffman encoding engine 108 Huffman encodes each of the symbols associated with TOK3 and writes the resulting Huffman codes to the output memory 109, which finishes at cycle 16, which is before the LZ77 engine 102 finishes its next search (S4) and outputs another token (TOK4) at cycle 72. In response, the Huffman encoding engine 108 Huffman encodes each of the symbols associated with TOK4 and writes the resulting Huffman codes to the output memory 109, which finishes at cycle 75, which is before the LZ77 engine 102 finishes its next search (S5) and outputs another token (TOK5) at cycle 75. In response, the Huffman encoding engine 108 Huffman encodes each of the symbols associated with TOK5 and writes the resulting Huffman codes to the output memory 109, which finishes at cycle 78.

As illustrated in FIG. 37, the number of clock cycles required by the LZ77 engine 102 to produce a token 3612 may vary, e.g., S4 required S9 clock cycles, which generally indicates a relatively long hash chain; whereas, S1, S3 and S5 required only 3 clock cycles, which generally indicates the hash chain was empty. Nevertheless, advantageously the Huffman encoding engine 108 Huffman encodes the symbols associated with each token 3612 produced by the LZ77 engine 102 as it is produced, thereby advantageously alleviating the need to write back pointers to memory or to read them from memory.

In one embodiment, approximately 25 KB of memory are saved over an embodiment such as described with respect to FIG. 1, in which the back pointer and flag memory 105 is configured to hold approximately 8K×24-bit back pointers and 16K×1-bit flags.

In one embodiment, the hardware data compressor 100 includes the back pointer and flag memory 105 (e.g., for operating in other modes, such as those described above with respect to FIGS. 3 through 20); however, when operating in the mode described with respect to FIGS. 36 through 38. In such an embodiment, although the memory hardware savings is not realized, nevertheless a power savings may still be realized because power is not consumed by writes of the back pointers and flags to memory by the LZ77 engine 102 nor by reads of the back pointers and flags from memory by the Huffman encoding engine 108.

Hardware Data Compressor Using Dynamic Hash Algorithm Based on Input Block Type

One of the goals in mind when creating a hashing algorithm to be used by a hash index generator, such as hash index generators 2432 and 2442 of FIG. 24, is to provide a relatively even distribution of hash indexes over the hash table as possible. This tends toward reduce the likelihood of having really long hash chains, or at least tends to not exacerbate the problem, which may improve the searching times for matching strings associated with the LZ77 engine 102 scanning. This is at least in part due to the notion of hash aliasing, or hash collisions. Hash aliasing occurs when to different inputs hash to the same hash index. For example, the characters "the" could hash to the same index as the characters "was" depending upon the hashing algorithm. This would be particularly unfortunate for most English text input blocks, for example, since "the" and "was" tend to occur frequently in English text, which would likely result in a very long hash chain for that index.

As may be seen from the example above, it would be advantageous to have a hash algorithm for English text that tends to hash common English words to different indexes. However, the hardware data compressor 100 may be used to compress input blocks of types other than English text. Hence, it would be advantageous to have hash algorithms for other languages, including non-spoken/written languages (e.g., HTML, Java, etc.) that tend to produce a relatively flat hash index distribution. Still further, it would be advantageous to have hash algorithms for other input block types, including non-language types (e.g., spreadsheets, executable binary files, etc.) that tend to produce a relatively flat hash index distribution.

Figure 39:
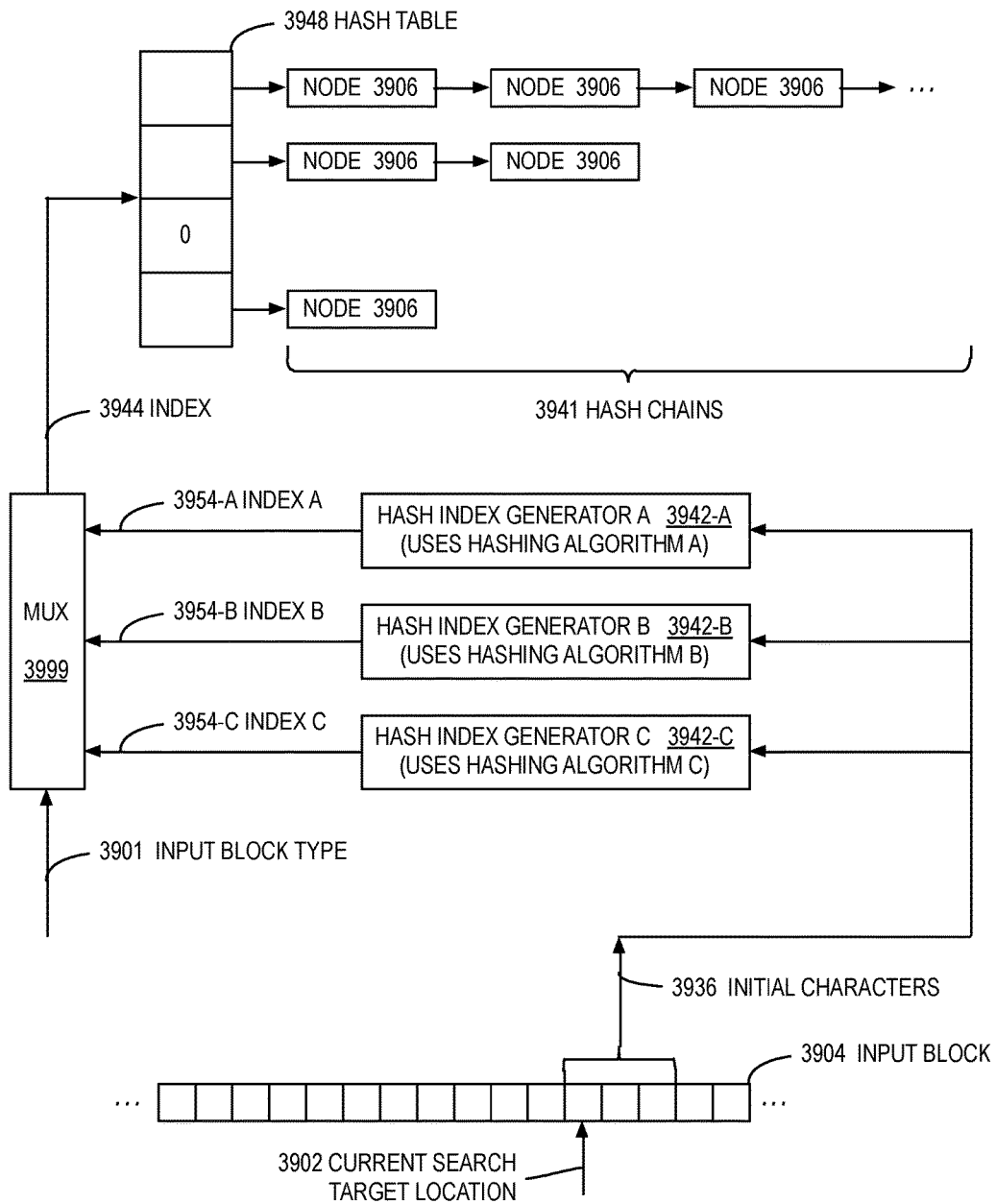
FIG. 39 is a block diagram illustrating a portion of the LZ77 engine of FIG. 1.
Figure 40:
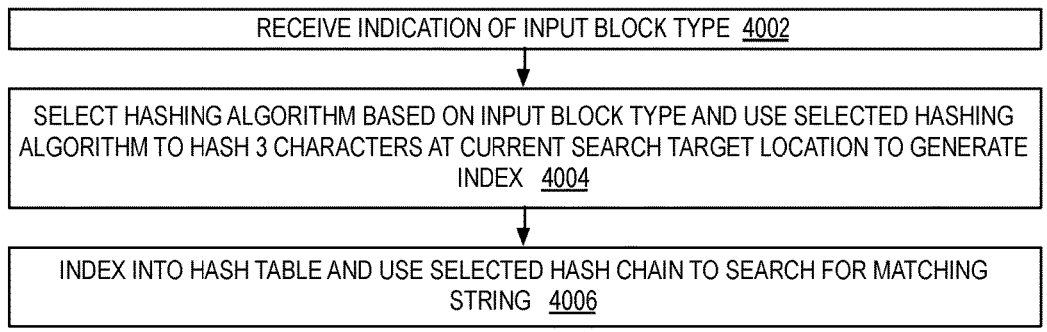
FIG. 40 is a flowchart illustrating operation of the LZ77 engine of FIG. 39.
Figure 41:
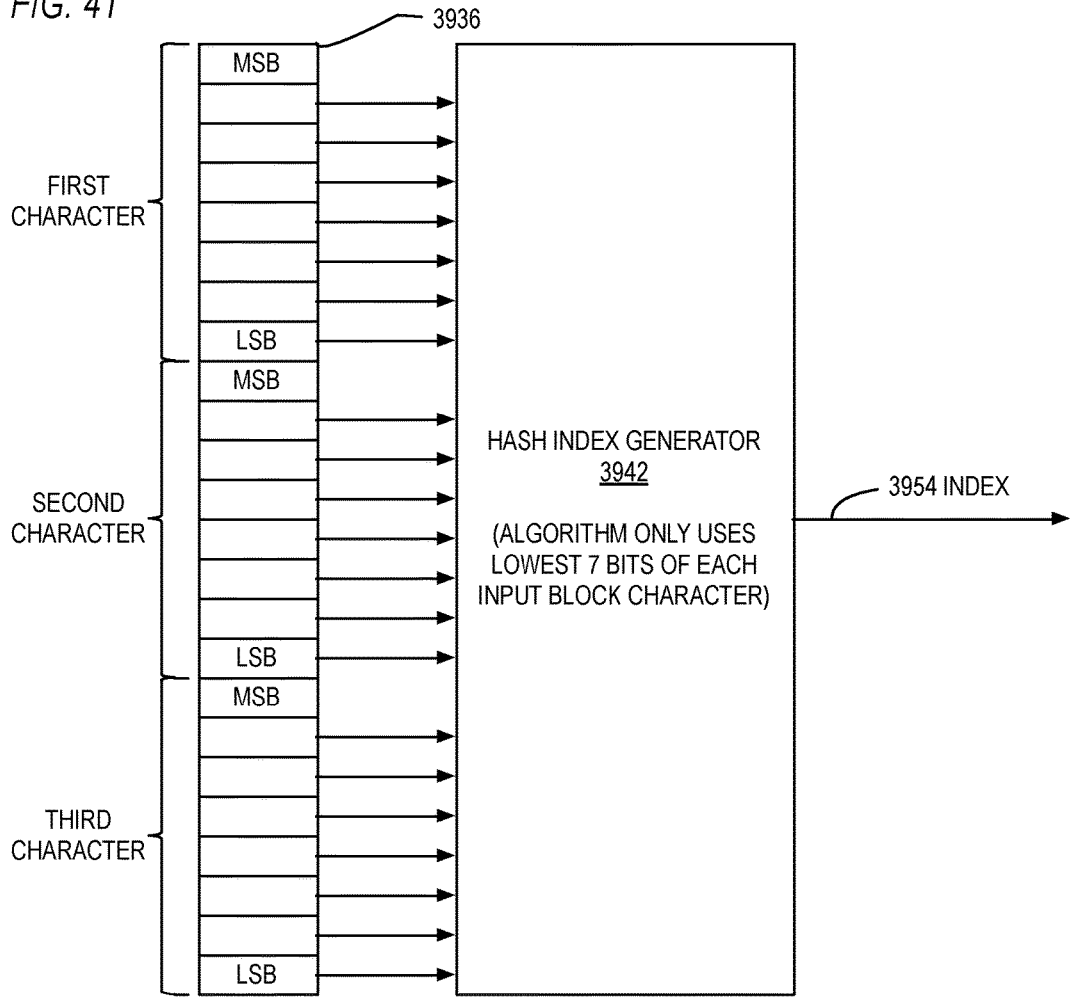
FIG. 41 is a block diagram illustrating in more detail one of the hash index generators of FIG. 39.

Referring now to FIG. 39, a block diagram illustrating a portion of the LZ77 engine 102 of FIG. 1 is shown. In the embodiment of FIGS. 39 through 41, an input block type 3901 (e.g., text, spreadsheet, word processor, pdf, HTML, Java, etc.) is provided to the hardware data compressor 100 to indicate the type of input block being compressed, and the LZ77 engine 102 employs different hashing algorithms depending upon the input block type 3901. In some embodiments, the number of bits hashed varies with the input block type 3901. For example, if the input block type is ASCII text, the upper bit of each character (byte) is not included in the hashing, e.g., 21 bits are hashed rather than 24 bits, e.g., see FIG. 41. Generally speaking, this provides a better distribution because the upper bit is always zero and therefore may distort the distribution. In other embodiments, the arithmetic/logical operations performed by the hashing algorithm vary with the input block type. Still further, in other embodiments, the number of characters of the input block hashed by the hashing algorithm varies with the input block type.

The LZ77 engine 102 includes a hash table 3948 and hash chains 3941 of nodes 3906. The hash table 3948, hash chains 3911 and nodes 3906 may be similar to the hash tables, hash chains and nodes 2448, 2438, 2431, 2441, 2611, 2406 and 2706 of FIGS. 24, 26 and 27. The hash table 3948 is indexed by an index 3944, which is the output of a mux 3999. The mux 3999 receives the input block type indicator 3901 as a control input. Based on the input block type 3901, the mux 3999 selects one of a plurality of indexes 3954-A, 3954-B and 3954-C (referred to generically individually as 3954 and collectively as 3954) to output as index 3944. Each of the plurality of indexes 3954 is generated by a respective hash table index generator 3942-A, 3942-B and 3942-C (referred to generically individually as 3942 and collectively as 3942). Each of the hash table index generators 3942 hashes initial characters 3936 (e.g., 3) of the input block of characters 3904 at the current search target location 3902, but to generate its respective index 3954, each uses a different hashing algorithm, referred to as algorithm A, algorithm B and algorithm C. In one embodiment, one or more of the hashing algorithms may be those described above with respect to FIGS. 24 and 25, that is, the 3-byte and 4-byte hash algorithms.

Referring now to FIG. 40, a flowchart illustrating operation of the LZ77 engine 102 of FIG. 39 is shown. Flow begins at block 4002.

At block 4002, the mux 3999 receives the input block type 3999. Flow proceeds to block 4004.

At block 4004, each of the hash table index generators 3942 hashes the initial characters 3936 using its respective different hashing algorithm to generate its respective index 3954 which it provides to the mux 3999, and the mux selects one of the indexes 3954 to output as index 3944 based on the input block type 3901. Thus, the mux 3999 effectively selects one of the hashing algorithms based on the input block type 3901. Flow proceeds to block 4006.

At block 4006, the index 3944 generated at block 4004 is used to index into the hash table 3948 to select one of the hash chains 3911, which the LZ77 engine 102 uses to search in the input block 3904 at the locations pointed to by the nodes 3906 of the selected hash chain 3911 for a match of a string that begins at the location of the input block 3904 pointed to by the current search target location 3902. Flow ends at block 4006.

Referring now to FIG. 41, a block diagram illustrating in more detail one of the hash index generators 3942 of FIG. 39 is shown. The hash index generator 3942 of FIG. 41 is distinct in that it does not use all the bits of the characters from the input block 3936 in its hash algorithm. More specifically, as shown, the hash index generator 3942 receives and uses in its hash algorithm every bit of the 3 characters of the input block 3936 except for the most significant bit (MSB) of each of the 3 characters, denoted first character, second character and third character in FIG. 41. The hash index generator 3942 hashes the 21 bits shown, i.e., the lower 7 bits of each of the first, second and third characters to generate the index 3954 provided to the mux 3999 of FIG. 39. Table 6 below is an example a hashing algorithm used by the hash index generator 3942 of FIG. 41 to hash the 21 bits. However, other embodiments are contemplated, and the hashing algorithm of Table 6 is provided as an illustrative example. Furthermore, other embodiments are contemplated in which less than all the bits of the input block 3936 characters are hashed other than the least 7 bits of each character. The embodiment of FIG. 41 may be particularly suitable to an input block type 3901 that is ASCII text, since the upper bit of each character (or byte) will tend to be zero, which may tend toward unevenness in the hash index distribution.

TABLE 6 short3 = {byte0[6:0], byte1[6:0], byte2[6:0]} ; //Concatenate lower 7 bits of the input bytes together
mult3 = short3 * 8'hae; //Multiply by hexadecimal 0xAE
hash_value3 = 14'( mult3 ^ (mult3>>11)); //Logical right shift by 11, then XOR with original, finally use only first 14 bits of result.

Figure 42:
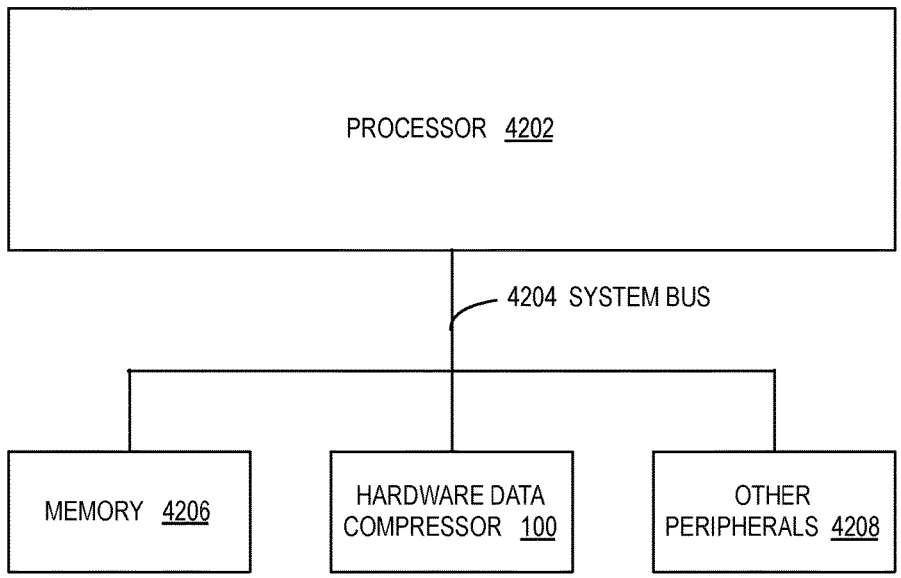
FIG. 42 is a block diagram illustrating a system that includes a hardware data compressor 100 such as of FIG. 1.

Referring now to FIG. 42, a block diagram illustrating a system 4200 that includes a hardware data compressor 100 such as of FIG. 1 is shown. The system 4200 includes a processor 4202 that is connected by a system bus 4204 to a memory 4206, the hardware data compressor 100 and other peripherals 4208. The processor 4202 sends commands to the hardware data compressor 100 via the system bus 4204. Preferably, the hardware data compressor 100 includes control and status registers (CSR) that are mapped into I/O space by which the processor 4202 sends the commands, such as to compress an input block of characters. Alternatively, the CSR may be memory-mapped rather than I/O-mapped. Additionally, preferably one or more of the memories of the hardware data compressor 100 are mapped into memory space. In particular, the input block memory 101, the output memory 109, and the table memory 107 may be writable and/or readable by the processor 4202. For example, the processor 4202 may write an input block of characters to be compressed from the system memory 4206 to the input block memory 101 (or cause a direct memory access (DMA) operation to do so), and the processor 4202 may read a compressed out block from the output block memory 109 to the system memory 4206 (or cause a direct memory access (DMA) operation to do so) when the hardware data compressor 100 has finished compressing an input block. Alternatively, the processor 4202 may provide to the hardware data compressor 100 the address in the system memory 4206 of the input block of characters and the hardware data compressor 100 may read it into the input block memory 101 (or cause a direct memory access (DMA) operation to do so), and the processor 4202 may provide to the hardware data compressor 100 the address in the system memory 4206 where it wants the compressed block written and the hardware data compressor 100 may write it there from the output block memory 109 (or cause a direct memory access (DMA) operation to do so) when it has finished compressing an input block. Additionally, the processor 4202 may cause the table memory 107 to be populated (in one of the manners similar to those described above) with Huffman code tables, such as the pre-compiled and/or "reference" tables described above.

Figure 43:
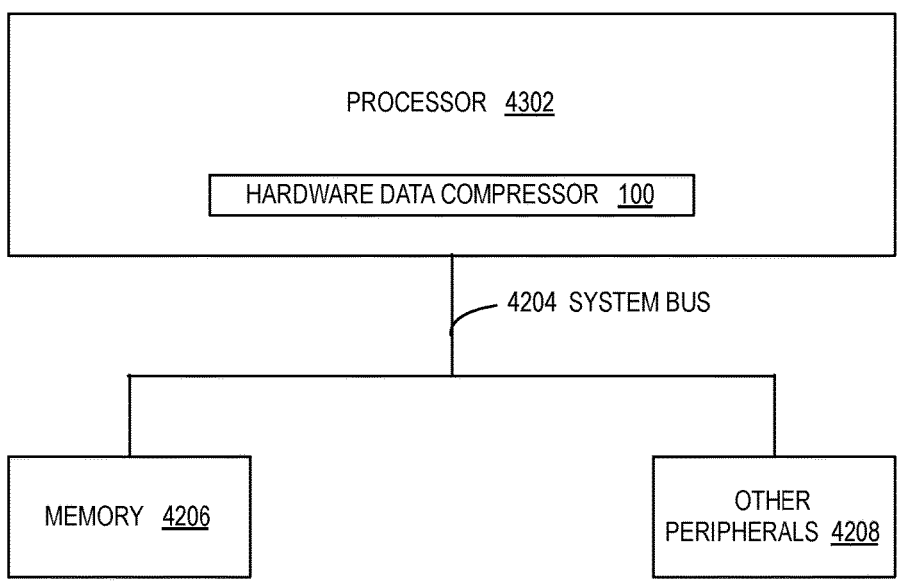
FIG. 43 is a block diagram illustrating a system that includes a hardware data compressor according to an alternate embodiment.

Referring now to FIG. 43, a block diagram illustrating a system 4300 that includes a hardware data compressor 100 according to an alternate embodiment is shown. The system 4300 of FIG. 43 is similar to the system 4200 of FIG. 42. However, in the system 4300 of FIG. 43, the processor 4302 comprises the hardware data compressor 100. That is, the hardware data compressor 100 is an architectural functional unit of the processor 4302. The processor 4302 includes instructions in its instruction set architecture (ISA) that software executing on the processor 4302 may execute in order to control and access the hardware data compressor 100. In one embodiment, the processor 4302 includes a COMPRESS BLOCK instruction that includes a source operand, a destination operand, and a control operand. The source operand specifies the location in system memory 4206 of the input block of characters to be compressed, the destination operand specifies the location to which the compressed block is to be written, and the control operand specifies control information needed by the hardware data compressor 100 to perform the data compression. For example, the control information may include a parameter that indicates whether and/or to what degree speed is prioritized over compression ratio, in response to which the hardware data compressor 100 may decide whether or not to employ concurrent symbol list sorting; dynamic-prime Huffman code tables; pre-Huffman encoding to decide whether to produce a matching string or back pointer; dual hash tables; hash chain sorting based on node string match probabilities, and if so, whether or not to employ a static or dynamic priority approach and, if the former, to provide a lookup table; selecting from multiple hashing algorithms based on the input block type; and/or direct Huffman encoding of output tokens from the LZ77 engine. Alternatively, the control information includes a separate parameter for each of these. Other parameters may include information about Huffman code tables to be used, e.g., whether to use the FIXED Huffman code tables specified by the DEFLATE Specification, pre-compiled Huffman code tables including "reference" Huffman code tables, a dynamic-prime Huffman code table, and so forth.

While various embodiments of the present invention have been described herein, it should be understood that they have been presented by way of example, and not limitation. It will be apparent to persons skilled in the relevant computer arts that various changes in form and detail can be made therein without departing from the scope of the invention. For example, software can enable, for example, the function, fabrication, modeling, simulation, description and/or testing of the apparatus and methods described herein. This can be accomplished through the use of general programming languages (e.g., C, C++), hardware description languages (HDL) including Verilog HDL, VHDL, and so on, or other available programs. Such software can be disposed in any known computer usable medium such as magnetic tape, semiconductor, magnetic disk, or optical disc (e.g., CD-ROM, DVD-ROM, etc.), a network, wire line, wireless or other communications medium. Embodiments of the apparatus and method described herein may be included in a semiconductor intellectual property core, such as a processor core (e.g., embodied, or specified, in a HDL) and transformed to hardware in the production of integrated circuits. Additionally, the apparatus and methods described herein may be embodied as a combination of hardware and software. Thus, the present invention should not be limited by any of the exemplary embodiments described herein, but should be defined only in accordance with the following claims and their equivalents. Specifically, the present invention may be implemented within a processor device that may be used in a general-purpose computer. Finally, those skilled in the art should appreciate that they can readily use the disclosed conception and specific embodiments as a basis for designing or modifying other structures for carrying out the same purposes of the present invention without departing from the scope of the invention as defined by the appended claims.

The invention claimed is:

1. A hardware data compressor that compresses an input block of characters by replacing strings of characters in the input block with back pointers to matching strings earlier in the input block, the hardware data compressor comprising:
 a hash table for use in searching for the matching strings in the input block;
 a plurality of hash index generators, each hash index generator of the plurality of hash index generators employs a different hashing algorithm on an initial portion of the strings of characters to be replaced to generate a respective index;
 an indication of a type of the input block of characters; and
 a selector that selects the index generated by of one of the plurality hash index generators to index into the hash table based on the type of the input block.

2. A method, comprising:
 receiving an indication of a type of an input block of characters to be compressed by a method of replacing strings of characters in the input block with back pointers to matching strings earlier in the input block;
 selecting a hashing algorithm from a plurality of hashing algorithms based on the type of the input block;
 using the selected hashing algorithm to hash an initial portion of the strings of characters to be replaced to generate an index into a hash table; and
 using the hash table to search for the matching strings in the input block.

3. A computer program product encoded in at least one non-transitory computer usable medium for use with a computing device, the computer program product comprising:
 computer usable program code embodied in said medium, for specifying a hardware data compressor that compresses an input block of characters by replacing strings of characters in the input block with back pointers to matching strings earlier in the input block, the computer usable program code comprising:
  first program code for specifying a hash table for use in searching for the matching strings in the input block;
  second program code for specifying a plurality of hash index generators, each hash index generator of the plurality of hash index generators employs a different hashing algorithm on an initial portion of the strings of characters to be replaced to generate a respective index;
  third program code for specifying an indication of a type of the input block of characters; and
  fourth program code for specifying a selector that selects the index generated by of one of the plurality hash index generators to index into the hash table based on the type of the input block.

4. The computer program product of claim 3, further comprising:
 a first of the plurality of hash index generators employs a first set of arithmetic and/or logical operations on the characters of the initial portion of the strings; and
 a second of the plurality of hash index generators employs a second set of arithmetic and/or logical operations on the characters of the initial portion of the strings that is different from the first set of arithmetic and/or logical operations.

5. The computer program product of claim 3, further comprising:
 a first of the plurality of hash index generators hashes a first number of the characters of the initial portion of the strings; and
 a second of the plurality of hash index generators hashes a second number of the characters of the initial portion of the strings than the first number.

6. The computer program product of claim 3, wherein the at least one non-transitory computer usable medium is selected from the set of a disk, tape, or other magnetic, optical, or electronic storage medium.

* * * * *